(12) United States Patent
Currie

(10) Patent No.: US 8,183,627 B2
(45) Date of Patent: May 22, 2012

(54) HYBRID FIN FIELD-EFFECT TRANSISTOR STRUCTURES AND RELATED METHODS

(75) Inventor: Matthew T. Currie, Brookline, MA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 505 days.

(21) Appl. No.: 12/125,308

(22) Filed: May 22, 2008

(65) Prior Publication Data

US 2008/0265280 A1 Oct. 30, 2008

Related U.S. Application Data

(63) Continuation of application No. 11/001,166, filed on Dec. 1, 2004, now Pat. No. 7,393,733.

(51) Int. Cl.
*H01L 29/76* (2006.01)
*H01L 29/94* (2006.01)

(52) U.S. Cl. ............... 257/329; 257/401; 257/618

(58) Field of Classification Search ............... 257/329, 257/401, 618, 619, 623, E21.442, E29.275
See application file for complete search history.

(56) References Cited

U.S. PATENT DOCUMENTS

| | | | |
|---|---|---|---|
| 4,010,045 A | 3/1977 | Ruehrwein | |
| 4,704,302 A | 11/1987 | Bruel et al. | |
| 4,710,788 A | 12/1987 | Dambkes et al. | |
| 4,987,462 A | 1/1991 | Kim et al. | |
| 4,990,979 A | 2/1991 | Otto et al. | |
| 4,997,776 A | 3/1991 | Harame et al. | |
| 5,013,681 A | 5/1991 | Godbey et al. | |
| 5,089,872 A | 2/1992 | Ozturk et al. | |
| 5,091,767 A | 2/1992 | Bean et al. | |
| 5,155,571 A | 10/1992 | Wang et al. | |
| 5,166,084 A | 11/1992 | Pfiester | |
| 5,177,583 A | 1/1993 | Endo et al. | |
| 5,202,284 A | 4/1993 | Kamins et al. | |
| 5,207,864 A | 5/1993 | Bhat et al. | |
| 5,208,182 A | 5/1993 | Narayan et al. | |
| 5,212,110 A | 5/1993 | Pfiester et al. | |
| 5,221,413 A | 6/1993 | Brasen et al. | |
| 5,240,876 A | 8/1993 | Gaul et al. | |
| 5,241,197 A | 8/1993 | Murakami et al. | |
| 5,242,847 A | 9/1993 | Ozturk et al. | |
| 5,250,445 A | 10/1993 | Bean et al. | |
| 5,285,086 A | 2/1994 | Fitzgerald, Jr. | |
| 5,291,439 A | 3/1994 | Kauffmann et al. | |
| 5,298,452 A | 3/1994 | Meyerson | |

(Continued)

FOREIGN PATENT DOCUMENTS

DE  41 01 167  7/1992

(Continued)

OTHER PUBLICATIONS

"2 Bit/Cell EEPROM Cell Using Band to Band Tunneling for Data Read-Out," *IBM Technical Disclosure Bulletin*, vol. 35, No. 4B (Sep. 1992) pp. 136-140.

(Continued)

*Primary Examiner* — Hung Vu
(74) *Attorney, Agent, or Firm* — Slater & Matsil, LLP

(57) ABSTRACT

Semiconductor-on-insulator structures facilitate the fabrication of devices, including MOSFETs that are at least partially depleted during operation and FinFETs including bilayer fins and/or crystalline oxide.

15 Claims, 35 Drawing Sheets

U.S. PATENT DOCUMENTS

| | | | |
|---|---|---|---|
| 5,310,451 A | 5/1994 | Tejwani et al. |
| 5,316,958 A | 5/1994 | Meyerson |
| 5,346,848 A | 9/1994 | Grupen-Shemansky et al. |
| 5,374,564 A | 12/1994 | Bruel et al. |
| 5,399,522 A | 3/1995 | Ohori et al. |
| 5,413,679 A | 5/1995 | Godbey |
| 5,424,243 A | 6/1995 | Takasaki et al. |
| 5,426,069 A | 6/1995 | Selvakumar et al. |
| 5,426,316 A | 6/1995 | Mohammad |
| 5,439,843 A | 8/1995 | Sakaguchi et al. |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse et al. |
| 5,479,033 A | 12/1995 | Baca et al. |
| 5,484,664 A | 1/1996 | Kitahara et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,548,128 A | 8/1996 | Soref et al. |
| 5,549,747 A | 8/1996 | Bozler et al. |
| 5,572,043 A | 11/1996 | Shimizu et al. |
| 5,596,527 A | 1/1997 | Tomioka et al. |
| 5,607,876 A | 3/1997 | Biegelsen et al. |
| 5,617,351 A | 4/1997 | Bertin et al. |
| 5,630,905 A | 5/1997 | Lynch et al. |
| 5,659,187 A | 8/1997 | Legoues et al. |
| 5,683,934 A | 11/1997 | Candelaria |
| 5,698,869 A | 12/1997 | Yoshimi et al. |
| 5,714,777 A | 2/1998 | Ismail et al. |
| 5,728,623 A | 3/1998 | Mori et al. |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,808,344 A | 9/1998 | Ismail et al. |
| 5,821,577 A | 10/1998 | Crabbe' et al. |
| 5,847,419 A | 12/1998 | Imai et al. |
| 5,863,830 A | 1/1999 | Bruel et al. |
| 5,877,070 A | 3/1999 | Goesele et al. |
| 5,882,987 A | 3/1999 | Srikrishnan |
| 5,891,769 A | 4/1999 | Liaw et al. |
| 5,906,708 A | 5/1999 | Robinson et al. |
| 5,906,951 A | 5/1999 | Chu et al. |
| 5,912,479 A | 6/1999 | Mori et al. |
| 5,923,046 A | 7/1999 | Tezuka et al. |
| 5,943,560 A | 8/1999 | Chang et al. |
| 5,963,817 A | 10/1999 | Chu et al. |
| 5,966,622 A | 10/1999 | Levine et al. |
| 5,993,677 A | 11/1999 | Biasse et al. |
| 5,998,807 A | 12/1999 | Lustig et al. |
| 6,013,134 A | 1/2000 | Chu et al. |
| 6,013,563 A | 1/2000 | Henley et al. |
| 6,020,252 A | 2/2000 | Aspar et al. |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,074,919 A | 6/2000 | Gardner et al. |
| 6,096,590 A | 8/2000 | Chan et al. |
| 6,103,559 A | 8/2000 | Gardner et al. |
| 6,103,597 A | 8/2000 | Aspar et al. |
| 6,103,599 A | 8/2000 | Henley et al. |
| 6,107,653 A | 8/2000 | Fitzgerald |
| 6,111,267 A | 8/2000 | Fischer et al. |
| 6,117,750 A | 9/2000 | Bensahel et al. |
| 6,130,453 A | 10/2000 | Mei et al. |
| 6,133,799 A | 10/2000 | Favors, Jr. et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,160,303 A | 12/2000 | Fattaruso |
| 6,162,688 A | 12/2000 | Gardner et al. |
| 6,162,705 A | 12/2000 | Henley et al. |
| 6,184,111 B1 | 2/2001 | Henley et al. |
| 6,190,998 B1 | 2/2001 | Bruel et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto et al. |
| 6,210,988 B1 | 4/2001 | Howe et al. |
| 6,218,677 B1 | 4/2001 | Broekaert |
| 6,225,192 B1 | 5/2001 | Aspar et al. |
| 6,228,694 B1 | 5/2001 | Doyle et al. |
| 6,232,138 B1 | 5/2001 | Fitzgerald et al. |
| 6,235,567 B1 | 5/2001 | Huang |
| 6,235,568 B1 | 5/2001 | Murthy et al. |
| 6,242,324 B1 | 6/2001 | Kub et al. |
| 6,249,022 B1 | 6/2001 | Lin et al. |
| 6,251,751 B1 | 6/2001 | Chu et al. |
| 6,251,755 B1 | 6/2001 | Furukawa et al. |
| 6,261,929 B1 | 7/2001 | Gehrke et al. |
| 6,266,278 B1 | 7/2001 | Harari et al. |
| 6,271,551 B1 | 8/2001 | Schmitz et al. |
| 6,271,726 B1 | 8/2001 | Fransis et al. |
| 6,281,532 B1 | 8/2001 | Doyle et al. |
| 6,290,804 B1 | 9/2001 | Henley et al. |
| 6,291,321 B1 | 9/2001 | Fitzgerald |
| 6,303,468 B1 | 10/2001 | Aspar et al. |
| 6,313,016 B1 | 11/2001 | Kibbel et al. |
| 6,316,301 B1 | 11/2001 | Kant |
| 6,323,108 B1 | 11/2001 | Kub et al. |
| 6,326,664 B1 | 12/2001 | Chau et al. |
| 6,326,667 B1 | 12/2001 | Sugiyama et al. |
| 6,329,063 B2 | 12/2001 | Lo et al. |
| 6,335,546 B1 | 1/2002 | Tsuda et al. |
| 6,339,232 B1 | 1/2002 | Takagi et al. |
| 6,344,417 B1 | 2/2002 | Usenko |
| 6,346,459 B1 | 2/2002 | Usenko et al. |
| 6,350,311 B1 | 2/2002 | Chin et al. |
| 6,350,993 B1 | 2/2002 | Chu et al. |
| 6,352,909 B1 | 3/2002 | Usenko |
| 6,355,493 B1 | 3/2002 | Usenko |
| 6,368,733 B1 | 4/2002 | Nishinaga et al. |
| 6,368,938 B1 | 4/2002 | Usenko |
| 6,369,438 B1 | 4/2002 | Sugiyama et al. |
| 6,372,356 B1 | 4/2002 | Thornton et al. |
| 6,372,593 B1 | 4/2002 | Hattori et al. |
| 6,372,609 B1 | 4/2002 | Aga et al. |
| 6,380,590 B1 | 4/2002 | Yu |
| 6,387,829 B1 | 5/2002 | Usenko et al. |
| 6,391,740 B1 | 5/2002 | Cheung et al. |
| 6,399,970 B2 | 6/2002 | Kubo et al. |
| 6,403,975 B1 | 6/2002 | Brunner et al. |
| 6,407,406 B1 | 6/2002 | Tezuka et al. |
| 6,410,371 B1 | 6/2002 | Yu et al. |
| 6,425,951 B1 | 7/2002 | Chu et al. |
| 6,429,061 B1 | 8/2002 | Rim |
| 6,445,016 B1 | 9/2002 | An et al. |
| 6,448,152 B1 | 9/2002 | Henley et al. |
| 6,455,397 B1 | 9/2002 | Belford |
| 6,458,672 B1 | 10/2002 | Henley et al. |
| 6,475,072 B1 | 11/2002 | Canaperi et al. |
| 6,475,869 B1 | 11/2002 | Yu |
| 6,489,639 B1 | 12/2002 | Hoke et al. |
| 6,514,836 B2 | 2/2003 | Belford |
| 6,515,335 B1 | 2/2003 | Christiansen et al. |
| 6,521,041 B2 | 2/2003 | Wu et al. |
| 6,521,514 B1 | 2/2003 | Gehrke et al. |
| 6,524,935 B1 | 2/2003 | Canaperi et al. |
| 6,534,381 B2 | 3/2003 | Cheung et al. |
| 6,555,839 B2 | 4/2003 | Fitzgerald |
| 6,563,152 B2 | 5/2003 | Roberds et al. |
| 6,573,126 B2 | 6/2003 | Cheng et al. |
| 6,583,015 B2 | 6/2003 | Fitzgerald et al. |
| 6,583,437 B2 | 6/2003 | Mizuno et al. |
| 6,591,321 B1 | 7/2003 | Arimilli et al. |
| 6,593,191 B2 | 7/2003 | Fitzgerald |
| 6,593,625 B2 | 7/2003 | Christiansen et al. |
| 6,596,610 B1 | 7/2003 | Kuwabara et al. |

| | | | | | | |
|---|---|---|---|---|---|---|
| 6,597,016 | B1 | 7/2003 | Yuki et al. | 7,115,950 | B2 | 10/2006 | Tokushige et al. |
| 6,602,613 | B1 | 8/2003 | Fitzgerald | 7,118,987 | B2 | 10/2006 | Fu et al. |
| 6,605,498 | B1 | 8/2003 | Murthy et al. | 7,119,402 | B2 | 10/2006 | Kinoshita et al. |
| 6,607,948 | B1 | 8/2003 | Sugiyama et al. | 7,138,302 | B2 | 11/2006 | Xiang et al. |
| 6,621,131 | B2 | 9/2003 | Murthy et al. | 7,164,183 | B2 | 1/2007 | Sakaguchi et al. |
| 6,624,047 | B1 | 9/2003 | Sakaguchi et al. | 7,176,522 | B2 | 2/2007 | Cheng et al. |
| 6,624,478 | B1 | 9/2003 | Anderson et al. | 7,180,134 | B2 | 2/2007 | Yang et al. |
| 6,632,724 | B2 | 10/2003 | Henley et al. | 7,198,995 | B2 | 4/2007 | Chidambarrao et al. |
| 6,635,909 | B2 | 10/2003 | Clark et al. | 7,205,604 | B2 | 4/2007 | Ouyang et al. |
| 6,645,831 | B1 | 11/2003 | Shaheen et al. | 7,211,864 | B2 | 5/2007 | Seliskar |
| 6,646,322 | B2 | 11/2003 | Fitzgerald | 7,220,630 | B2 | 5/2007 | Cheng et al. |
| 6,649,480 | B2 | 11/2003 | Fitzgerald et al. | 7,238,989 | B2 | 7/2007 | Yeo et al. |
| 6,649,492 | B2 | 11/2003 | Chu et al. | 7,279,735 | B1 | 10/2007 | Yu et al. |
| 6,656,271 | B2 | 12/2003 | Yonehara et al. | 2001/0003269 | A1 | 6/2001 | Wu et al. |
| 6,657,223 | B1 | 12/2003 | Wang et al. | 2001/0003364 | A1 | 6/2001 | Sugawara et al. |
| 6,664,169 | B1 | 12/2003 | Iwasaki et al. | 2001/0007789 | A1 | 7/2001 | Aspar et al. |
| 6,674,150 | B2 | 1/2004 | Takagi et al. | 2002/0043660 | A1 | 4/2002 | Yamazaki et al. |
| 6,677,183 | B2 | 1/2004 | Sakaguchi et al. | 2002/0052084 | A1 | 5/2002 | Fitzgerald |
| 6,677,192 | B1 | 1/2004 | Fitzgerald | 2002/0063292 | A1 | 5/2002 | Armstrong et al. |
| 6,680,240 | B1 | 1/2004 | Maszara | 2002/0072130 | A1 | 6/2002 | Cheng et al. |
| 6,680,260 | B2 | 1/2004 | Akiyama et al. | 2002/0084000 | A1 | 7/2002 | Fitzgerald |
| 6,690,043 | B1 | 2/2004 | Usuda et al. | 2002/0088971 | A1 | 7/2002 | Tezuka et al. |
| 6,703,144 | B2 | 3/2004 | Fitzgerald | 2002/0096717 | A1 | 7/2002 | Chu et al. |
| 6,703,648 | B1 | 3/2004 | Xiang et al. | 2002/0100942 | A1 | 8/2002 | Fitzgerald et al. |
| 6,703,688 | B1 | 3/2004 | Fitzergald | 2002/0123183 | A1 | 9/2002 | Fitzgerald |
| 6,706,614 | B1 | 3/2004 | An et al. | 2002/0123197 | A1 | 9/2002 | Fitzgerald et al. |
| 6,706,618 | B2 | 3/2004 | Takisawa et al. | 2002/0125471 | A1 | 9/2002 | Fitzgerald et al. |
| 6,707,106 | B1 | 3/2004 | Wristers et al. | 2002/0125497 | A1 | 9/2002 | Fitzgerald |
| 6,709,903 | B2 | 3/2004 | Christiansen et al. | 2002/0140031 | A1 | 10/2002 | Rim |
| 6,709,909 | B2 | 3/2004 | Mizuno et al. | 2002/0167048 | A1 | 11/2002 | Tweet et al. |
| 6,713,326 | B2 | 3/2004 | Cheng et al. | 2002/0168864 | A1 | 11/2002 | Cheng et al. |
| 6,720,586 | B1 | 4/2004 | Kidoguchi et al. | 2002/0190284 | A1 | 12/2002 | Murthy et al. |
| 6,723,661 | B2 | 4/2004 | Fitzergald | 2003/0003679 | A1 | 1/2003 | Doyle et al. |
| 6,724,008 | B2 | 4/2004 | Fitzergald | 2003/0013305 | A1 | 1/2003 | Sugii et al. |
| 6,730,551 | B2 | 5/2004 | Lee et al. | 2003/0013323 | A1 | 1/2003 | Hammond et al. |
| 6,737,670 | B2 | 5/2004 | Cheng et al. | 2003/0025131 | A1 | 2/2003 | Lee et al. |
| 6,743,684 | B2 | 6/2004 | Liu | 2003/0030117 | A1 | 2/2003 | Iwasaki et al. |
| 6,750,130 | B1 | 6/2004 | Fitzgerald | 2003/0034529 | A1 | 2/2003 | Fitzgerald et al. |
| 6,762,483 | B2 | 7/2004 | Krivokapic et al. | 2003/0057439 | A1 | 3/2003 | Fitzgerald |
| 6,767,793 | B2 | 7/2004 | Clark et al. | 2003/0077867 | A1 | 4/2003 | Fitzergald |
| 6,787,864 | B2 | 9/2004 | Paton et al. | 2003/0080361 | A1 | 5/2003 | Murthy et al. |
| 6,790,747 | B2 | 9/2004 | Henley et al. | 2003/0102498 | A1 | 6/2003 | Braithwaite et al. |
| 6,794,718 | B2 | 9/2004 | Nowak et al. | 2003/0119280 | A1 | 6/2003 | Lee et al. |
| 6,800,910 | B2 | 10/2004 | Lin et al. | 2003/0127646 | A1 | 7/2003 | Christiansen et al. |
| 6,815,738 | B2 | 11/2004 | Rim | 2003/0139000 | A1 | 7/2003 | Bedell et al. |
| 6,828,214 | B2 | 12/2004 | Notsu et al. | 2003/0157787 | A1 | 8/2003 | Murthy et al. |
| 6,830,976 | B2 | 12/2004 | Fitzgerald | 2003/0160300 | A1 | 8/2003 | Takenaka et al. |
| 6,835,618 | B1 | 12/2004 | Dakshina-Murthy et al. | 2003/0178677 | A1 | 9/2003 | Clark et al. |
| 6,838,322 | B2 | 1/2005 | Pham et al. | 2003/0178681 | A1 | 9/2003 | Clark et al. |
| 6,849,487 | B2 | 2/2005 | Taylor, Jr. et al. | 2003/0189229 | A1 | 10/2003 | Mouli |
| 6,849,884 | B2 | 2/2005 | Clark et al. | 2003/0199126 | A1 | 10/2003 | Chu et al. |
| 6,855,583 | B1 | 2/2005 | Krivokapic et al. | 2003/0201458 | A1 | 10/2003 | Clark et al. |
| 6,855,982 | B1 | 2/2005 | Xiang et al. | 2003/0203600 | A1 | 10/2003 | Chu et al. |
| 6,855,990 | B2 | 2/2005 | Yeo et al. | 2003/0207127 | A1 | 11/2003 | Murthy et al. |
| 6,867,433 | B2 | 3/2005 | Yeo et al. | 2003/0215990 | A1 | 11/2003 | Fitzgerald et al. |
| 6,876,010 | B1 | 4/2005 | Fitzgerald | 2003/0218189 | A1 | 11/2003 | Christiansen et al. |
| 6,881,632 | B2 | 4/2005 | Fitzgerald et al. | 2003/0219957 | A1 | 11/2003 | Kuwabara et al. |
| 6,888,181 | B1 | 5/2005 | Liao et al. | 2003/0227036 | A1 | 12/2003 | Sugiyama et al. |
| 6,890,835 | B1 | 5/2005 | Chu et al. | 2003/0227057 | A1 | 12/2003 | Lochtefeld et al. |
| 6,900,502 | B2 | 5/2005 | Ge et al. | 2003/0230778 | A1 | 12/2003 | Park et al. |
| 6,902,991 | B2 | 6/2005 | Xiang et al. | 2003/0232467 | A1 | 12/2003 | Anderson et al. |
| 6,909,186 | B2 | 6/2005 | Chu | 2004/0005740 | A1 | 1/2004 | Lochtefeld et al. |
| 6,921,914 | B2 | 7/2005 | Cheng et al. | 2004/0007715 | A1 | 1/2004 | Webb et al. |
| 6,921,963 | B2 | 7/2005 | Krivokapic et al. | 2004/0007724 | A1 | 1/2004 | Murthy et al. |
| 6,921,982 | B2 | 7/2005 | Joshi et al. | 2004/0009649 | A1 | 1/2004 | Kub et al. |
| 6,936,875 | B2 | 8/2005 | Sugii et al. | 2004/0012037 | A1 | 1/2004 | Venkatesan et al. |
| 6,943,407 | B2 | 9/2005 | Ouyang et al. | 2004/0012075 | A1 | 1/2004 | Bedell et al. |
| 6,949,769 | B2 | 9/2005 | Hu et al. | 2004/0014276 | A1 | 1/2004 | Murthy et al. |
| 6,955,969 | B2 | 10/2005 | Djomehri et al. | 2004/0014304 | A1 | 1/2004 | Bhattacharyya |
| 6,974,733 | B2 | 12/2005 | Boyanov et al. | 2004/0018699 | A1 | 1/2004 | Boyd et al. |
| 6,977,194 | B2 | 12/2005 | Belyansky et al. | 2004/0031979 | A1 | 2/2004 | Lochtefeld et al. |
| 6,998,684 | B2 * | 2/2006 | Anderson et al. ............. 257/351 | 2004/0031990 | A1 | 2/2004 | Jin et al. |
| 7,045,401 | B2 | 5/2006 | Lee et al. | 2004/0041174 | A1 | 3/2004 | Okihara |
| 7,060,539 | B2 | 6/2006 | Chidambarrao et al. | 2004/0041210 | A1 | 3/2004 | Mouli |
| 7,078,299 | B2 | 7/2006 | Maszara et al. | 2004/0048091 | A1 | 3/2004 | Sato et al. |
| 7,087,965 | B2 | 8/2006 | Chan et al. | 2004/0048454 | A1 | 3/2004 | Sakaguchi |
| 7,091,561 | B2 | 8/2006 | Matsushita et al. | 2004/0051140 | A1 | 3/2004 | Bhattacharyya |
| 7,098,508 | B2 | 8/2006 | Ieong et al. | 2004/0053477 | A1 | 3/2004 | Ghyselen et al. |
| 7,105,390 | B2 * | 9/2006 | Brask et al. .................. 438/149 | 2004/0061191 | A1 | 4/2004 | Paton et al. |

| | | | |
|---|---|---|---|
| 2004/0070035 A1 | 4/2004 | Murthy et al. | |
| 2004/0075149 A1 | 4/2004 | Fitzgerald et al. | |
| 2004/0084735 A1 | 5/2004 | Murthy et al. | |
| 2004/0087114 A1 | 5/2004 | Xiang et al. | |
| 2004/0094758 A1 | 5/2004 | Usuda et al. | |
| 2004/0099903 A1 | 5/2004 | Yeo et al. | |
| 2004/0108559 A1 | 6/2004 | Sugii et al. | |
| 2004/0119101 A1 | 6/2004 | Schrom et al. | |
| 2004/0142545 A1 | 7/2004 | Ngo et al. | |
| 2004/0157353 A1 | 8/2004 | Ouyang et al. | |
| 2004/0173815 A1 | 9/2004 | Yeo et al. | |
| 2004/0195624 A1 | 10/2004 | Liu et al. | |
| 2004/0212013 A1 | 10/2004 | Takagi et al. | |
| 2004/0217430 A1 | 11/2004 | Chu | |
| 2004/0219726 A1 | 11/2004 | Fitzgerald | |
| 2004/0227187 A1 | 11/2004 | Cheng et al. | |
| 2004/0253774 A1 | 12/2004 | Boyanov et al. | |
| 2004/0256639 A1 | 12/2004 | Ouyang et al. | |
| 2004/0256647 A1 | 12/2004 | Lee et al. | |
| 2004/0259315 A1 | 12/2004 | Sakaguchi et al. | |
| 2004/0262631 A1 | 12/2004 | Fitzgerald | |
| 2005/0009288 A1 | 1/2005 | Cheng et al. | |
| 2005/0017304 A1 | 1/2005 | Matsushita et al. | |
| 2005/0017351 A1 | 1/2005 | Ravi | |
| 2005/0040404 A1 | 2/2005 | Hu et al. | |
| 2005/0040444 A1 | 2/2005 | Cohen | |
| 2005/0048727 A1 | 3/2005 | Maszara et al. | |
| 2005/0048743 A1 | 3/2005 | Djomehri et al. | |
| 2005/0054164 A1 | 3/2005 | Xiang | |
| 2005/0056892 A1 | 3/2005 | Seliskar | |
| 2005/0093033 A1 | 5/2005 | Kinoshita et al. | |
| 2005/0093059 A1 | 5/2005 | Belyansky et al. | |
| 2005/0093154 A1 | 5/2005 | Kottantharayil et al. | |
| 2005/0104152 A1 | 5/2005 | Snyder et al. | |
| 2005/0112817 A1 | 5/2005 | Cheng et al. | |
| 2005/0118793 A1 | 6/2005 | Snyder et al. | |
| 2005/0127451 A1 | 6/2005 | Tsuchiya et al. | |
| 2005/0130358 A1 | 6/2005 | Chidambarrao et al. | |
| 2005/0139860 A1 | 6/2005 | Snyder et al. | |
| 2005/0145941 A1 | 7/2005 | Bedell et al. | |
| 2005/0145954 A1 | 7/2005 | Zhu et al. | |
| 2005/0153486 A1 | 7/2005 | Xiang et al. | |
| 2005/0156169 A1 | 7/2005 | Chu | |
| 2005/0156202 A1 | 7/2005 | Rhee et al. | |
| 2005/0161711 A1 | 7/2005 | Chu | |
| 2005/0167750 A1 | 8/2005 | Yang et al. | |
| 2005/0170606 A1 | 8/2005 | Fu et al. | |
| 2005/0184316 A1 | 8/2005 | Kim et al. | |
| 2005/0224800 A1* | 10/2005 | Lindert et al. | 257/66 |

FOREIGN PATENT DOCUMENTS

| | | |
|---|---|---|
| EP | 0 514 018 | 11/1992 |
| EP | 0 587 520 | 3/1994 |
| EP | 0 683 522 | 11/1995 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |
| GB | 2 342 777 | 4/2000 |
| JP | 61-141116 | 6/1986 |
| JP | 2-210816 | 8/1990 |
| JP | 3-036717 | 2/1991 |
| JP | 4-307974 | 10/1992 |
| JP | 5-166724 | 7/1993 |
| JP | 6-177046 | 6/1994 |
| JP | 6-244112 | 9/1994 |
| JP | 06-252046 | 9/1994 |
| JP | 7-106446 | 4/1995 |
| JP | 7-240372 | 9/1995 |
| JP | 9-219524 | 8/1997 |
| JP | 10-270685 | 10/1998 |
| JP | 11-233744 | 8/1999 |
| JP | 2000-021783 | 1/2000 |
| JP | 2000-31491 | 1/2000 |
| JP | 2001-319935 | 11/2001 |
| JP | 2002-076334 | 3/2002 |
| JP | 2002-164520 | 6/2002 |
| JP | 2002-289533 | 10/2002 |
| WO | WO-98/59365 | 12/1998 |
| WO | WO-99/53539 | 10/1999 |
| WO | WO-00/48239 | 8/2000 |
| WO | WO-00/54338 | 9/2000 |
| WO | WO-01/22482 | 3/2001 |
| WO | WO-01/54202 | 7/2001 |
| WO | WO-01/93338 | 12/2001 |
| WO | WO-01/99169 | 12/2001 |
| WO | WO-02/13262 | 2/2002 |
| WO | WO-02/15244 | 2/2002 |
| WO | WO-02/27783 | 4/2002 |
| WO | WO-02/47168 | 6/2002 |
| WO | WO-02/071488 | 9/2002 |
| WO | WO-02/071491 | 9/2002 |
| WO | WO-02/071495 | 9/2002 |
| WO | WO-02/082514 | 10/2002 |
| WO | WO-03/105189 | 12/2003 |
| WO | WO-2004/006311 | 1/2004 |
| WO | WO-2004/006326 | 1/2004 |
| WO | WO-2004/006327 | 1/2004 |
| WO | WO-2004/019403 | 3/2004 |
| WO | WO-2004/019404 | 3/2004 |

OTHER PUBLICATIONS

Armstrong et al., "Design of Si/SiGe Heterojunction Complementary Metal-Oxide-Semiconductor Transistors," *IEDM Technical Digest* (1995) pp. 761-764.

Armstrong, "Technology for SiGe Heterostructure-Based CMOS Devices", Ph.D Thesis, Massachusetts Institute of Technology (1999) pp. 1-154.

Augusto et al., "Proposal for a New Process Flow for the Fabrication of Silicon-Based Complementary MOD-MOSFETs without Ion Implantation," *Thin Solid Films*, vol. 294, No. 1-2 (1997) pp. 254-258.

Barradas et al., "RBS analysis of MBE-grown SiGe/(001) Si heterostructures with thin, high Ge content SiGe channels for HMOS transistors," *Modern Physics Letters B* (2001) (abstract).

Batterman, "Hillocks, Pits, and Etch Rate in Germanium Crystals," *Journal of Applied Physics*, vol. 28, No. 11 (Nov. 1957), pp. 1236-1241.

Bohg, "Ethylene Diamine-Pyrocatechol-Water Mixture Shows Etching Anomaly in Boron-Doped Silicon," *Journal of the Electrochemical Society*, vol. 118, No. 2 (Feb. 1971), pp. 401-402.

Borenstein et al., "A New Ultra-Hard Etch-Stop Layer for High Precision Micromachining," *Proceedings of the 1999 12th IEEE International Conference on Micro Electro Mechanical Systems (MEMs)* (Jan. 17-21, 1999) pp. 205-210.

Bouillon et al., "Search for the optimal channel architecture for 0.18/0.12 μm bulk CMOS Experimental study," *IEEE* (1996) pp. 21.2.1-21.2.4.

Bruel et al., "® SMART CUT: A Promising New SOI Material Technology," Proceedings 1995 IEEE International SOI Conference (Oct. 1995) pp. 178-179.

Bruel, "Silicon on Insulator Material Technology," Electronic Letters, vol. 13, No. 14 (Jul. 6, 1995) pp. 1201-1202.

Brunner et al., "Molecular beam epitaxy growth and thermal stability of $Si_{1-x}Ge_x$ layers on extremely thin silicon-on-insulator substrates," *Thin Solid Films*, vol. 321 (1998), pp. 245-250.

Bufler et al., "Hole transport in strained $Si_{1-x}Ge_x$ alloys on $Si1-yGey$ substrates," *Journal of Applied Physics*, vol. 84, No. 10 (Nov. 15, 1998) pp. 5597-5602.

Burghartz et al., "Microwave Inductors and Capacitors in Standard Multilevel Interconnect Silicon Technology", *IEEE Transactions on Microwave Theory and Techniques*, vol. 44, No. 1 (Jan. 1996) pp. 100-104.

Canaperi et al., "Preparation of a relaxed Si-Ge layer on an insulator in fabricating high-speed semiconductor devices with strained epitaxial films," International Business Machines Corporation, USA (2002) (abstract).

Carlin et al., "High Efficiency GaAs-on-Si Solar Cells with High Voc Using Graded GeSi Buffers," *IEEE* (2000) pp. 1006-1011.

Chang et al., "Selective Etching of SiGe/Si Heterostructures," *Journal of the Electrochemical Society*, No. 1 (Jan. 1991) pp. 202-204.

Chen et al., "The Band Model and the Etching Mechanism of Silicon in Aqueous KOH," *Journal of the Electrochemical Society*, vol. 142, No. 1 (Jan. 1995), pp. 170-176.

Cheng et al., "Electron Mobility Enhancement in Strained-Si n-MOSFETs Fabricated on SiGe-on-Insulator (SGOI) Substrates," *IEEE Electron Device Letters*, vol. 22, No. 7 (Jul. 2001) pp. 321-323.

Cheng et al., "Relaxed Silicon-Germanium on Insulator Substrate by Layer Transfer," *Journal of Electronic Materials*, vol. 30, No. 12 (2001) pp. L37-L39.

Cullis et al, "Growth ripples upon strained SiGe epitaxial layers on Si and misfit dislocation interactions," *Journal of Vacuum Science and Technology A*, vol. 12, No. 4 (Jul./Aug. 1994) pp. 1924-1931.

Currie et al., "Carrier mobilities and process stability of strained Si n- and p-MOSFETs on SiGe virtual substrates," *J. Vac. Sci. Technol. B.*, vol. 19, No. 6 (Nov./Dec. 2001) pp. 2268-2279.

Currie et al., "Controlling Threading Dislocation in Ge on Si Using Graded SiGe Layers and Chemical-Mechanical Polishing," vol. 72 No. 14 (Apr. 6, 1998) pp. 1718-1720.

Desmond et al., "The Effects of Process-Induced Defects on the Chemical Selectivity of Highly Doped Boron Etch Stops in Silicon," *Journal of the Electrochemical Society*, vol. 141, No. 1 (Jan. 1994), pp. 178-184.

Eaglesham et al., "Dislocation-Free Stranski-Krastanow Growth of Ge on Si(100)," *Physical Review Letters*, vol. 64, No. 16 (Apr. 16, 1990) pp. 1943-1946.

Ehman et al., "Morphology of Etch Pits on Germanium Studied by Optical and Scanning Electron Microscopy," *Journal of Applied Physics*, vol. 41, No. 7 (Jun. 1970), pp. 2824-2827.

Examination Report for European Patent Application No. 01 973 651.1-1528, dated Mar. 22, 2004, 3 pages.

Examination Report for European Patent Application No. 01 973 651.1-1528, dated Nov. 12, 2004, 9 pages.

Examination Report for European Patent Application No. 01 973 651.1-1528, dated Sep. 7, 2005, 4 pages.

Examination Report for European Patent Application No. 01 989 893.1-1235, dated Aug. 16, 2004, 5 pages.

Examination Report for European Patent Application No. 02 709 406.9-2203, dated Mar. 24, 2005, 5 pages.

Examination Report for European Patent Application No. 02 709 406.9-2203, dated May 11, 2004, 3 pages.

Examination Report for European Patent Application No. 98 931 529.6-2203, dated Jan. 10, 2002, 4 pages.

Examination Report for European Patent Application No. 98 931 529.6-2203, dated May 9, 2003, 5 pages.

Feijoo et al., "Epitaxial Si-Ge Etch Stop Layers with Ethylene Diamine Pyrocatechol for Bonded and Etchback Silicon-on-Insulator," *Journal of Electronic Materials*, vol. 23, No. 6 (Jun. 1994) pp. 493-496.

Feijóo etal., "Etch Stop Barriers in Silicon Produced by Ion Implantation of Electrically Non-Active Species," *Journal of the Electrochemical Society*, vol. 139, No. 8 (Aug. 1992), pp. 2309-2313.

Finne et al., "A Water-Amine-Complexing Agent System for Etching Silicon," *Journal of the Electrochemical Society*, vol. 114, No. 9 (Sep. 1967), pp. 965-970.

Fischetti et al., "Band structure, deformation potentials, and carrier mobility in strained Si, Ge, and SiGe alloys," *J. Appl. Phys.*, vol. 80, No. 4 (Aug. 15, 1996) pp. 2234-2252.

Fischetti, "Long-range Coulomb interactions in small Si devices. Part II. Effective electron mobility in thin-oxide structures," *Journal of Applied Physics*, vol. 89, No. 2 (Jan. 15, 2001) pp. 1232-1250.

Fitzgerald et al., "Dislocation dynamics in relaxed graded composition semiconductors," *Materials Science and Engineering B67* 1999 pp. 53-61.

Fitzgerald et al., "Dislocations in Relaxed SiGe/Si Heterostructures," *Physica Status Solidi A, Applied Research*, Berlin, DE, vol. 171, Nr. 1, p. 227-238, Jan. 16, 1999.

Fitzgerald et al., "Relaxed $Ge_xSi_{1-x}$ structures for III-V integration with Si and high mobility two-dimensional electron gases in Si," AT&T Bell Laboratories, Murray Hill, NJ 07974 (1992) *American Vacuum Society*, pp. 1807-1819.

Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug. 12, 1991) pp. 811-813.

Fitzgerald, "GeSi/Si Nanostructures," *Annual Review of Materials Science*, vol. 25 (1995), pp. 417-454.

Frank, "Orientation-Dependent Dissolution of Germanium," *Journal of Applied Physics*, vol. 31, No. 11 (Nov. 1960), pp. 1996-1999.

Fukatsu, "SiGe-based semiconductor-on-insulator substrate created by low-energy separation-by-implanted-oxygen," *Applied Physics Letters*, vol. 72, No. 26 (Jun. 29, 1998), pp. 3485-3487.

Gannavaram, et al., "Low Temperature ($\leqq 800°$ C.) Recessed Junction Selective Silicon-Germanium Source/Drain Technology for sub-70 nm CMOS," *IEEE International Electron Device Meeting Technical Digest*, (2000), pp. 437-440.

Garone et al., "Silicon vapor phase epitaxial growth catalysis by the presence of germane," *Applied Physics Letters*, vol. 56, No. 13 (Mar. 26, 1990) pp. 1275-1277.

Ge et al., "Process-Strained Si (PSS) CMOS Technology Featuring 3D Strain Engineering," *IEEE International Electron Devices Meeting Technical Digest*, (2003) pp. 73-76.

Ghandi et al., "Chemical Etching of Germanium," *Journal of the Electrochemical Society*, vol. 135, No. 8 (Aug. 1988), pp. 2053-2054.

Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 978-980.

Godbey et al., "A $Si_{0.7}Ge_{0.3}$ strained-layer etch stop for the generation of thin layer undoped silicon," *Applied Physics Letters*, vol. 56, No. 4 (Jan. 22, 1990), pp. 373-375.

Godbey et al., (1990) "Fabrication of Bond and Etch-Back Silicon Insulator Using a Strained $SI_{0.7}GE_{0.3}$ Layer as an Etch Stop," *Journal of the Electrical Society*, vol. 137, No. 10 (Oct. 1990) pp. 3219-3223.

Gray and Meyer, "Phase-Locked Loops", *Analysis and Design of Analog Integrated Circuits* (1984) pp. 605-632.

Grillot et al., "Acceptor diffusion and segregation in $(Al_xGa_{1-x})_{0.5}In_{0.5}P$ heterostructures," *Journal of Applied Physics*, vol. 91, No. 8 (2002), pp. 4891-4899.

Grützmacher et al., "Ge segregation in SiGe/Si heterostructures and its dependence on deposition technique and growth atmosphere," *Applied Physics Letters*, vol. 63, No. 18 (Nov. 1, 1993) pp. 2531-2533.

Hackbarth et al., "Alternatives to thick MBE-grown relaxed SiGe buffers," *Thin Solid Films*, vol. 369, No. 1-2 (Jul. 2000) pp. 148-151.

Hackbarth et al., "Strain relieved SiGe buffers for Si-based heterostructure field-effect transistors," *Journal of Crystal Growth*, vol. 201/202 (1999) pp. 734-738.

Halsall et al., "Electron diffraction and Raman studies of the effect of substrate misorientation on ordering in the AIGaInP system," *Journal of Applied Physics*, vol. 85, No. 1 (1999), pp. 199-202.

Hamada et al., "A New Aspect of Mechanical Stress Effects in Scaled MOS Devices," *IEEE Transactions on Electron Devices*, vol. 38, No. 4 (Apr. 1991), pp. 895-900.

Herzog et al., "SiGe-based FETs: buffer issues and device results," *Thin Solid Films*, vol. 380 (2000) pp. 36-41.

Herzog et al., "X-Ray Investigation of Boron- and Germanium-Doped Silicon Epitaxial Layers," *Journal of the Electrochemical Society*, vol. 131, No. 12 (Dec. 1984), pp. 2969-2974.

Holmes, "The Orientation Dependence of Etching Effects on Germanium Crystals," *Acta Metallurgica*, vol. 7, No. 4 (Apr. 1959), pp. 283-290.

Hsu et al., "Surface morphology of related $Ge_xSi_{1-x}$ films," *Appl. Phys. Lett.* vol. 61, No. 11 (1992), pp. 1293-1295.

Huang et al., "High-quality strain-relaxed SiGe alloy grown on implanted silicon-on-insulator substrate," *Applied Phyusics Letters*, vol. 76, No. 19 (May 8, 200) pp. 2680-2682.

Huang et at, "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Transactions on Electron Devices*, vol. 44, No. 4 (Apr. 1997), pp. 646-650.

Huang et al., "The Impact of Scaling Down to Deep Submicron on CMOS RF Circuits", IEEE Journal of Solid-State Circuits, vol. 33, No. 7, Jul. 1998, pp. 1023-1036.

Huang et al., (2001) "Carrier Mobility enhancement in strained Si-on-insulatoir fabricated by wafer bonding", *2001 Symposium on VLSI Technology, Digest of Technical Papers*, pp. 57-58.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448-450.

Hunt et al., "Highly Selective Etch Stop by Stress Compensation for Thin-Film BESOI," *1990 IEEE/SOI Technology Conference*, (Oct. 2-4, 1990), pp. 145-146.

Höck et al., "Carrier mobilities in modulation doped $Si_{1-x}Ge_x$ heterostructures with respect to FET applications," *Thin Solid Films*, vol. 336 (1998) pp. 141-144.

Höck et al., "High hole mobility in $Si_{0.17}Ge_{0.83}$ channel metal-oxide-semiconductor field-effect transistors grown by plasma-enhanced chemical vapor deposition," *Applied Physics Letters*, vol. 76, No. 26 (Jun. 26, 2000) pp. 3920-3922.

Höck et al., "High performance 0.25 µm p-type Ge/SiGe MODFETs," *Electronics Letters*, vol. 34, No. 19 (Sep. 17, 1998) pp. 1888-1889.

IBM Technical Disclosure Bulletin, vol. 32, No. 8A, Jan. 1990, "Optimal Growth Technique and Structure for Strain Relaxation of Si-Ge Layers on Si Substrates", pp. 330-331.

Iida et al., "Thermal behavior of residual strain in silicon-on-insulator bonded wafer and effects on electron mobility," *Solid-State Electronics*, vol. 43 (1999), pp. 1117-1120.

International Preliminary Report on Patentability for International Application No. PCT/US2005/033546 (Jun. 5, 2007).

International Search Report for Patent Application No. PCT/US2005/033546, dated Apr. 19, 2006 (2 pages).

International Search Report for Patent Application No. PCT/US 98/13076, dated Oct. 27, 1998, 2 pages.

International Search Report for Related International Application No. PCT/US/18007, Jan. 5, 2004.

Ishikawa et al., "Creation of Si-Ge based SIMOX structures by low energy oxygen implantation," *Proceedings 1997 IEEE International SOI Conference* (Oct. 1997) pp. 16-17.

Ishikawa et al., "SiGe-on-insulator substrate using SiGe alloy grown Si(001)," *Applied Physics Letters*, vol. 75, No. 7 (Aug. 16, 1999) pp. 983-985.

Ismail et al., "Modulation-doped n-type Si/SiGe with inverted interface," *Appl. Phys. Lett.*, vol.65, No. 10 (Sep. 5, 1994) pp. 1248-1250.

Ismail, "Si/SiGe High-Speed Field-Effect Transistors," *Electron Devices Meeting*, Washington, D.C. (Dec. 10, 1995) pp. 20.1.1-20.1.4.

Ito et al., "Mechanical Stress Effect on Etch-Stop Nitride and its Impact on Deep Submicron Transistor Design," *IEEE International Electron Devices Meeting Technical Digest*, (2000), pp. 247-250.

Jaccodine, "Use of Modified Free Energy Theorems to Predict Equilibrium Growing and Etching Shapes," *Journal of Applied Physics*, vol. 33, No. 8 (Aug. 1962), pp. 2643-2647.

Kearney et al., "The effect of alloy scattering on the mobility of holes in a $Si_{1-x}Ge_x$ quantum well," *Semicond. Sci Technol.*, vol. 13 (1998) pp. 174-180.

Kern, "Chemical Etching of Silicon, Germanium, Gallium, Arsenide, and Gallium Phosphide," *RCA Review*, vol. 39 (Jun. 1978), pp. 278-308.

Kim et al., "A Fully Integrated 1.9-GHz CMOS Low-Noise Amplifier," *IEEE Microwave and Guided Wave Letters*, vol. 8, No. 8 (Aug. 1998) pp. 293-295.

Klauk et al., "Thermal stability of undoped strained Si channel SiGe heterostructures," Applied Physics Letter, No. 68, Apr. 1, 1996, pp. 1975-1977.

Koester et al., "Extremely High Transconductance $Ge/Si_{0.4}Ge_{0.6}$ p-MODFET's Grown by UHV-CVD," *IEEE Electron Device Letters*, vol. 21, No. 3 (Mar. 2000) pp. 110-112.

Kummer et al., "Low energy plasma enhanced chemical vapor deposition," *Materials Science and Engineering B89* (2002) pp. 288-295.

Kuznetsov et al., "Technology for high-performance n-channel SiGe modulation-doped field-effect transistors," *J. Vac. Sci. Technol., B* 13(6) (Nov./Dec. 1995) pp. 2892-2896.

König et al., "Design Rules for n-Type SiGe Hetero FETs," *Solid State Electronics*, vol. 41, No. 10 (1997), pp. 1541-1547.

König et al., "p-Type Ge-Channel MODFET's with High Transconductance Grown on Si Substrates," *IEEE Electron Device Letters*, vol. 14, No. 4 (Apr. 1993) pp. 205-207.

König et al., "SiGe HBTs and HFETs," *Solid-State Electronics*, vol. 38, No. 9 (1995) pp.1595-1602.

Lang et al., "Bulk Micromachining of Ge for IR Gratings," *Journal of Micromechanics and Microengineering*, vol. 6, No. 1 (Mar. 1996), pp. 46-48.

Langdo et al., (2002) "Preparation of Novel SiGe-free Strained Si on Insulator Substrates" *IEEE International SOI Conference*, pp. 211-212 (XP002263057).

Larson, "Integrated Circuit Technology Options for RFIC's—Present Status and Future Directions", *IEEE Journal of Solid-State Circuits*, vol. 33, No. 3, Mar. 1998, pp. 387-399.

Leancu et al., "Anisotropic Etching of Germanium," *Sensors and Actuators*, A46-47 (1995), pp. 35-37.

Lee et al., "CMOS RF Integrated Circuits at 5 GHz and Beyond", *Proceedings of the IEEE*, vol. 88, No. 10 (Oct. 2000) pp. 1560-1571.

Lee et al., "Strained Ge channel p-type metal-oxide-semiconductor field-effect transistors grown on $Si_{1-x}Ge_x/Si$ virtual substrates," *Applied Physics Letters*, vol. 79, No. 20 (Nov. 12, 2001) pp. 3344-3346.

Lee et al., "Strained Ge channel p-type MOSFETs fabricated on $Si_{1-x}Ge_x/Si$ virtual substrates," *Mat. Res. Soc. Symp. Proc.*, vol. 686 (2002) pp. A1.9.1-A1.9.5.

LeGoues et al., "Relaxation of SiGe thin films grown on $Si/SiO_2$ substrates," *Applied Physics Letters*, vol. 75, No. 11 (Jun. 1, 1994), pp. 7240-7246.

Lehmann et al., "Implanted Carbon: An Effective Etch-Stop in Silicon," *Journal of the Electrochemical Society*, vol. 138, No. 5 (May 1991), pp. 3-4.

Leitz et al., "Channel Engineering of SiGe-Based Heterostructures for High Mobility MOSFETs," *Mat. Res. Soc. Symp. Proc.*, vol. 686 (2002) pp. A3.10.1-A3.10.6.

Leitz et al., "Dislocation glide and blocking kinetics in compositionally graded SiGe/Si," *Journal of Applied Physics*, vol. 90, No. 6 (Sep. 15, 2001) pp. 2730-2736.

Leitz et al., "Hole mobility enhancements in strained $Si/Si1-yGey$ p-type metal-oxide-semiconductor field-effect transistors grown on relaxed $Si_{1-x}Ge_x$ (x<y) virtual substrates," *Applied Physics Letters*, vol. 79, No. 25 (Dec. 17, 2001) pp. 4246-4248.

Li et al., "Design of high speed Si/SiGe heterojunction complementary metal-oxide-semiconductor field effect transistors with reduced short-channel effects," *J. Vac. Sci. Technol.*, vol. 20 No. 3 (May/Jun. 2002) pp. 1030-1033.

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591-593.

Lu et al., "High Performance 0.1 µm Gate-Length P-Type SiGe MODFET's and MOS-MODFET's", *IEEE Transactions on Electron Devices*, vol. 47, No. 8 (Aug. 2000) pp. 1645-1652.

Maiti et al., "Strained-Si heterostructure field effect transistors," *Semicond. Sci. Technol.*, vol. 13 (1998) pp. 1225-1246.

Maszara, "Silicon-On-Insulator by Wafer Bonding: A Review," *Journal of the Electrochemical Society*, No. 1 (Jan. 1991) pp. 341-347.

Meyerson et al., "Cooperative Growth Phenomena in Silicon/Germanium Low-Temperature Epitaxy," *Applied Physics Letters*, vol. 53, No. 25 (Dec. 19, 1988) pp. 2555-2557.

Mizuno et al., "Advanced SOI-MOSFETs with Strained-Si Channel for High Speed CMOS-Electron/Hole Mobility Enhancement," 2000 Symposium on VLSI Technology, Digest of Technical Papers, Honolulu, (Jun. 13-15), IEEE New York, NY, pp. 210-211.

Mizuno et al., "Electron and Hold Mobility Enhancement in Strained-Si MOSFET's on SiGe-on-Insulator Substrates Fabricated by SIMOX Technology," *IEEE Electron Device Letters*, vol. 21, No. 5 (May 2000) pp. 230-232.

Mizuno et al., "High Performance Strained-Si p-MOSFETs on SiGe-on-Insulator Substrates Fabricated by SIMOX Technology," *IEEE IDEM Technical Digest* (1999) pp. 934-936.

Narozny et al., "Si/SiGe Heterojunction Bipolar Transistor with Graded GAP SiGe Base Made by Molecular Beam Epitaxy," *IEEE IEDM* (1988), pp. 562-565.

Nayak et al., "High-Mobility Strained-Si PMOSFET's"; *IEEE Transactions on Electron Devices*, vol. 43, No. 10 (Oct. 1996) pp. 1709-1716.
Notice of Final Rejection for Korean Patent Application No. 10-1999-7012279, dated Feb. 25, 2003 2 pages (English translation attached).
Notice of Preliminary Rejection for Korean Patent Application No. 10-1999-7012279, dated Feb. 21, 2002, 2 pages (English translation attached).
O'Neill et al., "SiGe Virtual substrate N-channel heterojunction MOSFETS," *Semicond. Sci. Technol.*, vol. 14 (1999) pp. 784-789.
Ootsuka et al., "A Highly Dense, High-Performance 130nm node CMOS Technology for Large Scale System-on-a-Chip Applications," *IEEE International Electron Devices Meeting Technical Digest*, (2000), pp. 575-578.
Ota et al., "Novel Locally Strained Channel Technique for High Performance 55nm CMOS," *IEEE International Electron Devices Meeting Technical Digest*, (2002), pp. 27-30.
Ota Y. et al., "Application of heterojunction FET to power amplifier for cellular telephone," *Electronics Letters*, vol. 30, No. 11 (May 26, 1994) pp. 906-907.
Palik et al., "Ellipsometric Study of the Etch-Stop Mechianism in Heavily Doped Silicon," *Journal of the Electrochemical Society*, vol. 132, No. 1 (Jan. 1985), pp. 135-141.
Palik et al., "Study of Bias-Dependent Etching of Si in Aqueous KOH," *Journal of the Electrochemical Society*, vol. 134, No. 2 (Feb. 1987), pp. 404-409.
Palik et al., "Study of the Etch-Stop Mechanism in Silicon," *Journal of the Electrochemical Society*, vol. 129, No. 9 (Sep. 1982), pp. 2051-2059.
Papananos, "Low Noise Amplifiers in MOS Technologies," and "Low Noise Tuned-LC Oscillator," *Radio-Frequency Microelectronic Circuits for Telecommunication Applications* (1999) pp. 115-117, 188-193.
Parker et al., "SiGe heterostructure CMOS circuits and applications," *Solid State Electronics*, vol. 43 (1999) pp. 1497-1506.
Petersen, "Silicon as a Mechanical Material," *Proceedings of the IEEE*, vol. 70, No. 5 (May 1982), pp. 420-457.
Powell et al., "New approach to the growth of low dislocation relaxed SiGe material," *Applied Physics Letters*, vol. 64, No. 14 (Apr. 4, 1994), pp. 1865-1858.
Rai-Choudhury et al., "Doping of Epitaxial Silicon," *Journal of Crystal Growth*, vol. 7 (1970), pp. 361-367.
Raley et al., "(100) Silicon Etch-Rate Dependence on Boron Concentration in Ethylenediamine-Pyrocatechol-Water Solutions," *Journal of the Electrochemical Society*, vol. 131, No. 1 (Jan. 1984), pp. 161-170.
Ransom et al., "Gate-Self-Aligned n-channel and p-channel Germanium MOSFET's," *IEEE Transactions on Electron Devices*, vol. 38, No. 12 (Dec. 1991) pp. 2695.
Reinking et al., "Fabrication of high-mobility Ge p-channel MOSFETs on Si substrates," *Electronics Letters*, vol. 35, No. 6 (Mar. 18, 1999) pp. 503-504.
Rim et al., "Enhanced Hole Mobilities in Surface-channel Strained-Si p-MOSFETs"; *IEDM*, 1995, pp. 517-520.
Rim et al., "Fabrication and Analysis of Deep Submicron Strained-Si N-Mosfet's" IEEE.Transactions on Electron Devices, vol. 47, No. 7, Jul. 2000, pp. 1406-1415.
Rim, "Application of Silicon-Based Heterostructures to Enhanced Mobility Metal-Oxide-Semiconductor Field-Effect Transistors", Ph.D. Thesis, Stanford University (1999) pp. 1-184.
Robbins et al., "A model for heterogeneous growth of $Si_{1-x}Ge_x$ films for hydrides," *Journal of Applied Physics*, vol. 69, No. 6 (Mar. 15, 1991) pp. 3729-3732.
Rosenblad et al., "Strain relaxation of graded SiGe buffers brown at very high rates," Materials Science and Engineering B, Elsevier Sequoia, Lausanne, CH, vol. 71, Nr. 1-3, p. 20-23, Feb. 2000.
Sadek et al., "Design of Si/SiGe Heterojunction Complementary Metal-Oxide-Semiconductor Transistors," *IEEE Trans. Electron Devices* (Aug. 1996) pp. 1224-1232.
Sakaguchi et al., "ELTRAN® by Splitting Porous Si Layers," Proc. 195th Int. SOI Symposium, vol. 99-3, *Electrochemical Society* (1999) pp. 117-121.

Schäffler, "High-Mobility Si and Ge Structures," *Semiconductor Science and Technology*, vol. 12 (1997) pp. 1515-1549.
Seidel et al., "Anisotropic Etching of Crystalline Silicon in Alkaline Solutions," *Journal of the Electrochemical Society*., vol. 137, No. 11 (Nov. 1990), pp. 3626-3632.
Senna et al., "Gallium Doping for Silicon Etch Stop in KOH," *Transducers '95/Eurosensors IX*, the 8th International Conference on Solid-State Sensors and Actuators and Eurosensors IX, Stockholm, Sweden, Jun. 25-29, 1995, pp. 194-195.
Shang et al., "The Development of an Anisotropic Si Etch Process Selective to $Ge_xSi_{1-x}$ Underlayers," *Journal of the Electrochemical Society*., vol. 141, No. 2 (Feb. 1994), pp. 507-510.
Shimizu et al., "Local Mechanical-Stress Control (LMC): A New Technique for CMOS-Performance Enhancement," *IEEE International Electron Devices Meeting Technical Digest*, (2001), pp. 433-436.
Soderbarg, "Fabrication of BESOI-Materials Using Implanted Nitrogen as an Effective Etch Stop Barrier," *1989 IEEE SOS/SOI Technology Conference*, (Oct. 3-5, 1989), pp. 64.
Sugimoto et al., "A 2V, 500 MHz and 3V, 920 MHz Low-Power Current-Mode 0.6 µm CMOS VCO Circuit", *IEICE Trans. Electron.*, vol. E82-C, No. 7 (Jul. 1999) pp. 1327-1329.
Sundaram et al., "Electrochemical etching of Silicon by Hydrazine," *Journal of the Electrochemical Society*, vol. 140, No. 6 (Jun. 1993), pp. 1592-1597.
Sze, "Physics of Semiconductor Devices," (1991).
Takagi et al., "On the Universality of Inversion Layer Mobility in Si MOSFET's: Part I—Effects of Substrate Impurity Concentration," *IEEE Transactions on Electron Devices*, vol. 41, No. 12 (Dec. 1994), pp. 2357-2362.
Ternent et al., "Metal Gate Strained Silicon MOSFETs for Microwave Integrated Circuits", *IEEE* (Oct. 2000) pp. 38-43.
Thompson et al., "A 90 nm Logic Technology Featuring 50nm Strained-Silicon Channel Transistors, 7 layers of Cu *Interconnects*, Low k ILD, and 1 um$^2$ SRAM Cell," *IEEE International Electron Devices Meeting Technology Digest*, (2002), pp. 61-64.
Thompson et al., "A Logic Nanotechnology Featuring Strained-Silicon," *IEEE Electron Device Letters*, vol. 25, No. 4 (Apr. 2004), pp. 191-193.
Ting et al., "Monolithic Integration of III-V Materials and Devices on Silicon," Part of the0 SPIE Conference on Silicon-Based Optoelectronics, San Jose, CA, (Jan. 1999), pp. 19-28.
Tiwari et al., "Hole Mobility Improvement in Silicon-on-Insulator and Bulk Silicon Transistors Using Local Strain," *IEEE International Electron Devices Meeting Technical Digest*, (1997), pp. 939-941.
Tong, et al., "Semiconductor Wafer Bonding: Science and Technology," *Wiley-Interscience.* (1999), pp. 33 and 70-71.
Tsang et al., "Measurements of alloy composition and strain in thin $Ge_xSi_{1-x}$ layers," *J. Appl. Phys.*, vol. 75 No. 12 (Jun. 15, 1994) pp. 8098-8108.
Tweet et al., "Factors determining the composition of strained GeSi layers grown with disilane and germane," *Applied Physics Letters*, vol. 65, No. 20 (Nov. 14, 1994) pp. 2579-2581.
Uchino, et al., "A Raised Source/Drain Technology Using In-situ P-doped SiGe and B-doped Si for 0.1-µm CMOS ULSIs," *IEEE International Electron Device Meeting Technical Digest*, (1997), pp. 479-482.
Usami et al., "Spectroscopic study of Si-based quantum wells with neighboring confinement structure," *Semicon. Sci. Technol.* (1997) (abstract).
Vol'fson et al., "Fundamental Absorption Edge of Silicon Heavily Doped with Donor or Acceptor Impurities," *Soviet Physics Semiconductors*, vol. 1, No. 3 (Sep. 1967), pp. 327-332.
Welser et al., "Electron Mobility Enhancement in Strained-Si N-Type Metal-Oxide-Semiconductor Field-Effect Transistors," *IEEE Electron Device Letters*, vol. 15, No. 3 (Mar. 1994) pp. 100-102.
Welser et al., "Evidence of Real-Space Hot-Electron Transfer in High Mobility, Strained-Si Multilayer MOSFETs," *IEEE IDEM Technical Digest* (1993) pp. 545-548.
Welser et al., "NMOS and PMOS Transistors Fabricated in Strained Silicon/Relaxed Silicon-Germanium Structures," *IEEE IDEM Technical Digest* (1992) pp. 1000-1002.

Welser, "The Application of Strained Silicon/Relaxed Silicon Germanium Heterostructures to Metal-Oxide-Semiconductor Field-Effect Transistors," Ph.D. Thesis, Stanford University (1994) pp. 1-205.

Wolf et al., "Silicon Processing for the VLSI Era," vol. 1 *Process Technology* (1986) pp. 384-386.

Written Opinion of the International Searching Authority for PCT/US2005/033546, dated Apr. 19, 2006 (9 pages).

Wu, "Novel Etch-Stop Materials for Silicon Micromachining," Thesis Submitted to the Massachusetts Institute of Technology Department of Materials Science and Engineering on May 9, 1997, pp. 1-62.

Xie et al., "Semiconductor Surface Roughness: Dependence on Sign and Magnitude of Bulk Strain," *The Physical Review Letters*, vol. 73, No. 22 (Nov. 28, 1994) pp. 3006-3009.

Xie et al., "Very high mobility two-dimensional hole gas in Si/$Ge_xSi_{1-x}$/Ge structures grown by molecular beam epitaxy," *Appl. Phys. Lett.*, vol. 63, No. 16 (Oct. 18, 1993) pp. 2263-2264.

Xie, "SiGe Field effect transistors," *Materials Science and Engineering*, vol. 25 (1999) pp. 89-121.

Yamagata et al., "Bonding, Splitting and Thinning by Porous Si in ELTRAN®; SOI-Epi Wafer™," *Mat. Res. Soc. Symp. Proc.*, vol. 681E (2001) pp. I8.2.1-I8.2.10.

Yeo et al., "Nanoscale Ultra-Thin-Body Silicon-on-Insulator P-MOSFET with a SiGe/Si Heterostructure Channel," *IEEE Electron Device Letters*, vol. 21, No. 4 (Apr. 2000) pp. 161-163.

Yi et al., "$Si_{1-x}Ge_x$/Si Multiple Quantum Well Wires Fabricated Using Selective Etching," *Materials Research Society Symposium Proceedings*, vol. 379 (1995), pp. 91-96.

Zhang et al., "Demonstration of a GaAs-Based Compliant Substrate Using Wafer Bonding and Substrate Removal Techniques," Electronic Materials and Processing Research Laboratory, Department of Electrical Engineering, University Park, PA 16802 (1998) pp. 25-28.

Öztürk, etal., "Advanced $Si_{1-x}Ge_x$ Source/Drain and Contact Technologies for Sub-70 nm CMOS," *IEEE International Electron Device Meeting Technical Digest*, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," *IEEE International Electron Device Meeting Technical Digest* (2003), pp. 497-500.

Öztürk, etal., "Selective Silicon-Gremanium Source/Drain Technology for Nanoscale CMOS," *Mat. Res. Soc. Symp. Proc.*, vol. 717, (2002), pp. C4.1.1-C4.1.12.

Öztürk, etal., "Ultra-Shallow Source/Drain Junctions for Nanoscale CMOS Using Selective Silicon-Germanium Technology," *Extended Abstracts of International Workshop on Junction Technology*, (2001), pp. 77-82.

\* cited by examiner

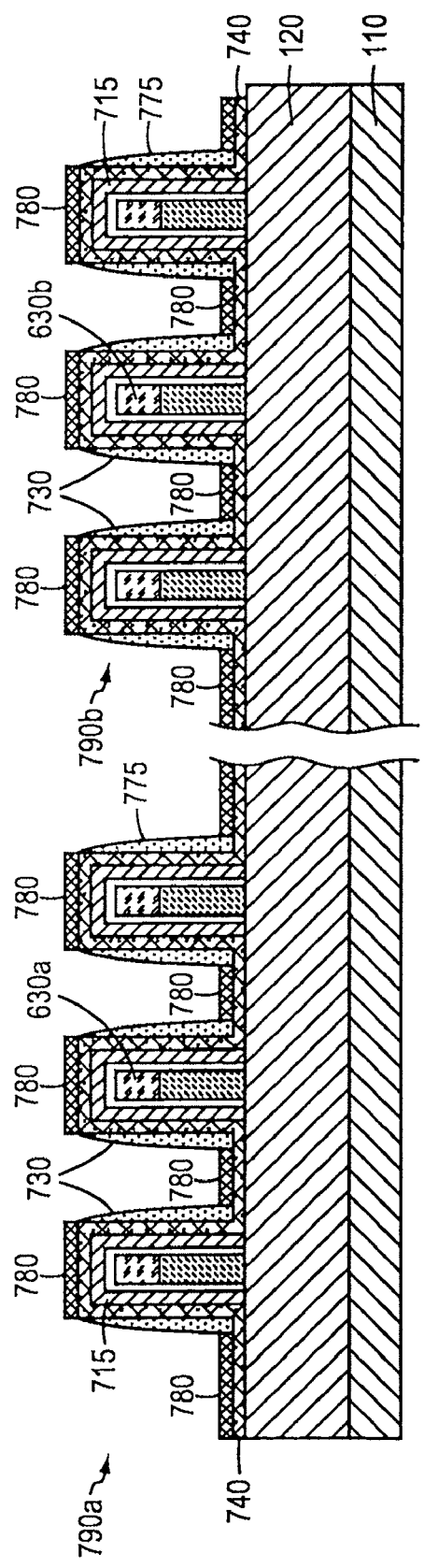
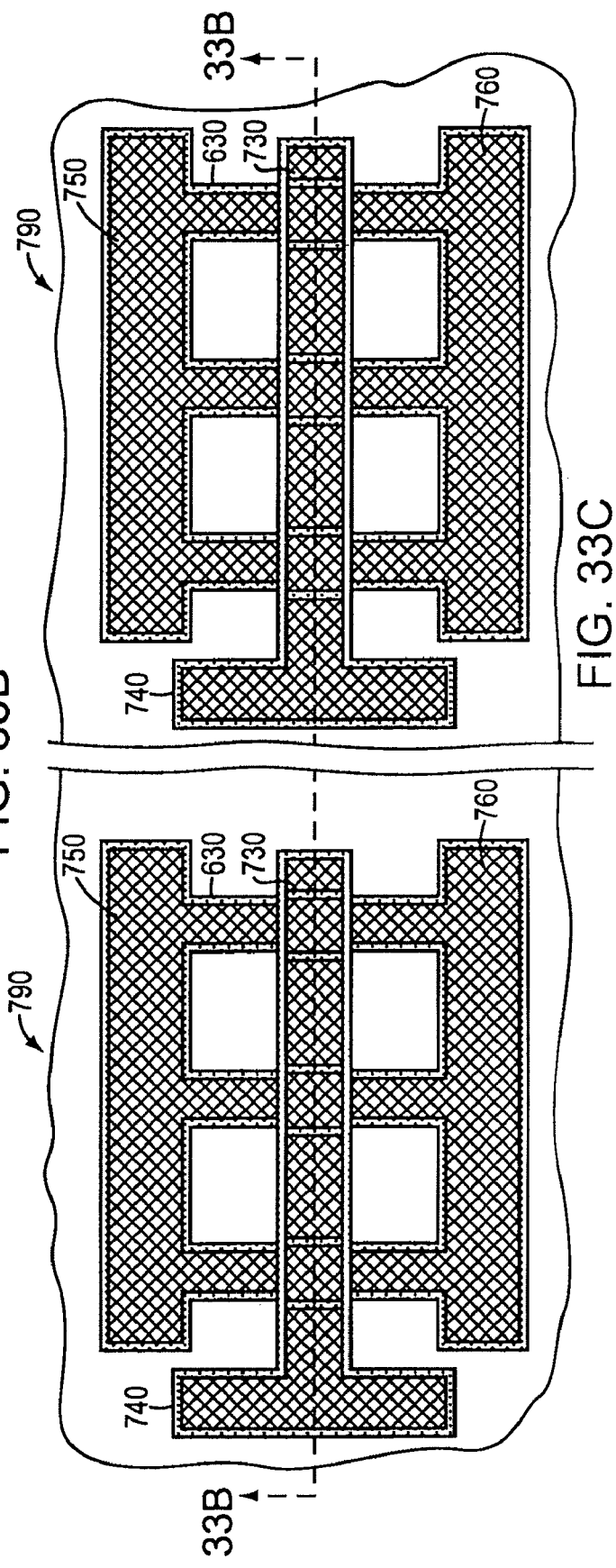
FIG. 33B
FIG. 33C

HYBRID FIN FIELD-EFFECT TRANSISTOR STRUCTURES AND RELATED METHODS

RELATED APPLICATION

This application is a continuation application of U.S. Ser. No. 11/001,166, filed Dec. 1, 2004 now U.S. Pat. No. 7,393,733, the entire disclosure of which is hereby incorporated by reference.

FIELD OF THE INVENTION

This invention relates generally to semiconductor structures and particularly to hybrid strained semiconductor-on-insulator structures.

BACKGROUND

As geometric transistor scaling becomes more difficult and less effective in providing adequate performance enhancements, there is an incentive to improve the performance of transistors by enhancing innate carrier mobility by, e.g., application of strain to the semiconductor channel material. Although process simplicity is maintained by the application of one type of strain (or one type of channel material) for both NMOS and PMOS devices, overall performance would be greatly improved if it were possible to enhance the performance of each type of device separately. Traditionally, this enhancement has been incomplete—one type of channel material is typically used for both device types, with selective application of strain to the channel material for each device.

Devices are advantageously formed on semiconductor-on-insulator (SOI) substrates. Such substrates offer the benefits of an insulating substrate, such as reduced parasitic capacitances and improved isolation.

SUMMARY

The efficacy of the traditional approach for enhancing the performance of NMOS and PMOS devices may be improved by additionally customizing the transistor channel materials and their respective strain levels selectively for NMOS and PMOS devices. This is particularly true for advanced transistor geometries such as partially depleted semiconductor-on-insulator (PDSOI) devices, fully depleted semiconductor-on-insulator (FDSOI) devices, or fin field-effect transistors (FinFETs).

Although schemes exist to utilize multilayer channel materials and/or types of strain for transistors (see, e.g., U.S. Ser. Nos. 10/456,926, 10/164,665, 10/177,571, and 10/216,085, and U.S. Pat. No. 6,730,551, all of which are incorporated herein by reference), these schemes may not be effective for FDSOI and PDSOI devices when the total desired channel thickness for each type of device is very small. Since some such schemes rely on the presence of two channels in the starting substrate, this bilayer scheme may not allow the device type that utilizes the top channel for conduction to operate in fully depleted mode (due to the total thickness of the two channels being too great for the device to meet the FD maximum thickness criterion).

In accordance with the invention, NMOS and PMOS devices have channel layers of different materials and/or types of strain, each with potentially a very thin thickness. Aspects of the invention include variations in the starting substrate/channel layer structure and/or the processes used during device fabrication to create the final structure. For these solutions, Si—Ge alloys are used as exemplary materials. In general, it has been demonstrated that layers of Si—Ge with low Ge contents and/or under tensile strain are preferred for NMOS devices, and layers with higher Ge content and/or under compressive strain are preferred for PMOS devices. Other combinations of materials, including group IV semiconductors such as alloys of Si, Ge, or SiGe with C; III-V semiconductors; and II-VI semiconductors may also be suitable.

In an aspect, the invention features a structure including (i) a semiconductor substrate, a first semiconductor layer including a first semiconductor material disposed over at least a first portion of the substrate, and a second semiconductor layer including a second semiconductor material disposed over at least a second portion of the substrate; (ii) a first MOSFET disposed on the substrate and including a first MOSFET channel disposed in a portion of the first semiconductor layer over a first insulating material, the first MOSFET channel including the first semiconductor material; and (iii) a second MOSFET disposed on the substrate and including a second MOSFET channel disposed in a portion of the second semiconductor layer over a second insulating material, the second MOSFET channel including the second semiconductor material.

The first and second MOSFETs are at least partially depleted during operation. Moreover, the first MOSFET and/or the second MOSFET may be fully depleted during operation. Each of the first and second MOSFETs may be an nMOSFET or a pMOSFET.

The first and/or semiconductor material may include or consist of a group IV material, a III-V material, and/or a II-VI material. Specific examples of such materials include silicon, SiGe, germanium, an array of carbon nanotubes, and mixtures or alloys thereof; and gallium arsenide, indium arsenide, indium gallium arsenide, indium phosphide, gallium nitride, indium antimonide, gallium antimonide, gallium phosphide, and mixtures or alloys thereof. At least one of the first and second semiconductor materials may be tensilely strained and/or compressively strained.

The first semiconductor layer may have a first crystalline orientation, the second semiconductor layer may have a second crystalline orientation, and the first crystalline orientation may be different from the second crystalline orientation. The first crystalline orientation may be selected from a {100} family of crystalline planes; the second crystalline orientation may be selected from a {110} family of crystalline planes.

The first semiconductor layer may have a first crystalline in-plane rotation, the second semiconductor layer may have a second crystalline in-plane rotation different from the first crystalline in-plane rotation.

A crystallographic orientation of the nMOSFET channel may be parallel to a crystallographic direction selected from any of a <110> family of crystallographic directions. A crystallographic orientation of the pMOSFET channel is parallel to a crystallographic direction selected any of a <100> family of crystallographic directions.

An insulator layer including the first and second insulating material may be disposed over the semiconductor substrate, with the first insulating material being identical or substantially similar to the second insulating material.

A first insulator layer including the first insulating material may be disposed over at least the first portion of the substrate, and a second insulator layer including the second insulator material may be disposed over at least the second portion of the substrate, such that the first MOSFET channel is disposed over the first insulator layer, and the second MOSFET channel is disposed over the second insulator layer.

The first semiconductor layer may be disposed over a region of the second semiconductor layer, with the first semiconductor layer having a first type of strain and a first lattice constant, and the second semiconductor layer having a second type of strain and the first lattice constant. Each of the first and second types of strain may be either of tensile or compressive strain.

The first semiconductor layer may have a first type of strain and a first lattice constant, and the second semiconductor layer may be disposed over a region of the first semiconductor layer, the second semiconductor layer having a second type of strain and the first lattice constant.

The first MOSFET may include a first gate dielectric layer (including a first dielectric material) disposed over the first MOSFET channel and the second MOSFET may include a second gate dielectric layer (including a second dielectric material) disposed over the second MOSFET channel. The first and second dielectric materials may be identical, substantially similar or substantially different. The first and/or the second dielectric material may include or consist of at least one of silicon dioxide, silicon oxynitride, silicon nitride, barium oxide, strontium oxide, calcium oxide, tantalum oxide, titanium oxide, zirconium oxide, hafnium oxide, aluminum oxide, lanthanum oxide, yttrium oxide, yttrium aluminate, lathanum aluminate, lanthanum silicate, yttrium silicate, hafnium silicate, zirconium silicate, and doped alloys, undoped alloys, mixtures, and/or multilayers thereof.

The first MOSFET may include a first gate electrode layer comprising a first conductive material disposed over the first MOSFET channel, and the second MOSFET may include a second gate electrode layer comprising a second conductive material disposed over the second MOSFET channel. The first and second conductive materials may be identical, substantially similar or substantially different.

The first and/or second conductive material may include at least one of doped polycrystalline silicon, doped polycrystalline SiGe, Al, Ag, Bi, Cd, Fe, Ga, Hf, In, Mn, Nb, Y, Zr, Ni, Pt, Be, Ir, Te, Re, Rh, W, Mo, Co, Fe, Pd, Au, Ti, Cr, Cu, and doped alloys, undoped alloys, mixtures, and/or multilayers thereof.

A portion of the first semiconductor layer may be disposed over the second portion of the substrate, and the second semiconductor layer may be disposed over the portion of the first semiconductor layer.

A portion of the second semiconductor layer may be disposed over the first portion of the substrate and the first semiconductor layer may be disposed over the portion of the second semiconductor layer.

The first insulator layer and/or second insulator layer may include a crystalline oxide layer, which may induces a strain in the first and second semiconductor layers. The crystalline oxide layer may include at least one of a multicomponent metal oxide and a dielectric material having a lattice constant of approximately 5.4 Å and a body-centered cubic structure.

The multicomponent metal oxide may include or consist of one or more metals selected from the group consisting of Al, Ti, Zr, Hf, V, Nb, Ta, Cr, Mo, W, and Cu. The multicomponent metal oxide may include or consist of at least one of barium strontium titanate, barium strontium zirconate, barium strontium hafnate, lead titanate, yttrium aluminate, lanthanum aluminate, lead zirconium titanate, hafnium silicate, zirconium silicate, strontium silicon oxide, zirconium silicon oxide, hafnium silicon oxide, hafnium oxide, zirconium oxide, strontium titanate, lanthanum oxide, yttrium oxide, titanium oxide, barium titanate, lanthanum aluminate, lanthanum scandium oxide, and/or aluminum oxide. The dielectric material may include or consist of at least one of cesium oxide, aluminum nitride, and lanthanum aluminum oxide.

The first insulator layer may include or consist of a first crystalline oxide that induces a first type of strain in the first semiconductor layer, and the second insulator layer may include a second crystalline oxide that induces a second type of strain in the second semiconductor layer.

The first insulator layer may induce a first strain in the first semiconductor layer, and the second insulator layer induces a second strain in the second semiconductor layer.

In another aspect, the invention features a method for forming a structure, the method including the steps of (i) providing a semiconductor substrate, (ii) defining a first portion of the substrate; (iii) defining a second portion of the substrate; (iv) providing a first insulating material over the first portion of the substrate; (v) providing a second insulating material over the second portion of the substrate; (vi) forming a first semiconductor layer including a first semiconductor material over at least the first portion of the substrate; (vii) forming a second semiconductor layer including a second semiconductor material over at least the second portion of the substrate; (viii) forming a first MOSFET on the substrate, the first MOSFET including a first MOSFET channel disposed in a portion of the first semiconductor layer over the first insulating material, the first MOSFET channel including the first semiconductor material; and (ix) forming a second MOSFET on the substrate, the second MOSFET including a second MOSFET channel disposed in a portion of the second semiconductor layer over the second insulating material, the second MOSFET channel including the second semiconductor material. The first and second MOSFETs are at least partially depleted during operation.

Defining the first and second portions of the substrate may include defining a shallow trench isolation region. The first insulating material may be identical to or substantially the same as the second insulating material and providing the first and second insulating materials may include forming an insulator layer over the substrate.

Forming the first semiconductor layer may include bonding the first semiconductor layer to the insulator layer. The first semiconductor layer may be formed over the first and second portions of the substrate and the second semiconductor layer may be formed over a second portion of the first semiconductor layer disposed over the second portion of the substrate. The second portion of the first semiconductor layer may be thinned prior to forming the second semiconductor layer. Forming the insulator layer, the first semiconductor layer, and/or the second semiconductor layer over the substrate may involve deposition.

Either of the first MOSFET or second MOSFET may be an nMOSFET or a pMOSFET.

The first semiconductor layer may be formed over the first and second portions of the substrate. The second semiconductor layer may be formed over the first semiconductor layer.

A portion of the second semiconductor layer disposed over the first semiconductor layer over the first portion of the substrate may be removed.

A regrowth layer may be formed over the first semiconductor layer disposed over the first portion of the substrate.

Forming the regrowth layer may include providing additional first semiconductor material and a total thickness of the first semiconductor layer and the regrowth layer may be approximately the same as a total thickness of the first semiconductor layer and the second semiconductor layer in a second portion of the substrate.

Providing the first and second insulating materials may involve deposition, and the first insulating material may be different from the second insulating material. Forming the first and second semiconductor layers may involve deposition, and the first semiconductor material may be substantially the same as or different from the second semiconductor material. At least one of the first and second insulating materials may include a crystalline oxide.

The first semiconductor layer may have a thickness selected from a range of 1-50 nm. The second semiconductor layer may have a thickness selected from a range of 1-50 nm. For particularly aggressive FDSOI devices, the first and/or second semiconductor layer may have a thickness more preferably selected from a range of 1-20 nm, or more preferably 1-10 nm.

In another aspect, the invention features a substrate having an insulator layer disposed thereon, and a FinFET disposed over the substrate. The FinFET includes (i) a source region and a drain region disposed in contact with the insulator layer; (ii) at least one fin extending between the source and the drain regions and comprising a bilayer; (iii) a gate disposed above the bilayer, extending over at least one fin and between the source and the drain regions; and a gate dielectric layer disposed between the gate and the fin.

The bilayer may include a second semiconductor material disposed over a first semiconductor material. The first semiconductor material and the second semiconductor material may be the same or different, and each may include or consist of a group IV material, a III-V material, and/or a II-VI material. The group IV material may be silicon, SiGe, germanium, an array of carbon nanotubes, and/or mixtures or alloys thereof. The III-V material may be gallium arsenide, indium arsenide, indium gallium arsenide, indium phosphide, gallium nitride, indium antimonide, gallium antimonide, gallium phosphide, and/or mixtures or alloys thereof.

At least one of the first and second semiconductor materials may be tensilely strained or compressively strained. The gate dielectric may be disposed proximate the first semiconductor material and the second semiconductor material.

In another aspect, the invention comprises a structure including a substrate having a crystalline oxide layer disposed thereon, and a FinFET disposed over the substrate. The FinFET includes (i) a source region and a drain region disposed in contact with the insulator layer; (ii) at least one fin extending between the source and the drain regions, the fin comprising a first semiconductor layer disposed over the crystalline oxide layer; (iii) a gate disposed above the first semiconductor layer, extending over at least one fin and between the source and the drain regions; and (iv) a gate dielectric layer disposed between the gate and the fin.

In another aspect, the invention comprises a structure including (i) a substrate; (ii) a first insulator layer disposed over at least a first portion of the substrate; (iii) a second insulator layer disposed over at least a second portion of the substrate; (iv) a first FinFET disposed over the substrate; and (v) a second FinFET disposed over the substrate. The first FinFET includes (i) a first source region and a first drain region disposed over and in contact with the first insulator layer; (ii) a first fin extending between the first source and the first drain regions, the first fin including a first semiconductor material disposed on at least one vertically oriented sidewall of the first fin; (iii) a first gate disposed above the substrate, extending over the first fin and between the first source and the first drain regions; and (iv) a first gate dielectric layer disposed between the first gate and the first fin. The second FinFET includes (i) a second source region and a second drain region disposed over and in contact with the second insulator layer; (ii) a second fin extending between the second source and the second drain regions, the second fin including a second semiconductor material disposed on at least one vertically oriented sidewall of the second fin; (iii) a second gate disposed above the substrate, extending over the second fin and between the second source and the second drain regions; and (iv) a second gate dielectric layer disposed between the second gate and the second fin. The first semiconductor material has a first crystalline orientation, the second semiconductor material has a second crystalline orientation that preferably differs from the first crystalline orientation.

The first insulator layer may include a first crystalline oxide, the second insulator layer may include a second crystalline oxide, the first fin may include the first crystalline oxide, and the second fin may include the second crystalline oxide.

The first crystalline oxide and the second crystalline oxide may be substantially different. The first fin and second fin may be substantially parallel. The first semiconductor material and the second semiconductor material may be substantially the same. The first crystalline orientation may be selected from a $\{100\}$ family of crystalline planes or a $\{110\}$ family of crystalline planes. The first FinFET may include an n-channel device and the second FinFET comprises a p-channel device.

In another aspect, the invention features a method for forming a structure, the method including (i) providing a substrate having an insulator layer disposed thereon, and a bilayer disposed in contact with the insulator layer, the bilayer including a second semiconductor layer disposed over a first semiconductor layer; and (ii) forming a FinFET on the substrate. The FinFET is formed by (i) patterning the bilayer to define a source region, a drain region, and at least one fin disposed between the source and the drain regions, (ii) forming a gate dielectric layer, at least a portion of the gate dielectric layer being disposed over the fin, and (iii) forming a gate over the gate dielectric layer portion disposed over the fin.

The bilayer may include or consist of at least one of a group II, a group III, a group IV, a group V, or a group VI element. The bilayer may include a strained semiconductor layer that may be tensilely strained or compressively strained.

In another aspect, the invention features a structure including (i) a substrate; (ii) a first FinFET disposed over the substrate; and (iii) a second FinFET disposed over the substrate. The first FinFET includes a first semiconductor material having a first crystalline orientation, the second FinFET includes a second semiconductor material having a second crystalline orientation, and the first and second crystalline orientations are different.

In another aspect, the invention features a method for forming a structure, the method including providing a substrate having an insulator layer disposed thereon, and a first semiconductor layer disposed in contact with the insulator layer; and forming a FinFET on the substrate. The FinFET may be formed by (i) patterning the first semiconductor layer to define a source region, a drain region, and at least one fin disposed between the source and the drain regions, (ii) selectively depositing a second semiconductor layer over a top surface of at least one fin to form a bilayer, (iii) forming a gate dielectric layer, at least a portion of the gate dielectric layer being disposed over the fin, and (iv) forming a gate over the gate dielectric layer portion disposed over the fin.

In another aspect, the invention features a method for forming a structure, the method including providing a substrate having a crystalline oxide layer disposed thereon, and a first semiconductor layer disposed in contact with the crystalline oxide layer; and forming a FinFET on the substrate. The FinFET is formed by (i) patterning the first semiconductor layer to define a source region, a drain region, and at least one fin disposed between the source and the drain regions, (ii) forming a gate dielectric layer, at least a portion of the gate dielectric layer being disposed over the fin, and (iii) forming a gate over the gate dielectric layer portion disposed over the fin.

In another aspect, the invention features a method for forming a structure, the method including (i) providing a substrate having a first semiconductor layer disposed thereon; (ii) defining a fin in the first semiconductor layer, the fin having an aspect ratio; and (iii) removing top portion of the fin, and thereafter selectively depositing a second semiconductor layer over the top portion of the fin so as to preserve the aspect ratio of the fin.

Like-referenced features represent common features in corresponding drawings.

DETAILED DESCRIPTION

Figure 1:
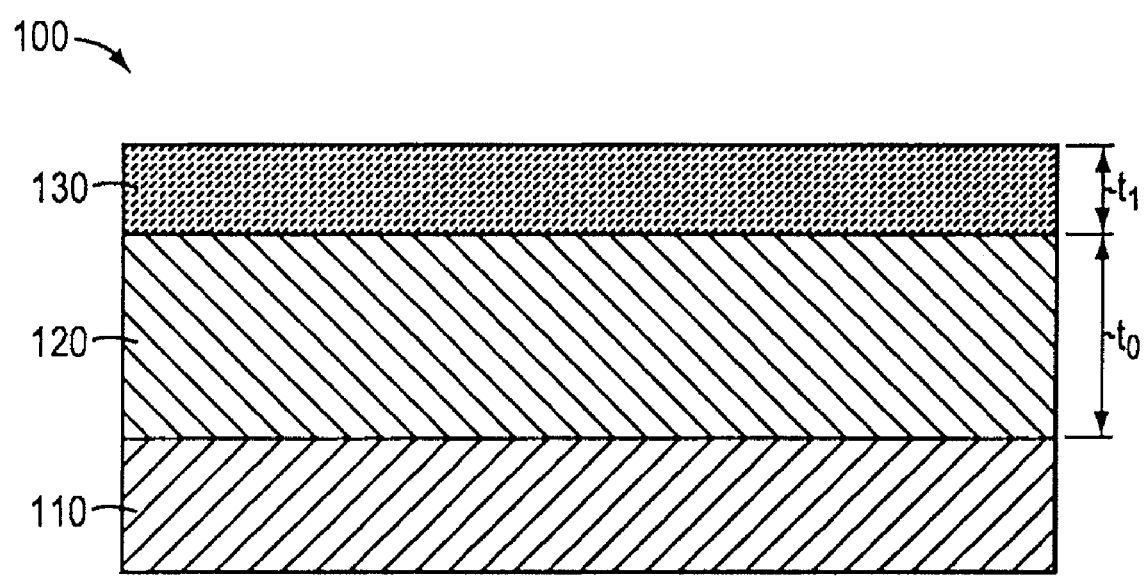
FIGS. 1-15 are a series of schematic cross-sectional views of several alternative semiconductor structure illustrating processes for fabricating the structures.

Referring to FIG. 1, a semiconductor-on-insulator substrate (SOI) 100 includes a semiconductor substrate 110 that itself includes or consists of a semiconductor material, such as silicon, germanium, SiGe, silicon carbide, gallium arsenide, indium phosphide, and/or gallium nitride. An insulator layer 120, e.g., a continuous buried insulating layer, is disposed over the semiconductor substrate 110. Insulator layer 120 may include or consist of, for example, silicon dioxide ($SiO_2$), silicon nitride ($Si_3N_4$ or other compositions), aluminum oxide, magnesium oxide, and/or other dielectric materials, or may be a multilayer structure including one or more different materials. The insulator layer 120 may have a thickness $t_0$ of, e.g., 50-200 nanometers (nm). For highly scaled devices, e.g., devices with gate lengths shorter than 100 nm, the insulator layer 120 may be relatively thin, i.e., have a thickness to of, e.g., 10-50 nm for better control of short channel effects. In an embodiment, SOI substrate 100 may include a single insulating substrate (not shown), rather than the combination of semiconductor substrate 110 and insulator layer 120. The single insulating substrate may be formed from an insulating material such as $SiO_2$, silicon nitride, glass, aluminum oxide, an organic polymer, plastic, or some combination of materials.

The SOI substrate may be a commercially available substrate that may be obtained from, e.g., SOITEC Silicon on Insulator Technologies of Bernin, France.

A first semiconductor layer 130 is disposed over the insulator layer 120. The first semiconductor layer 130 may include or consist of a first semiconductor material suitable for use as a channel of a MOSFET, such as at least one of a group IV material, e.g., silicon, SiGe, germanium, or an array of carbon nanotubes; a III-V material such as gallium arsenide, indium arsenide, indium gallium arsenide, indium phosphide, gallium nitride, indium antimonide, gallium antimonide, gallium phosphide; or a II-VI material, and mixtures or alloys including one or more of the aforementioned materials. The first semiconductor layer 130 may be strained, including tensilely or compressively strained, e.g., tensilely or compressively strained silicon. In some embodiments, the first semiconductor layer 130 may include approximately 100% Ge, and may be compressively strained. The first semiconductor layer 130 may have an initial thickness $t_1$ of, e.g., 1-50 nm, more preferably 1-20 nm for fully depleted devices, most preferably 1-10 nm or even 1-5 nm.

The first semiconductor layer 130 may initially be formed on a handle wafer (not shown) and then bonded to the insulator layer 120. For example, a handle wafer may include a $Si_{1-x}Ge_x$ layer with x>0. A silicon layer formed over this $Si_{1-x}Ge_x$ layer will be tensilely strained, and remains tensilely strained after being bonded to the insulator layer 120 to form the first semiconductor layer 130. A germanium layer formed over this $Si_{1-x}Ge_x$ layer will be compressively strained, and remains compressively strained after being bonded to the insulator layer 120 to form the first semiconductor layer 130. Alternatively, strain in the first semiconductor layer may arise from mechanical deformation of the handle wafer or from thermal mismatch with the handle wafer. For example, the handle wafer may be mechanically biaxially or uniaxially strained by bending or heated to elevated temperature prior to bonding to insulator layer 120. After the handle wafer is removed, first semiconductor layer 130 will remain strained. See, for example, U.S. Ser. No. 10/456,103, filed Jun. 6, 2003, incorporated herein in its entirety.

A conductive layer (not pictured) may be disposed beneath insulator layer 120. This conductive layer may be used in subsequently formed devices as a ground plane or as a second gate in, e.g., in a planar double-gate transistor. This conductive layer may include the same material as may be used for a gate electrode, e.g., doped polycrystalline silicon, doped polycrystalline SiGe, Al, Ag, Bi, Cd, Fe, Ga, Hf, In, Mn, Nb, Y, Zr, Ni, Pt, Be, Ir, Te, Re, Rh, W, Mo, Co, Fe, Pd, Au, Ti, Cr, Cu, and doped or undoped alloys, or mixtures or multilayers thereof.

Figure 2:
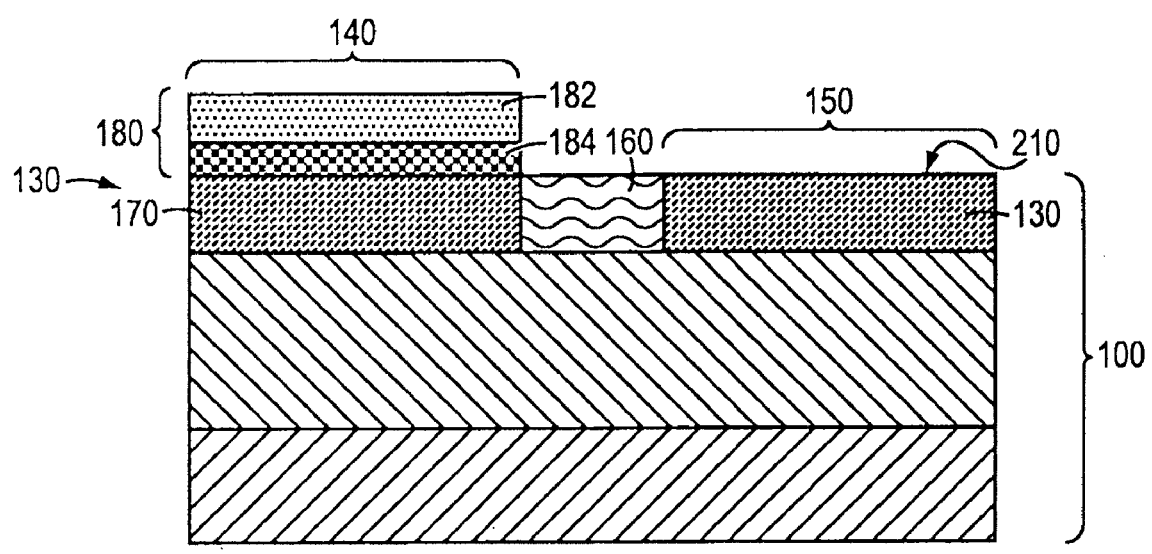

During device fabrication, a first portion 140 of the substrate 100 and a second portion 150 of the substrate 100 may be defined as shown in FIG. 2. The first and second substrate portions 140, 150 may be defined by, e.g., the formation of a shallow trench isolation (STI) region 160. The STI region 160 may be formed by methods known in the art, e.g., as described in co-pending U.S. Ser. No. 10/794,010, publication No. 2004/0173812 A1, incorporated by reference herein in its entirety.

A first MOSFET may be fabricated on the first portion 140 of the substrate 100 and a second MOSFET may be fabricated on the second portion 150 of the substrate 100 as follows. After STI 160 has been defined, a first portion 170 of the first semiconductor layer 130 disposed over the first portion of the substrate 100 may covered by a mask 180. The mask 180 may be formed from a masking material selected to be stable during the formation of a second layer comprising a second material over the second portion of the substrate. Moreover, the masking material is selected such that it may be selectively removed with respect to the second semiconductor layer, as described below. The masking material may include or consist of a dielectric material, such as silicon dioxide, silicon oxynitride, or silicon nitride.

In an embodiment, the first MOSFET is an nMOSFET and the second MOSFET may be a pMOSFET. In another embodiment, the first MOSFET is a pMOSFET and the second MOSFET may be an nMOSFET. In yet another embodiment, both the first and second MOSFETs are both nMOSFETs or pMOSFETs.

Mask 180 may be defined after the completion of STI formation. Alternatively, mask 180 may include masking material used to protect those regions of the first semiconductor layer that are not removed during STI formation; after STI formation, the masking material may be selectively removed from the second portion of the substrate where the pMOSFET will be formed, thereby exposing the portion of the first semiconductor layer disposed over the second portion of the substrate. Masking material used during STI formation may be, for example, a silicon nitride chemical-mechanical polishing (CMP) stop layer 182 disposed over a pad oxide layer 184.

Figure 3:
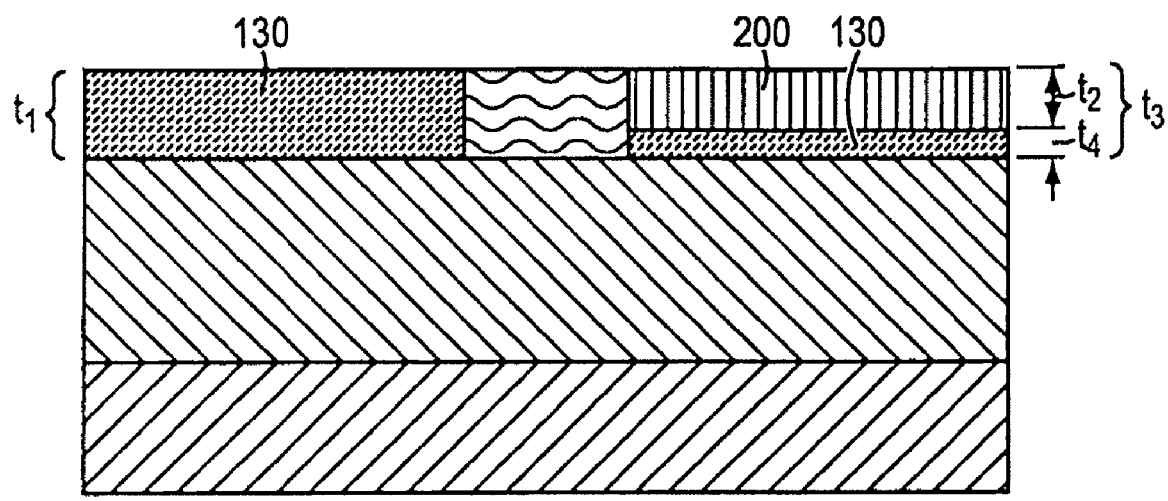

Referring to FIG. 2 as well as to FIG. 3, a second semiconductor layer 200 may be formed over an exposed surface of a second portion 210 of the first semiconductor layer 130 that is disposed over the second portion 150 of the substrate 100. The second semiconductor layer 200 may include or consist of a material suitable for use as a channel of a MOSFET, e.g., a group IV material such as silicon, SiGe, germanium, or an array of carbon nanotubes; a III-V material such as gallium arsenide, indium arsenide, indium gallium arsenide, indium phosphide, gallium nitride, indium antimonide, gallium antimonide, or gallium phosphide; and a II-VI material, or mixtures or alloys including one or more of the aforementioned materials. The second semiconductor layer 200 may be strained, including tensilely or compressively strained, e.g., tensilely or compressively strained silicon.

The second semiconductor layer 200 may be formed by a deposition process, such as chemical-vapor deposition (CVD) or atomic layer deposition (ALD). CVD includes the introduction of multiple reagents into a reactor simultaneously. ALD includes the sequential introduction of multiple reagents into a reactor, including, but not limited to, atomic layer epitaxy, digital chemical vapor deposition, pulsed chemical vapor deposition, and other like methods.

A thickness $t_2$ of the second semiconductor layer 200 may be selected to be thick enough to enable carrier conduction, e.g., in the channel of a subsequently formed transistor, while preferably thin enough to support fully depleted device operation. The second semiconductor layer 200 may have a thickness $t_2$ of, e.g., 1-50 nm, more preferably 1-20 nm, most preferably 1-10 nm or even 1-5 nm for fully depleted devices.

In some embodiments, a total thickness $t_3$ of the first semiconductor layer 130 initial thickness $t_1$ and the second semiconductor layer thickness $t_2$ may be too great to allow fully depleted operation of devices formed on the second semiconductor layer 200. It may be advantageous, therefore, to reduce the initial thickness $t_1$ of at least that portion of the first semiconductor layer 130 disposed over the second portion 150 of the substrate, prior to the formation of the second semiconductor layer 200. The initial thickness $t_1$ of the first semiconductor layer 130 may be selectively reduced over the second portion 150 of the substrate by etching, e.g., by reactive ion etching (RIE) or by an in-situ etch prior to deposition in the deposition tool. For example, in an embodiment in which the first semiconductor layer 130 is silicon, the exposed portion 210 of the first semiconductor layer may be thinned in a chlorine-containing ambient including, e.g., hydrogen chloride or chlorine, to a reduced thickness $t_4$ of, e.g., 1-10 nm. The reduced thickness $t_4$ is thin enough such that the total thickness $t_3$ of reduced thickness $t_4$ and second semiconductor layer thickness $t_2$ will enable fully depleted device operation. The reduced thickness $t_4$ may be thick enough such that the remaining portion of the first semiconductor layer 130 does not agglomerate during subsequent thermal processing prior to and including the deposition of second semiconductor layer 200. Subsequently, the second semiconductor layer 200 may be deposited over the exposed portion 210 of the first semiconductor layer 130, such that the total thickness $t_3$ of the second semiconductor layer 200 and the thinned first semiconductor layer 130 is less than 50 nm, i.e., a sufficiently small thickness for the formation of fully depleted devices. In some embodiments, the total thickness $t_3$ of the reduced first semiconductor layer 130 thickness $t_4$ and the second semiconductor layer 200 thickness $t_2$ may be approximately the same as $t_1$, i.e., the initial thickness of the first semiconductor layer 130.

In practice, the total thickness $t_3$ of the first semiconductor layer 130 and the second semiconductor layer 200 is preferably 0.25 to 0.7 times a gate length of a transistor to be formed over the first and second semiconductor layers 130, 200. If the portion of the first semiconductor layer 130 disposed over the second portion of the substrate is completely removed, the thickness $t_2$ of the second semiconductor layer 200 may be 0.25 to 0.7 times a gate length of a transistor formed solely over the second semiconductor layer 200. Similarly, in a transistor formed solely over the first semiconductor layer 130, the initial thickness $t_1$ of the first semiconductor layer preferably may be 0.25 to 0.7 times a gate length of that transistor. Selection of a semiconductor layer thickness in the range of 0.25 to 0.7 times a transistor gate length may be preferable for improved operation of the transistor, as this relationship between the semiconductor layer thickness and the transistor gate length may enable fully depleted behavior in the transistor.

In an embodiment, the first semiconductor layer 130 includes relaxed silicon. A compressively strained second semiconductor layer 200 may be formed by thinning the first semiconductor layer 130 and depositing the second semiconductor layer 200 such that the second semiconductor layer 200 includes compressively strained SiGe.

In another embodiment, the first semiconductor layer 130 includes strained silicon. To obtain a compressively strained second semiconductor layer 200, the first semiconductor layer 130 may be thinned and the second semiconductor layer 200 deposited, the second semiconductor layer 200 including compressively strained $Si_{1-x}Ge_x$ material having a Ge content x greater than that of the $Si_{1-x}Ge_x$ of a handle wafer over which the first semiconductor layer 130 has been formed.

More generally, a compressively strained second semiconductor layer 200 may be formed from a material having a relaxed lattice constant greater than the strained lattice constant to which the first semiconductor layer 130 is strained, i.e., the second semiconductor material may have a relaxed lattice constant greater than that of the handle wafer on which the first semiconductor layer has been formed (and which induced strain in the first semiconductor layer). The deposition of such a second semiconductor material on the tensilely strained first semiconductor layer will cause the second semiconductor layer 200 to be compressively strained to the same lattice constant to which the first semiconductor layer 130 is strained.

As an example, consider the lattice constants of three different materials. The lattice constant of relaxed silicon is less than the lattice constant of relaxed $Si_{0.5}Ge_{0.5}$, which is less than the lattice constant of relaxed germanium. Strained silicon grown on relaxed $Si_{0.5}Ge_{0.5}$ will have a lattice constant of the relaxed $Si_{0.5}Ge_{0.5}$ and will be tensilely strained. Strained germanium grown on relaxed $Si_{0.5}Ge_{0.5}$ will also have the lattice constant of the relaxed $Si_{0.5}Ge_{0.5}$, but will be compressively strained. Therefore, if the first semiconductor layer is substantially 100% strained silicon with the lattice constant of relaxed $Si_{0.5}Ge_{0.5}$, the second semiconductor layer, in order to be compressively strained, has a lattice constant greater than that of relaxed $Si_{0.5}Ge_{0.5}$.

In an alternative embodiment, the first semiconductor layer 130 may be a compressively strained germanium layer suitable for the formation of a pMOSFET. Then, the first semiconductor layer 130 may be thinned over a first portion 140 of the substrate 100 over which an nMOSFET will be formed. The second semiconductor material may include a material suitable for use as the channel of an nMOSFET, such as a group IV material, e.g., silicon, SiGe, germanium, or an array of carbon nanotubes; a III-V material such as gallium arsenide, indium arsenide, indium gallium arsenide, indium phosphide, gallium nitride, indium antimonide, gallium antimonide, or gallium phosphide; or a II-VI material, and mixtures or alloys including one or more of the aforementioned materials.

Figure 4:
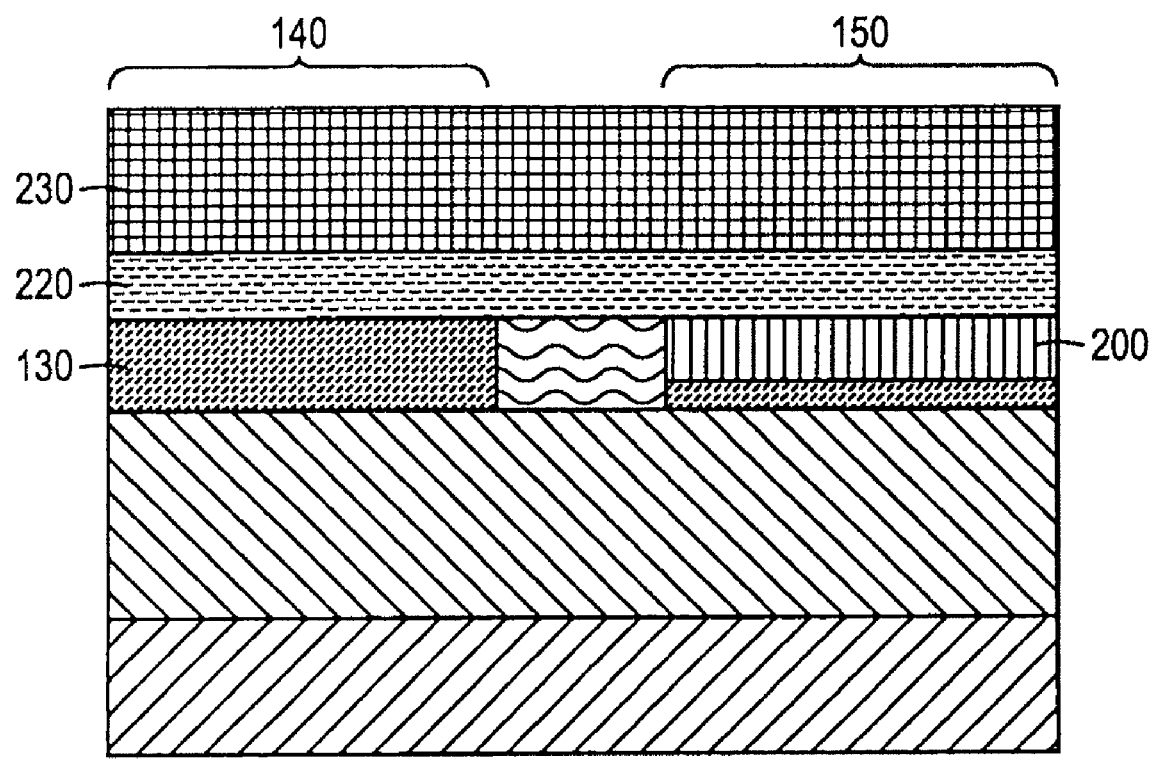

Referring to FIG. 4, a gate dielectric layer 220 may be formed over the first and second semiconductor layers 130, 200 by, e.g., deposition or growth. The gate dielectric layer 220 may be formed by one or more of a number of techniques, such as molecular beam epitaxy (MBE), oxidation, nitridation, CVD, ALD, or a combination of these or other methods. The gate dielectric layer may include or consist of a dielectric material such as, for example, silicon dioxide ($SiO_2$), silicon oxynitride ($SiO_xN_y$), silicon nitride ($Si_3N_4$ or other compositions), barium oxide (BaO), strontium oxide (SrO), calcium oxide (CaO), tantalum oxide ($Ta_2O_5$), titanium oxide ($TiO_2$), zirconium oxide ($ZrO_2$), hafnium oxide ($HfO_2$), aluminum oxide ($Al_2O_3$), lanthanum oxide ($La_2O_3$), yttrium oxide ($Y_2O_3$), yttrium aluminate, lanthanum aluminate, lanthanum silicate, yttrium silicate, hafnium silicate, zirconium silicate, and doped or undoped alloys, mixtures or multilayers, thereof.

Alternatively, the first and second gate dielectric layers may include first and second dielectric materials that are identical or substantially similar. Essentially, a single gate dielectric layer 220 may be utilized over the first and second substrate regions 140, 150.

A gate electrode layer 230 may be formed over the gate dielectric layer by, e.g., CVD or ALD, and subsequently patterned to define a gate. The gate electrode layer 230 may include or consist of a suitably conductive material such as, for example, doped polysilicon, doped polycrystalline SiGe, Al, Ag, Bi, Cd, Fe, Ga, Hf, In, Mn, Nb, Y, Zr, Ni, Pt, Be, Ir, Te, Re, Rh, W, Mo, Co, Fe, Pd, Au, Ti, Cr, Cu, and doped or undoped alloys, mixtures or multilayers thereof. Gate electrode layers of different materials and/or compositions may be utilized over the first and second substrate regions 140, 150, i.e., a first electrode layer including a first conductive material may be formed over the first substrate region 140, a second electrode layer including a second conductive material may be formed over the second substrate region 150, and the first and second conductive materials may be substantially different.

Alternatively, the first gate electrode layer may include a first conductive material, the second gate dielectric layer may include a second conductive material, and the first and second conductive materials may be identical or substantially similar. Essentially, a single gate electrode layer 230 may be utilized over both first and second substrate regions.

The use of two different channel materials may facilitate the use of a single midgap metal gate for nMOSFET and pMOSFET devices, e.g., a gate electrode having a workfunction between that of $n^+$ polysilicon (approximately 4.2 eV) and $p^+$ polysilicon (approximately 5.2 eV) and preferably approximately 4.4-4.9 eV, such as titanium nitride (TiN), tantalum nitride (TaN), tantalum silicon nitride (TaSiN), tungsten (W), molybdenum (Mo), titanium (Ti), tantalum (Ta), polycrystalline carbon (C), or silicides of nickel or other metals (e.g., NiSi), thus making device fabrication less complex in comparison to the use of two different gate electrodes.

Figure 5:
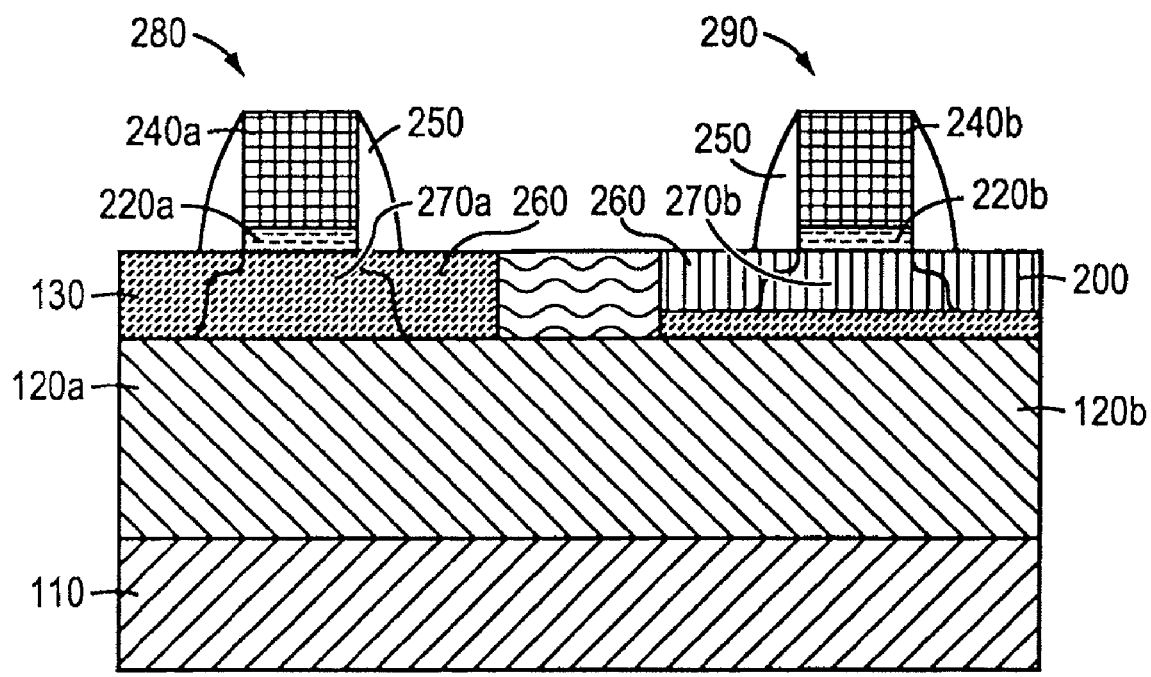

Portions of the gate electrode layer 230 and gate dielectric layer 220 may be removed as shown in FIGS. 4 and 5 by, e.g., etching to define first and second gate electrodes 240a, 240b disposed over the first and second semiconductor layers 130, 200, respectively. Sidewall spacers 250 may be defined proximate the gate electrodes 240a, 240b. Source and drain regions 260 may be formed for nMOSFET and pMOSFET devices by, e.g., implanting or diffusing appropriate dopants proximate the gate electrodes 240a, 240b, as is known in the art.

The source and drain regions 260 may also include a semiconductor material (which may be different from the semiconductor material disposed in nMOSFET channel 270a and pMOSFET channel 270b) defined in the first and second semiconductor layers 130, 200, respectively, beneath the gate electrodes 240a, 240b. Such a source/drain material may be formed by deposition(e.g., CVD or ALD), which may be preceded by an etch that removes at least some of the preexisting material present in the source and drain regions 260. The source/drain material may induce strain in the device channels 270a, 270b because of a difference in lattice constant and/or coefficient of thermal expansion between the source/drain material and the channel materials disposed beneath the gate electrodes 240a, 240b. The source/drain material may also serve to decrease series or contact resistance in the nMOSFET and pMOSFET devices. The source/drain material may also enable silicidation of the source and drain regions, as the initial thickness $t_1$ of first semiconductor layer 130 and/or thickness $t_3$ (the reduced thickness $t_4$ of the first semiconductor layer 130 in addition to thickness $t_2$ of second semiconductor layer 200) present in the source and drain regions may not be sufficient to enable formation of a low-resistivity silicide.

A self-aligned silicide (salicide) may be formed in source and drain regions 260 and optionally on top of first and second gate electrodes 240a, 240b as follows. A conductive layer is formed over the substrate 100. For example, a metal such as titanium, platinum, zirconium, cobalt, nickel, or alloys, mixtures, or multilayers thereof is deposited by, e.g., CVD or sputtering, with the conductive layer having a thickness of, e.g., 50-200 Å. In some embodiments, additional semiconductor material is formed over source and drains 260 regions, and optionally over the gate electrodes 240a, 240b, prior to the formation of the conductive layer, to define raised source and drain regions. An anneal is performed to react the conductive layer with source and drain regions 260 and optionally with tops of first and second gate electrodes 240a, 240b. Anneal parameters may be, for example, 400-800° C. for 1-120 seconds. Unreacted portions of the conductive layer disposed directly over insulator material, such as sidewall spacers 250, are removed by a chemical strip. A suitable chemical strip is a solution including $H_2SO_4:H_2O_2$ at a ratio of 3:1. A second anneal may be performed to further lower resistivity of the salicide. The second anneal parameters may be, for example, 600-900° C. for 1-120 seconds.

An nMOSFET 280 includes channel 270a disposed in a portion of the first semiconductor layer 130 over a first insulating material 120a, such that the nMOSFET channel 270a includes the first semiconductor material. A pMOSFET 290 includes channel 270b disposed in a portion of the second semiconductor layer 200 over a second insulating material 120b, such that the pMOSFET channel 270b includes the second semiconductor material. In some embodiments, insulator layer 120 including the first and second insulating materials is disposed across the semiconductor substrate 110, and the first and second insulating materials may be identical or substantially similar. In other embodiments, a first insulator layer including the first insulating material is disposed over a first portion of the semiconductor substrate 110, a second insulator layer including the second insulating material is disposed over a second portion of the semiconductor substrate 110, and the first and second insulating materials are substantially different. This embodiment is described in greater detail with respect to FIGS. 12-15.

The channels of the nMOSFET and pMOSFET may include one or more channel dopants, e.g., boron, arsenic, antimony, phosphorous, or indium. Such channel dopants may be of a type opposite the dopant type present in the source and drain regions of a particular device, and may influence control of the device threshold voltage. For example, the nMOSFET may include arsenic doping in the source and drain regions and boron in the channel region. These dopants may be present at a fairly low level, e.g., at a level less than $10^{16}$-$10^{17}$ cm$^{-3}$. In an embodiment, these channel dopants may be present at a level less than $10^{15}$ cm$^{-3}$.

In some embodiments, the nMOSFET and the pMOSFET devices 280, 290 have different gate dielectric compositions and/or different gate electrode compositions. This may be achieved by the utilization of gate dielectric layers of different materials and/or compositions over the first and second substrate regions 140, 150, i.e., a first dielectric layer 220a including a first dielectric material may be disposed over the first substrate region 140, a second dielectric layer 220b including a second dielectric material may be disposed over the second substrate region 150, and the first and second dielectric materials may be substantially different. Two different types of dielectric layers 220a, 220b and gate electrode layers may be formed by the use of a "dummy gate" process. Here, the nMOSFET and pMOSFET devices 280, 290 are formed as described above, with the use of single gate dielectric layer 220. After the formation of sidewall spacers 250, a thick oxide layer may be formed over the nMOSFET and pMOSFET devices 280, 290 and planarized by, e.g., CMP, to expose top portions of the first and second gate electrodes 240a, 240b. A mask may be formed over, e.g., the nMOSFET device 280 to protect the gate electrode 240a. The gate electrode 240b and the underlying gate dielectric material of the pMOSFET 290 may be removed by, e.g., a wet etch. A second gate dielectric layer 220b including a second dielectric material and a second gate electrode 240b may be defined for the pMOSFET 290. The second dielectric material may be substantially different from the first dielectric material. The second gate electrode material may be substantially different from the first gate electrode material. A second planarization step may be performed to remove residual materials such as masks, as well as portions of the second gate dielectric material and second gate electrode material that are not needed for the second gate dielectric layer and the second gate electrode. Finally, the thick oxide is removed by, e.g., a wet etch.

As used herein, a "fully depleted" SOI device is fully depleted between the channel and the underlying insulating layer when the gate voltage is equal to the device's threshold voltage. The region between the channel and the underlying insulating layer is considered to be fully depleted if it is substantially free of charge carriers. The nMOSFET may be fully depleted during operation, and the pMOSFET may be fully depleted during operation.

During device operation, both the nMOSFET and the pMOSFET may have similar body thicknesses, i.e., similar total thicknesses of layers disposed beneath the gate, and both device types may have carrier depletion regions beneath the respective channels that extend to the underlying insulator layer.

Partially depleted on-insulator devices may be formed over particular regions of the substrate by modification of the above technique. More specifically, the body thickness, i.e., the thickness of the first or second semiconductor layers, may be sufficiently increased for certain devices to allow partially depleted operation. As used herein, a "partially depleted" SOI device is not fully depleted between the channel and the underlying insulating layer when the gate voltage is equal to the device's threshold voltage. When a region is not fully depleted, it is not substantially free of charge carriers.

Figure 6:
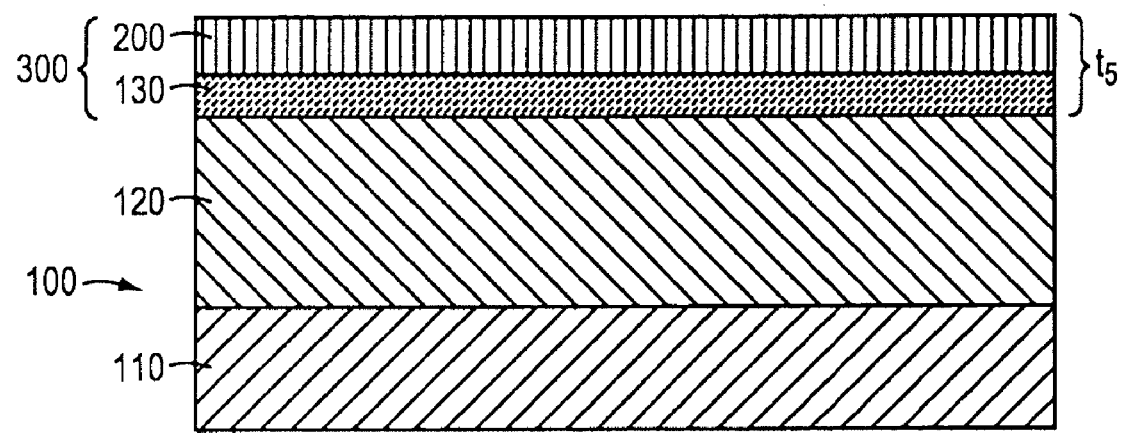

An alternative starting material may be used to form the semiconductor structure having a first material disposed over a first portion of the substrate and a second material disposed over a second portion of the substrate, as illustrated in FIG. 3. A bilayer semiconductor layer structure 300 may be formed over the insulator layer 120 disposed on substrate 110 as shown in FIG. 6. This bilayer 300 includes first semiconductor layer 130 and second semiconductor layer 200 disposed over the first semiconductor layer 130. The second semiconductor layer 200 may include any material particularly suitable for either nMOSFET or pMOSFET operation. For example, for use in a pMOSFET device, the bilayer structure may be thin, having a total thickness $t_5$ of, e.g., 1-50 nm. The second semiconductor layer 200 may be any material suitable for use as a channel of a pMOSFET and may include, e.g., unstrained or strained germanium. The second semiconductor layer 200 may constitute the majority of the thickness of the bilayer 300. The underlying first semiconductor layer 130 may include any material suitable for use as a channel of an nMOSFET, e.g., unstrained or strained silicon.

The presence of a thin first semiconductor layer under the second semiconductor layer in a pMOSFET will not disturb operation of the pMOSFET, and may serve as a template for epitaxial formation of a thicker regrowth layer including the first semiconductor material, as described below, for use as a channel of an nMOSFET.

Figure 7:
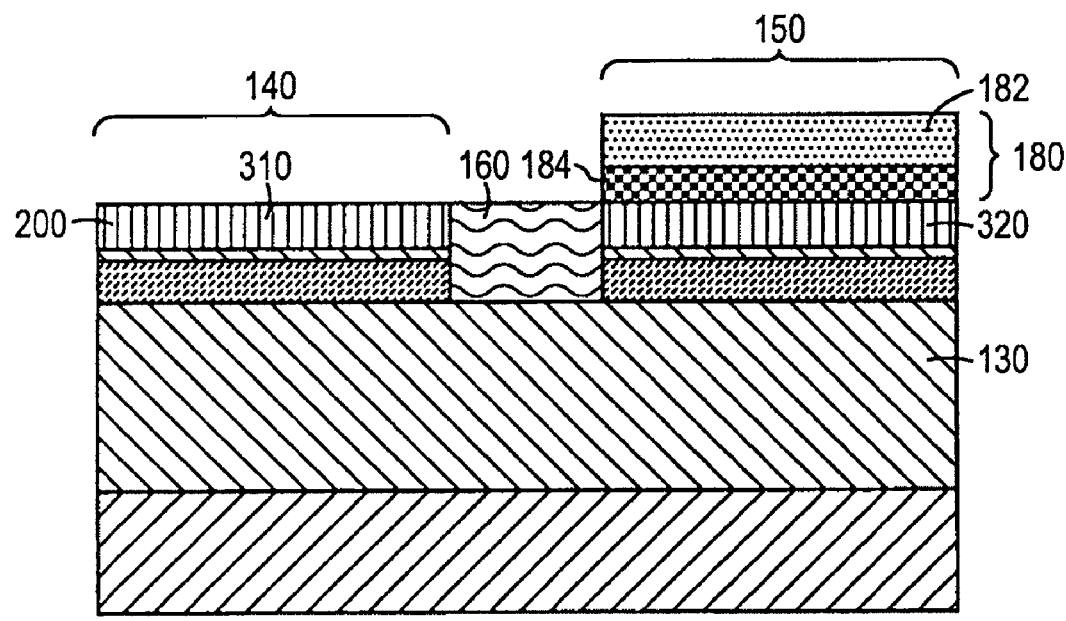

First and second portions 140, 150 of the substrate 100 may be defined as shown in FIG. 7 by, e.g., the formation of STI region 160, as described above with reference to FIG. 2.

After STI 160 has been defined, a first portion 310 of the second semiconductor layer 200 may be exposed while a second portion 320 of the second semiconductor layer 200 (disposed over the second portion 150 of the substrate 100) is covered by mask 180. The mask 180 may be formed from a masking material selected such that the material is stable during the removal of the first portion 310 of the second semiconductor layer 200 and the formation of a regrowth layer comprising a first material over the first portion 140 of the substrate 100. Moreover, the masking material is desirably selected such that it may be selectively removed with respect to the first semiconductor layer 130, as described below. The masking material may include a dielectric material, such as silicon dioxide, silicon oxynitride, or silicon nitride.

Mask 180 may be defined after the completion of STI 160 formation. Alternatively, mask 180 may include masking material used to protect those regions of the bilayer that are not removed during STI formation; after STI formation, the masking material may be selectively removed from the first portion of the substrate where the nMOSFET will be formed, thereby exposing the portion of the second semiconductor layer disposed over the first portion of the substrate. Masking material used during STI formation may be, for example, a silicon nitride CMP stop layer 182 disposed over pad oxide layer 184.

Figure 8A:
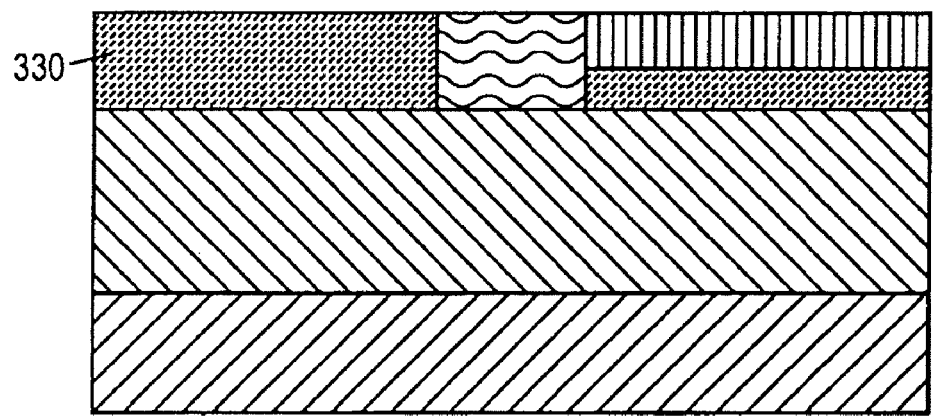

The exposed portion 310 of the second semiconductor layer 200 disposed over the first portion 140 of the substrate 100 may be removed as shown in FIGS. 7 and 8 by, e.g., RIE or by an in-situ etch prior to regrowth in the deposition tool. After the removal of the exposed second semiconductor layer portion 310, a first portion of the first layer 130 will be exposed. A regrowth layer 330 including the first material may be formed over the exposed first portion of the first layer 130, thus providing a single layer including the first material for subsequent use as a channel for an nMOSFET device.

After the regrowth of the first semiconductor layer, one obtains the same structure illustrated in FIG. 3. An nMOSFET may be formed over the first portion 140 of the substrate 100 and a pMOSFET may be formed over the second portion 150 of the substrate 100, as described above with reference to FIGS. 4 and 5.

In both embodiments, a final structure may include nMOSFET and pMOSFET devices, with each type of device having a channel of approximately the same thickness, one type having a single-layer channel and the other having a bilayer channel.

Figure 8B:
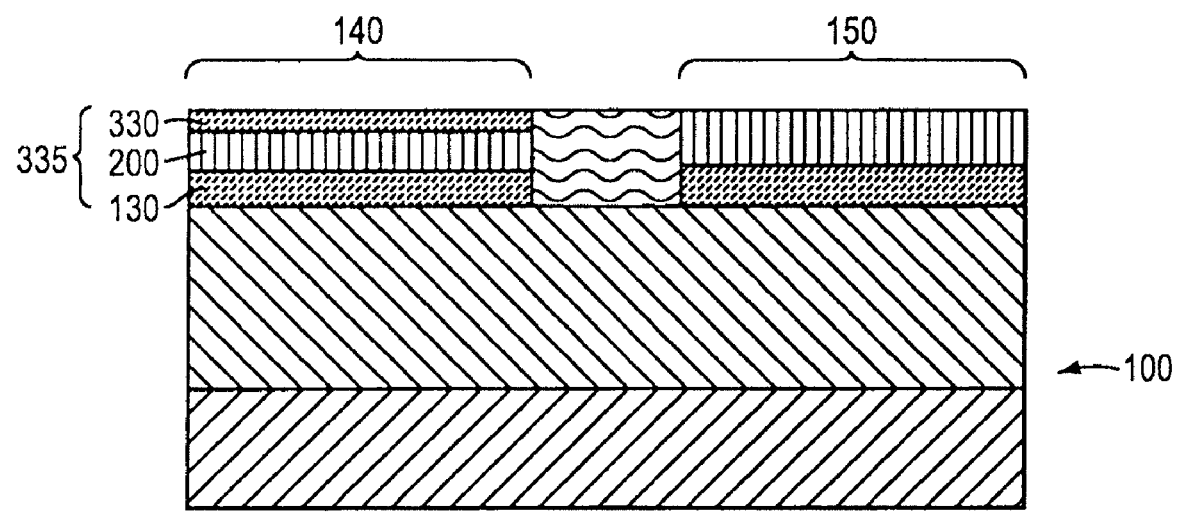

In an embodiment, regrowth layer 330 includes a semiconductor material included in first and second semiconductor layers 130, 200. In this case, deposition of regrowth layer 330 may result in first and second portions 140, 150 of substrate 100 both including bilayers being different combinations of materials. Referring to FIGS. 7 and 8B, in another embodiment, exposed second semiconductor layer portion 310 is not completely removed prior to deposition of regrowth layer 330. In this case, deposition of regrowth layer 330 in first portion 140 of substrate 100 may result in a trilayer structure 335 including a portion of first semiconductor layer 130, a portion of second semiconductor layer 200, and regrowth layer 330. A total thickness of this trilayer structure may be approximately the same as the thickness of the bilayer structure present in second portion 150 of substrate 100.

In an embodiment, after bilayer 300 or trilayer structure 335 is formed over first or second portions 140, 150 of substrate 100, an anneal is performed to interdiffuse the bilayer or trilayer structure. The anneal step may be performed at a range of suitable temperatures and times, e.g., 800-1100° C. for 1 second-1 hour. The anneal step causes the layers in the bilayer or trilayer to interdiffuse to form a single layer having a composition at least slightly different from the composition of the layers of the bilayer or trilayer structure. This may be desirable in order to eliminate sharp offsets in the band structure of the bilayer or trilayer structure that may affect device performance.

In an alternative embodiment, a crystalline epitaxial oxide layer disposed over semiconductor substrate selectively induces strain in first and second semiconductor layers disposed over the crystalline oxide layer.

Figure 9:
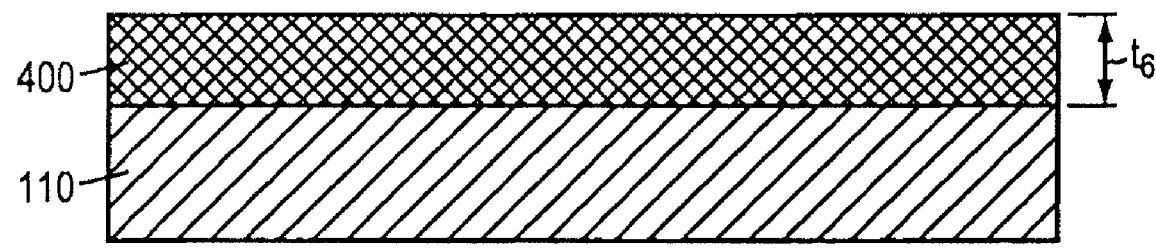

Referring to FIG. 9, a crystalline epitaxial oxide layer 400 is disposed over semiconductor substrate 110. The crystalline oxide layer 400 includes a material having a lattice parameter selected to exert an appropriate strain, both in terms of level and direction, on first and second semiconductor layers 130, 200.

For example, crystalline oxide layer 400 may include or consist of a material such as strontium titanate ($SrTiO_3$ or other compositions) or lanthanum aluminum oxide ($LaAlO_3$ or other compositions), having a lattice parameter approximately equal to that of $Si_{0.5}Ge_{0.5}$ that exerts a tensile strain on Si and a compressive strain on Ge. Therefore, a first semiconductor layer including or consisting of Si disposed on crystalline oxide layer 400 may be tensilely strained, and a second semiconductor layer including or consisting of Ge disposed on crystalline oxide layer 400 may be compressively strained.

The crystalline oxide layer 400 may include or consist of a multicomponent metal oxide such as a pervoskite-type oxide having the formula $ABO_3$ with B including at least one acid oxide containing a metal such as Al, Ti, Zr, Hf, V, Nb, Ta, Cr, Mo, W, or Cu, and A including at least one additional cation having a positive formal charge of from about 1 to about 3. Examples of such cations include cesium, strontium, barium, rubidium, yttrium, scandium, and lanthanum. Thus, examples of appropriate multicomponent metal oxides include but are not limited to: barium strontium titanate, barium strontium zirconate, barium strontium hafnate, lead titanate, yttrium aluminate, lanthanum aluminate, lead zirconium titanate, hafnium silicate, zirconium silicate, and rare earth-doped silicates.

Other examples of materials suitable for use as crystalline oxide layer 400 include metal silicate materials, such as strontium silicon oxide ($SrSiO_4$), zirconium silicon oxide ($ZrSiO_4$), and hafnium silicon oxide ($HfSiO_4$), hafnium oxide ($HfO_2$), zirconium oxide ($ZrO_2$), strontium titanate ($SrTiO_3$), lanthanum oxide ($La_2O_3$), yttrium oxide ($Y_2O_3$), titanium oxide ($TiO_2$), barium titanate ($BaTiO_3$), lanthanum aluminate ($LaAlO_3$), lanthanum scandium oxide ($LaScO_3$) and aluminum oxide ($Al_2O_3$).

Other options crystalline oxide layer 400 include any of several dielectric materials having lattice constants and structures similar to that of silicon. For example, cesium oxide ($CeO_2$), aluminum nitride (AlN) and lanthanum aluminum oxide ($LaAlO_3$) all have suitable lattice constants and crystalline structures.

Crystalline oxide layer 400 may be chosen to be deliberately lattice-mismatched to semiconductor substrate 110 to provide a lattice constant different therefrom for subsequent layer deposition. The crystalline oxide layer 400 material may be selected such that a major crystallographic plane of crystalline oxide layer 400 parallel to a surface of semiconductor substrate 110 differs from the crystallographic plane of that surface. This configuration may facilitate the desired lattice match or mismatch between crystalline oxide layer 400 and semiconductor substrate 110. For example, semiconductor substrate 110 may include silicon, SiGe, or germanium with a {100} surface, and crystalline oxide layer 400 may include an aforementioned material with a {200}, {110}, or {111} (i.e., not {100}) crystallographic plane parallel to the surface of semiconductor substrate 110. Such a combination may provide an effective in-plane lattice constant of crystalline oxide layer 400 suitable for lattice match or mismatch with semiconductor substrate 110 or subsequently deposited layers. This combination may also facilitate the formation of subsequently deposited layers, e.g., first and second semiconductor layers 130, 200, having a crystallographic orientation (i.e., surface crystallographic plane) different from a surface crystallographic orientation of semiconductor substrate 110 and/or having an in-plane rotation of the surface crystallographic plane different from that of semiconductor substrate 110. Such changes in crystalline orientation or rotation may result in enhanced carrier mobilities in devices subsequently fabricated on first and second semiconductor layers 130, 200.

Crystalline oxide layer 400 may have a single composition throughout its thickness. Alternatively, the composition of crystalline oxide layer 400 may vary throughout its thickness. For example, with a ternary oxide such as lanthanum aluminum oxide, the lanthanum content may gradually increase, thus increasing the lattice constant of the layer. Such grading of composition in crystalline oxide layer 400 may help prevent formation of defects due to lattice mismatch between crystalline oxide layer 400 and semiconductor substrate 110. Alternatively, crystalline oxide layer 400 may include multiple crystalline oxide layers, each having a different composition.

Crystalline oxide layer 400 may be formed by deposition, e.g., by CVD or ALD. The crystalline oxide layer 400 has a typical thickness $t_6$ of about 10-500 nm. Preferably, crystalline oxide 400 is thick enough to support subsequent deposition of first and second semiconductor layers 130, 200. Since many crystalline oxides have dielectric constants higher than that of silicon dioxide, a thick crystalline oxide 400 may be desirable to decrease capacitance.

In another embodiment, a thin amorphous layer (not shown) is formed on a top or a bottom surface of crystalline oxide 400 to prevent defect formation at an interface between crystalline oxide layer 400 and semiconductor substrate 110 or between the crystalline oxide layer and either of the first and second semiconductor layers 130, 200. The thin amorphous layer may include an oxide, e.g., $SiO_2$, $SiGeO_2$, and/or $GeO_2$. The thin amorphous layer may be formed by a thermal treatment after the formation of crystalline oxide 400, optionally in an ambient including oxygen.

Figure 10:
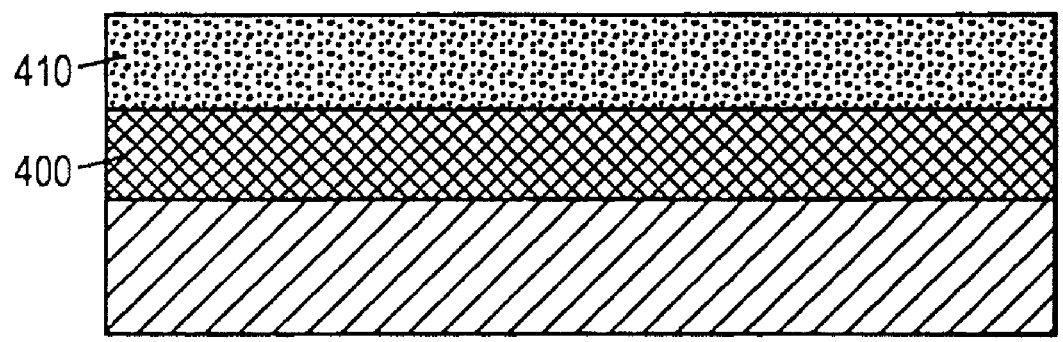

Referring to FIG. 10, in another embodiment, a capping layer 410 may be formed on a top surface of crystalline oxide 400. The capping layer 410 may protect the crystalline oxide layer 400 from various wet chemical treatments of the substrate prior to the formation of first and second semiconductor layers. If capping layer 410 includes a material that can be removed selectively with respect to the underlying crystalline oxide 400, e.g., silicon nitride or a semiconductor, crystalline oxide 400 can be protected during subsequent masking and mask removal steps, e.g., those steps described below.

Figure 11:
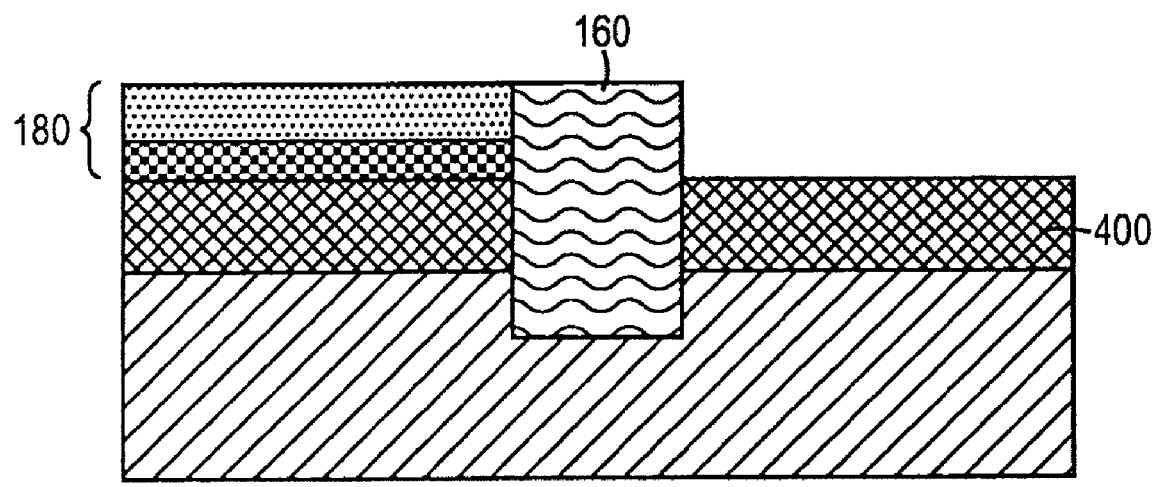
Figure 12:
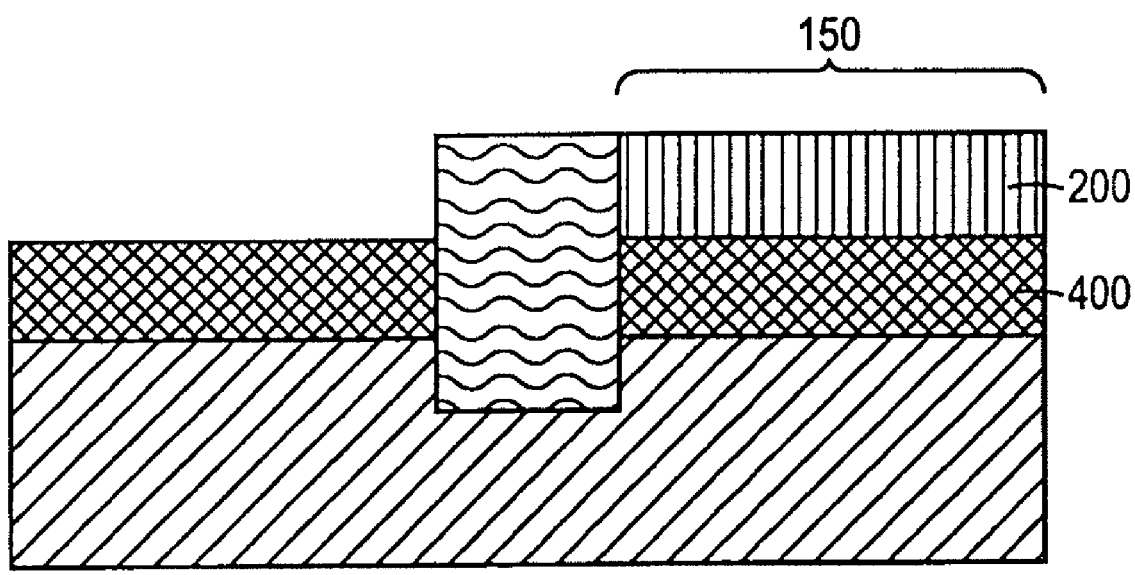
Figure 13:
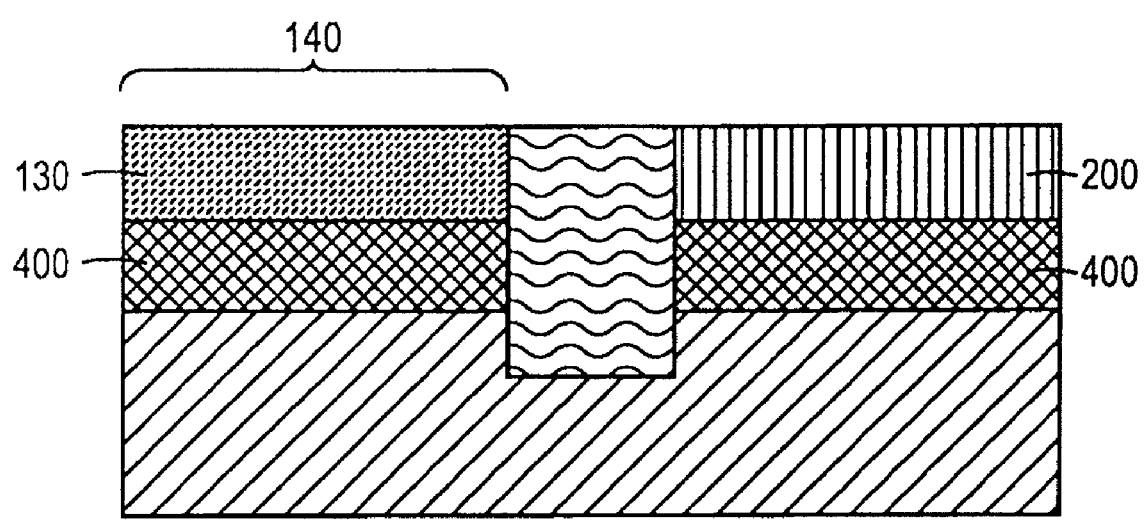

Referring to FIGS. 11-13, after the formation of crystalline oxide 400 and, optionally, capping layer 410, STI regions 160 may be defined with use of mask 180 as described above with reference to FIG. 2. Similarly, first semiconductor layer 130 may be defined over a region of the crystalline oxide layer disposed over the first portion 140 of the substrate and second semiconductor layer 200 may be defined over a region of crystalline oxide layer disposed over the second portion 150 of the substrate. First and second semiconductor layers 130, 200 may be chosen to be deliberately lattice-mismatched to the crystalline oxide layer 400 such that the semiconductor layers are under tensile or compressive strain. This strain may be biaxial in nature. In an embodiment, the lattice structure of crystalline oxide layer 400 is such that at least one of first and second semiconductor layers 130, 200 is primarily uniaxially strained in-plane.

Preferably, if optional capping layer 410 is initially disposed over the top surface of the crystalline oxide layer 400, then layer 410 is removed during the formation of first and second semiconductor layers 130, 200, e.g., by a wet or dry etch prior to deposition.

Subsequently, an nMOSFET may be formed, including a channel disposed in a portion of the first semiconductor layer 130 and a pMOSFET may be formed, including a channel disposed in a portion of the second semiconductor layer 200.

The embodiments described above include a continuous insulator layer disposed across a wafer. In some embodiments, the insulator layer may be discontinuous. Moreover, the insulator layer may include a first insulator layer including a first insulating material disposed over at least a first portion of the substrate and a second insulator layer including a second insulating material disposed over at least a second portion of the substrate. For example, different crystalline oxides may be formed selectively in NMOS and PMOS regions. An insulator layer such as $SiO_2$ may only be present below one or more device channel regions.

Figure 14A:
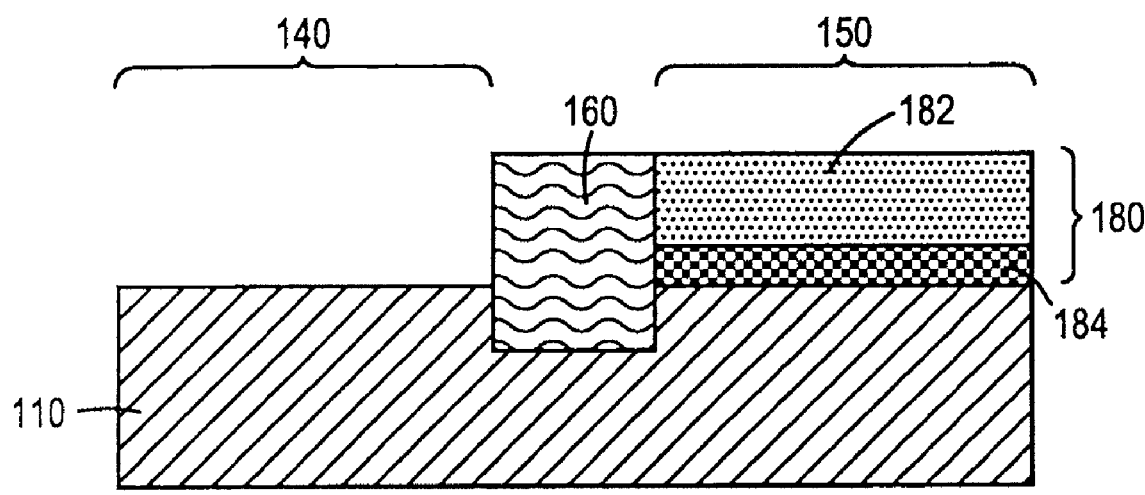

Referring to FIG. 14A, semiconductor substrate 110 may be used as a starting material. STI regions 160 extending into semiconductor substrate 110 may be defined as described above with reference to FIG. 2. After STI 160 is defined, the first portion 140 of the substrate 110 is exposed and the second portion 150 of the substrate is covered by mask 180, e.g., a mask defined after the completion of STI formation. Alternatively, mask 180 may include masking material used to protect those regions of the substrate 110 that are not exposed during STI formation; after STI formation, the masking material may be selectively removed from the first portion 140 of the substrate 110 where the nMOSFET will be formed, thereby exposing the first portion 140 of the substrate. Masking material used during STI formation may be, for example, silicon nitride CMP stop layer 182 disposed over pad oxide layer 184.

Figure 14B:
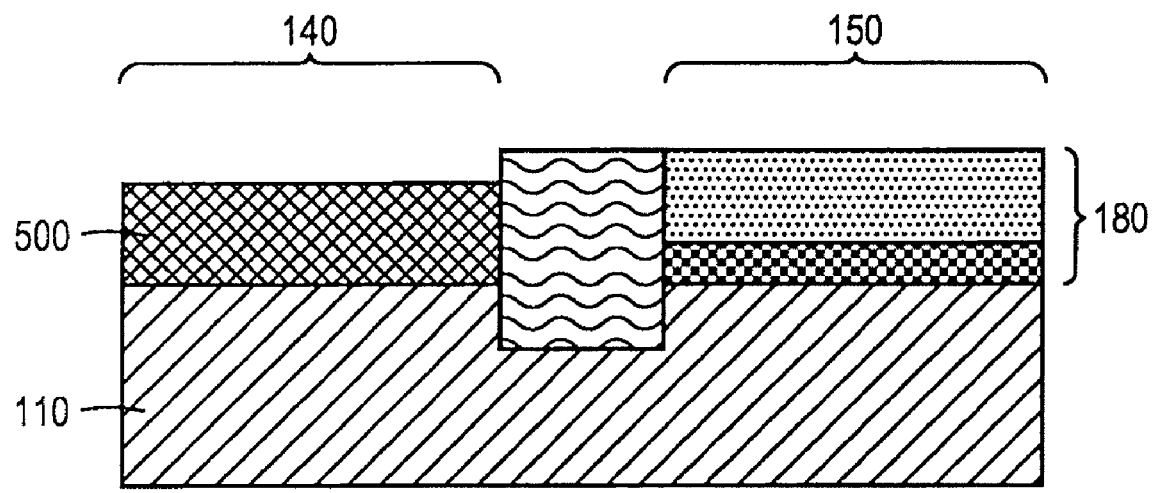

Referring to FIG. 14B, a first insulator layer 500 including a crystalline oxide material (and also referred to herein as "a first crystalline oxide layer") may be defined over the first portion 140 of substrate 110. The first insulator layer 500 may be formed by deposition, e.g., by CVD or ALD, or a similar technique. Typically, the crystalline oxide layer is not formed selectively; rather, it is formed over the first portion 140 of the substrate 110 as well as over the mask 180 disposed over the second portion 150 of the substrate 110. Therefore, it may be preferable to mask off a region of the first insulator layer 500 disposed over the first portion 140 of the substrate 110, prior to removal of the remainder of the crystalline oxide material and mask disposed over the second portion 150 of the substrate 110. Alternatively, the first insulator layer 500 and a capping nitride layer (not shown) may be deposited over substantially the entire substrate 110. Then a CMP step may be performed to remove the portions of the capping nitride layer and first insulator layer 500 disposed over the second portion 150 of the substrate 110, stopping at a surface of the mask 180 disposed over the second region 150. Any residual nitride from the capping layer remaining over both the first and second portions 140, 150 of the substrate 110 may then be removed. This process also results in the formation of first insulator layer 500 over the first portion 140 of the substrate 110.

Figure 14C:
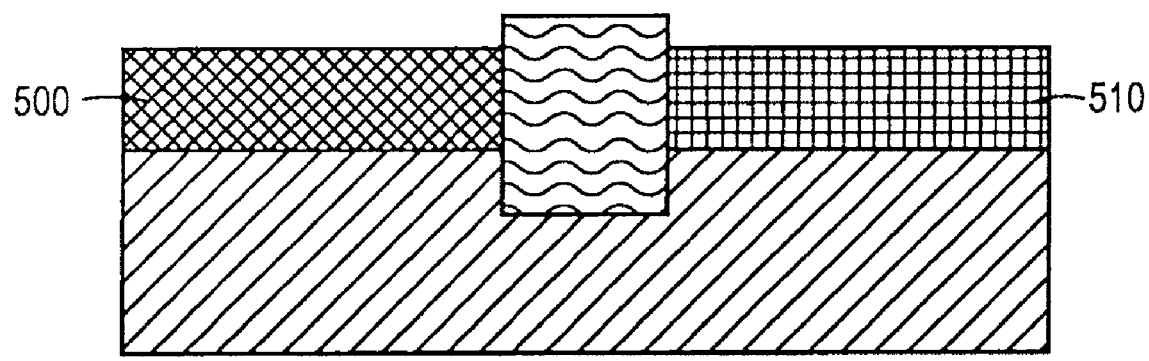

Referring to FIGS. 14B and 14C, after the formation of the first insulator layer 500, the mask 180 is removed, thereby exposing a top surface of the second portion 150 of the substrate. The mask 180 may be removed by, e.g., a wet etch. During the removal of the mask 180, a small portion of the STI 160 may also be removed, but not an amount sufficient to impact device performance. A second mask (not shown) is selectively formed over the first insulator layer 500, exposing the second portion 150 of the substrate. The second mask may include silicon nitride formed by, e.g., deposition, photolithography, and a wet or a dry etch. A second insulator layer 510, also referred to herein as "second crystalline oxide layer," may formed over the second portion of the substrate 110 by a deposition technique such as CVD or ALD. After the formation of the second insulator layer 510, the second mask may be removed by, e.g., a wet etch. The first and second insulator layers 500, 510 may include the same materials and have the same thicknesses as the crystalline oxide layer 400 described above with reference to FIG. 9.

Figure 15:
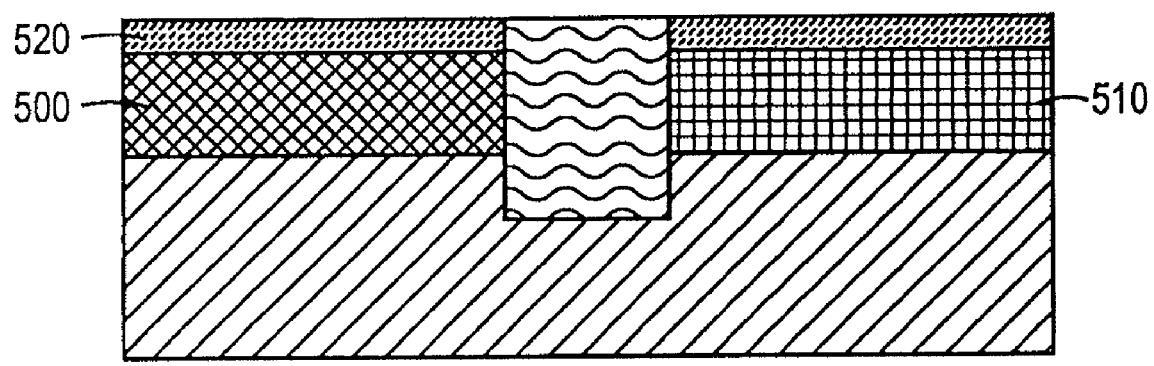

Referring to FIG. 15, a channel layer 520 may be formed over the first and second insulator layers 500, 510, as well as over STI region 160. A portion of the channel layer 520 disposed over the STI region 160 may be subsequently removed by, e.g., CMP. In an alternative embodiment, a first portion of the channel layer 520 is formed over the first insulator layer 500 after the formation of the first insulator layer and before the mask 180 is removed. Similarly, a second portion of the channel layer 520 is formed over the second insulator layer 510 after the formation of the second insulator layer and before the second mask is removed. The channel layer 520 may include a semiconductor material suitable for device channel formation, such as a group IV material, e.g., silicon, SiGe, germanium, or an array of carbon nanotubes; a III-V material such as gallium arsenide, indium arsenide, indium gallium arsenide, indium phosphide, gallium nitride, indium antimonide, gallium antimonide, gallium phosphide; or a II-VI material, and mixtures or alloys including one or more of the aforementioned materials.

In an embodiment, the channel layer 520 includes strained silicon. The first insulator layer 500 may include a material having a lattice constant larger than that of silicon, e.g., greater than 5.43 Å, resulting in the portion of the channel layer 520 disposed over the first insulator layer 500 to be tensilely strained, and thereby suitable for use as the channel material of an nMOSFET. The second insulator layer 510 may include a material having a lattice constant smaller than that of silicon, e.g., less than 5.43 Å, resulting in the portion of the channel layer 520 disposed over the second insulator layer 510 to be compressively strained, and thereby suitable for use as the channel material of a pMOSFET.

In an embodiment, a first portion of the channel layer 520 disposed over the first substrate portion 140 differs from a second portion of the channel layer 520 disposed over the second substrate portion 150. Different combinations of channel and crystalline oxide materials may result in improved device performance in different regions of the substrate.

In an embodiment, the use of different crystalline oxide materials in first and second substrate portion 140, 150 facilitates the deposition of channel layers thereover that have crystalline orientations or in-plane rotations different from each other, as discussed previously with reference to FIG. 15. The crystalline orientation and/or rotation for channel layer 520 may be different in first and second substrate portions 140, 150. Likewise, if different channel materials are used in each substrate portion 140, 150, the different channel materials may have different orientations and/or in-plane orientations. In an embodiment, the nMOSFET channel layer in first substrate portion 140 has a surface crystalline orientation defined by any of the {100} family of crystallographic planes, and the pMOSFET channel layer in second substrate portion 150 has a surface crystalline orientation defined by any of the {110} family of crystallographic planes. In another embodiment, the in-plane rotation of the nMOSFET channel material in substrate portion 140 is such that the nMOSFET channel is parallel to any of the <110> family of crystallographic directions, and the in-plane rotation of the pMOSFET channel material in substrate portion 150 is such that the pMOSFET channel is parallel to any of the <100> family of crystallographic directions.

This method of providing devices including channel materials of crystalline orientations and/or rotations different from each other may be superior to other methods in which regions of different orientations are provided prior to device fabrication. This method provides self-aligned channel materials of different crystalline orientations and/or rotations, i.e., only in desired regions bound by device isolation structures. Additionally, this method enables the fabrication of device channel layers of virtually any crystalline orientation or rotation, the choice of which is not bound by and does not necessarily relate to a crystalline orientation or rotation of an underlying substrate or of a handle wafer from which the layers may have been bonded. This method may also be used to provide channel layers of arbitrary crystalline orientation and/or rotation disposed over insulator layers.

Subsequently, an nMOSFET may be formed, including a channel disposed in a portion of the channel layer 520 disposed over the first insulator layer 500, and a pMOSFET may be formed, including a channel disposed in a portion of the channel layer 520 disposed over the second insulator layer 510.

The bilayer-on-insulator constructions described above and illustrated in, e.g., FIG. 6, may give favorable carrier transport behavior for FinFET-type devices, e.g., omega FETs, tri-gate FETs, etc. FinFETs typically have gates that wrap around a channel on at least two sides of a vertically oriented channel, allowing greater control of channel charge than in a single gate device. This configuration also has the potential to translate to higher drive current and lower stand-by leakage current. Devices related to the FinFET, such as the wrap-around gate FET (gate on both sides of as well as above the channel), allow even more channel charge control and hence even more potential for improved drive current and leakage current performance.

Figure 16:
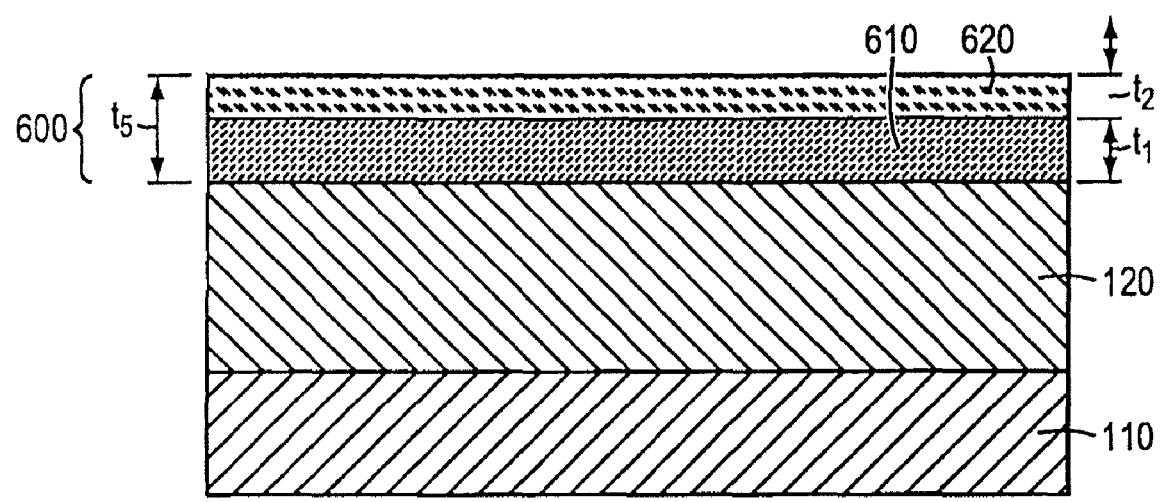
FIGS. 16-33C are schematic cross-sectional and top views of substrates illustrating a method for fabricating a FinFET.

Referring to FIG. 16, in an embodiment, a FinFET may be defined as follows. A bilayer 600 is formed by deposition of two semiconductor layers over insulator layer 120, as described above with reference to FIGS. 1-3 and 6-8. The bilayer includes first semiconductor layer 610 disposed over the insulator layer 120 and second semiconductor layer 620 disposed over the first semiconductor layer 610. Both the first and second semiconductor layers 610, 620 may be biaxially strained. The first semiconductor layer 610 may be, e.g., biaxially tensilely strained, i.e., tensilely strained in a plane parallel to a top surface of the first semiconductor layer 610 and compressively strained in a plane perpendicular to the first semiconductor layer top surface. The second semiconductor layer 620 may be, e.g., biaxially compressively strained, i.e., compressively strained in a plane parallel to a top surface of the second semiconductor layer 620 and tensilely strained in a plane perpendicular to the second semiconductor layer top surface. In an alternative embodiment, either of the first semiconductor and second semiconductor layers 610, 620 is uniaxially strained.

Figure 17A:
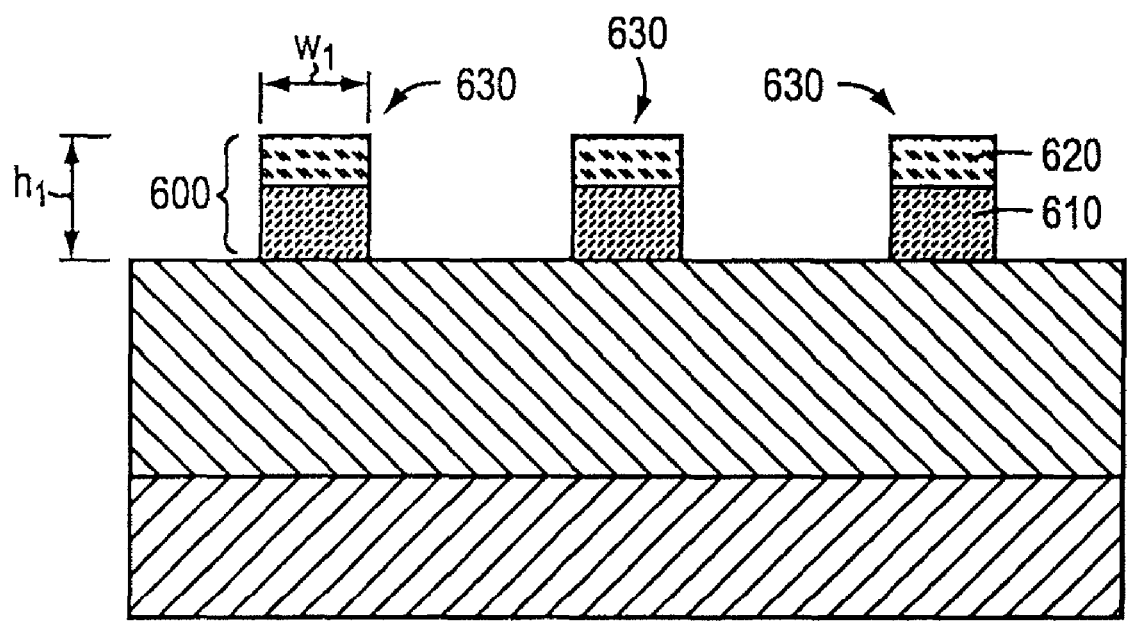
Figure 17B:
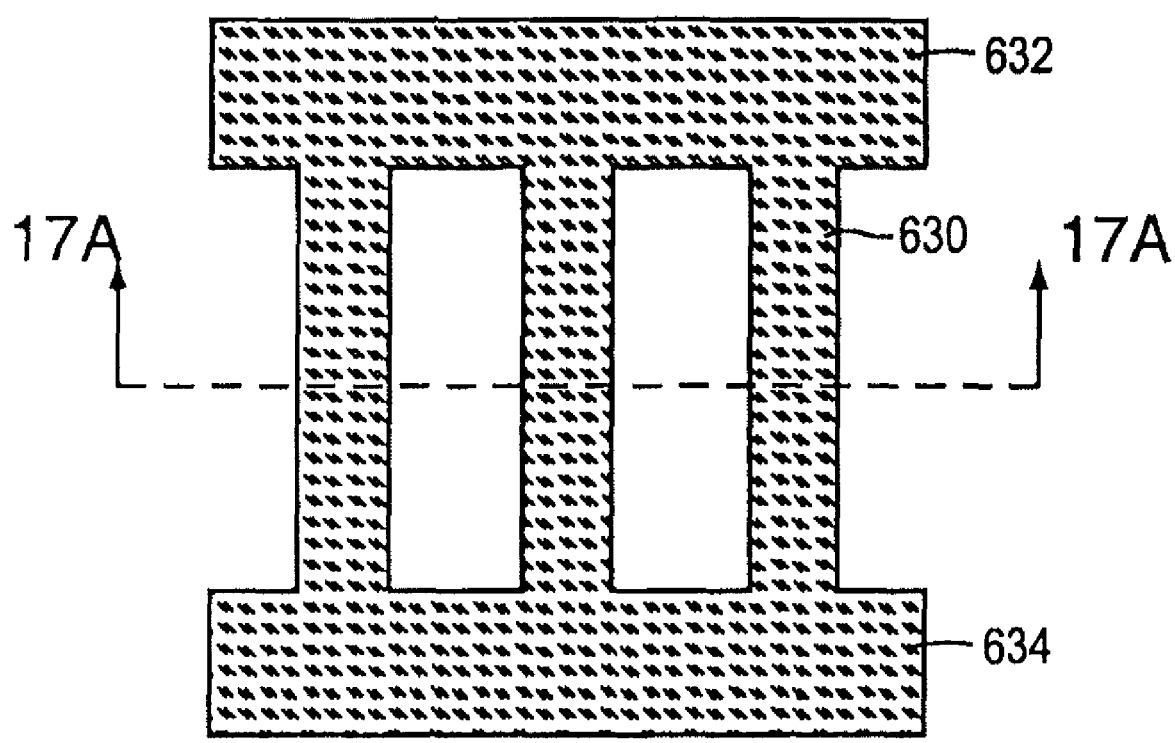

Referring to FIGS. 17A and 17B as well as to FIG. 16, the first semiconductor layer 610 may be thicker than the second semiconductor layer 620 such that the sidewall of a fin 630 defined from the bilayer 600 is primarily formed from first semiconductor layer 610. For example, the first semiconductor layer 610 may have a thickness $t_1$ of 40-400 Å and the second semiconductor layer 620 may have a thickness $t_2$ of 10-100 Å. Thus, the bilayer 600 may have a total thickness $t_5$ of, e.g., 50-500 Å.

The bilayer 600 may be patterned to define a plurality of fins 630. In particular, fins 630 may be defined by the formation of a photolithographic mask (not shown) over the bilayer 600, followed by anisotropic RIE of the bilayer 600. Fins 630 may have a width $w_1$ of, e.g., 50-300 Å, and a height hi approximately equal to a thickness of the bilayer, e.g., 50-500 Å. The photomask/RIE steps also define source mesa region 632 and drain mesa region 634. Fins 630, source mesa region 632, and drain mesa region 634 include portions of the bilayer 600 not removed by RIE. The photolithographic mask is removed after the RIE of the bilayer 600.

Figure 18:
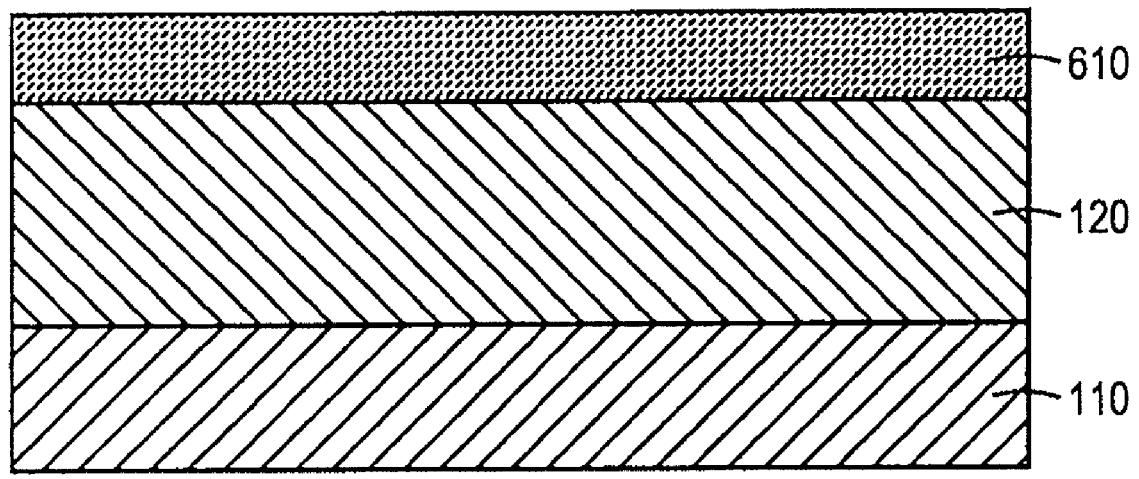

Referring to FIG. 18, in another embodiment, fins may be formed by an alternative fabrication method. A single strained semiconductor layer is disposed over the insulator layer 120 and substrate 110. For example, the starting material may include a strained-semiconductor-on-insulator (SSOI) wafer, with first semiconductor layer 610 disposed over the insulator layer 120. The first semiconductor layer 610 may be bonded to the insulator layer 120. Alternatively, the insulator layer 120 may include a crystalline oxide, and the first semiconductor layer 610 may be deposited over the insulator layer.

The first semiconductor layer 610 may be substantially unstrained, or tensilely or compressively strained.

Figure 19:
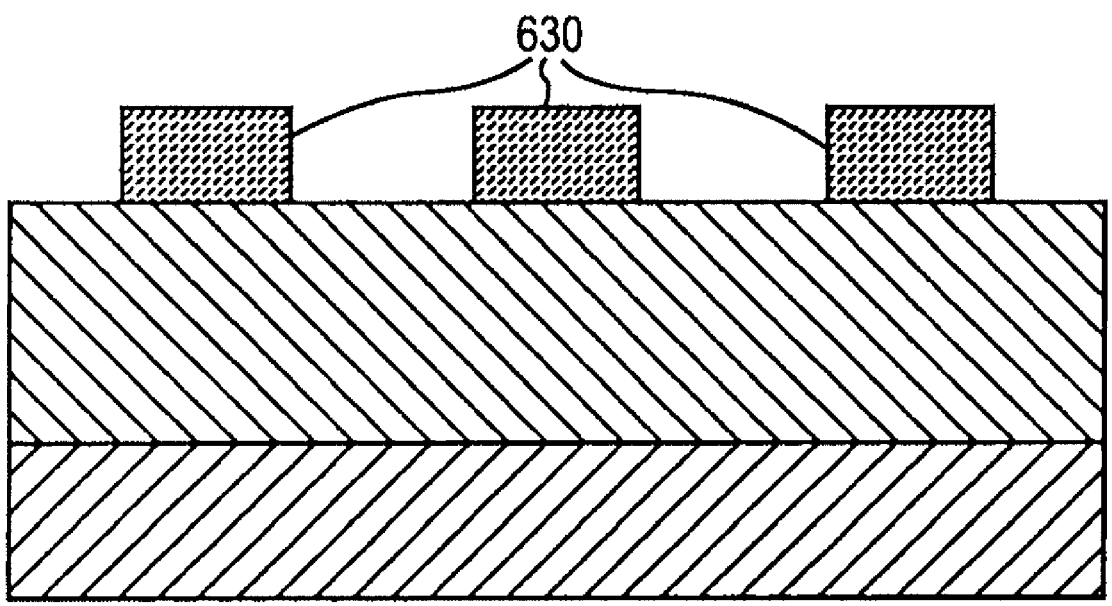

Referring to FIG. 19, the first semiconductor layer 610 is patterned to define a plurality of fins 630. The fins 630 may be defined by the formation of a photolithographic mask (not shown) over the first semiconductor layer 610, followed by anisotropic RIE of the first semiconductor layer 610. The fins 630 may have a width $w_1$ of, e.g., 50-300 Å, and an initial height approximately equal to a thickness of the first semiconductor layer, e.g., 50-500 Å.

Figure 20:
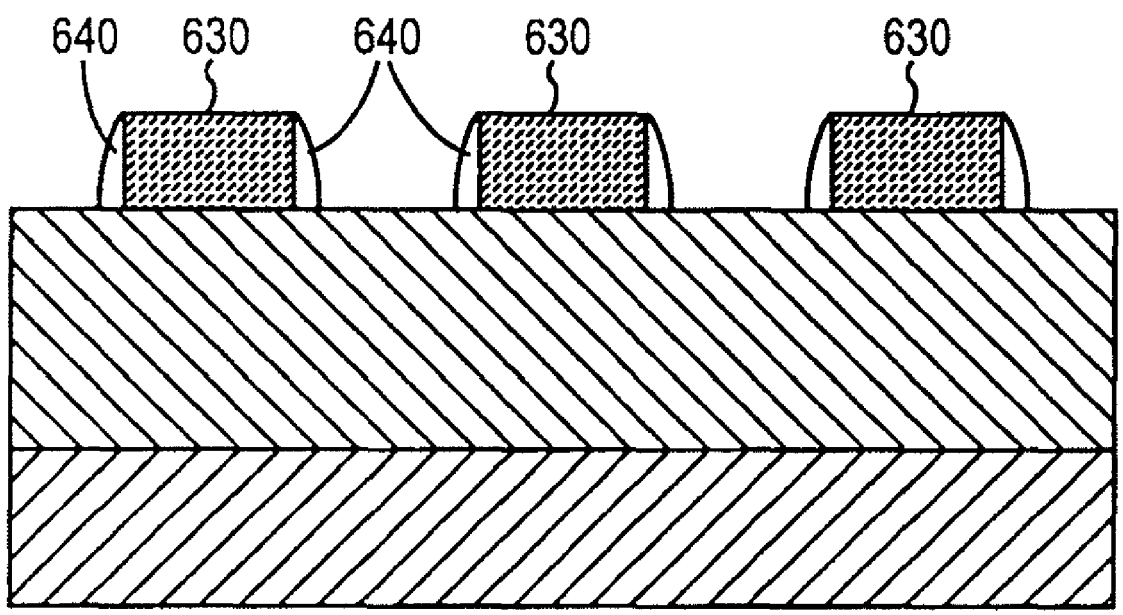

Referring to FIG. 20, a plurality of sidewall spacers 640 may be formed proximate sidewalls of the fins 630 as follows. A thin conformal insulator layer is deposited over the fins 630 and exposed portions of the insulator layer 120 between the fins. The conformal insulator layer may be, for example, silicon dioxide or silicon nitride, formed by, e.g., CVD, and may have a thickness of, e.g., 100-1000 Å. The sidewall spacers 640 is defined by the removal of portions of the conformal insulator layer by, e.g., an anisotropic dry etch, such that the remaining portions of the conformal insulator layer (which define spacers proximate the fin sidewalls) remain.

Figure 21:
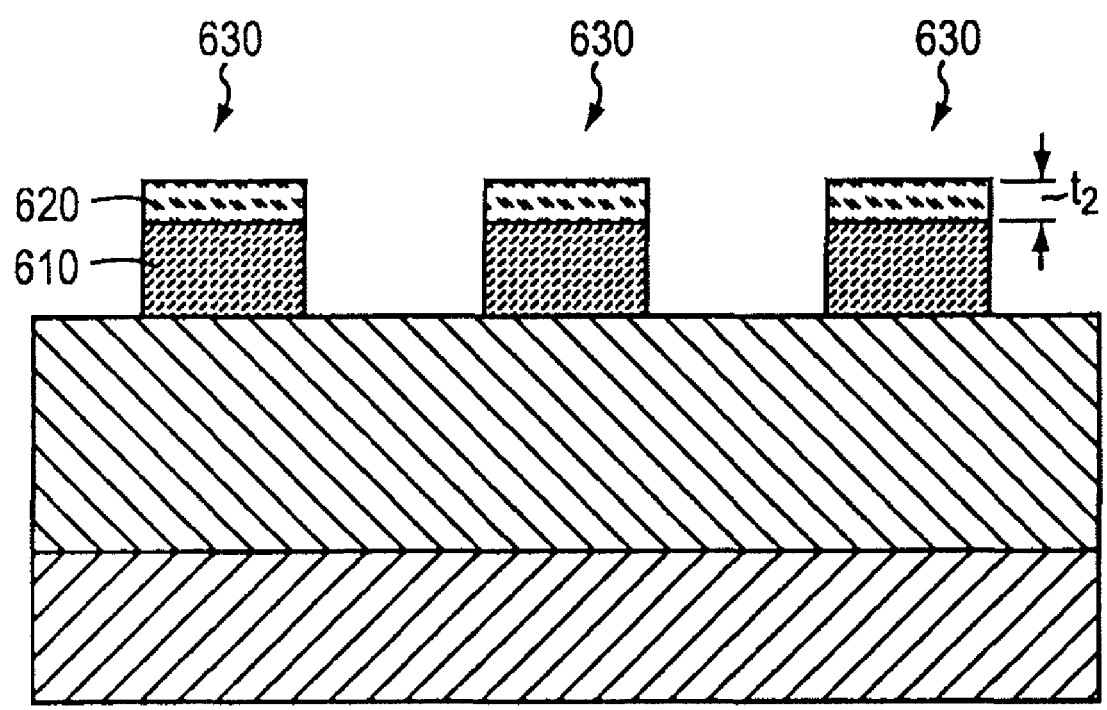

Referring also to FIG. 21, after the formation of the sidewall spacers 640, a top portion of the fins 630 includes exposed portions of a top surface of the first semiconductor layer 610 from which the fins 630 are formed. Second semiconductor layer 620 is selectively deposited on the exposed portions of the first semiconductor layer. The selective deposition may be performed by CVD, and the semiconductor precursor gas (or gases) may be accompanied by a Cl-containing species, e.g., $Cl_2$ or HCl gas. Alternatively, the semiconductor precursor gas may be a chlorinated species, e.g., dichlorosilane ($SiH_2Cl_2$), trichlorosilane ($SiHCl_3$), silicon tetrachloride ($SiCl_4$), or germanium tetrachloride ($GeCl_4$). The second semiconductor layer 620 may have a thickness $t_2$ of, e.g., 10-200 Å. The spacers are removed, e.g., by a wet etch. In an embodiment, the top portion of the fins 630, i.e., the top portion of exposed first semiconductor layer 610, are removed by an in-situ etch prior to deposition of the second semiconductor layer 620. Such an etch may preserve the aspect ratio of subsequently formed bilayer fins 630.

Referring to FIGS. 21 and 16, the resulting fins 630 include second semiconductor layer 620 disposed over first semiconductor layer 610, like the fins formed from bilayer 600. In both embodiments, the top surface of the fin may include a material different from the material disposed along a major portion of the sidewalls of the fin. In both embodiments, both the sidewalls of the fins and the top surfaces may exhibit a same type of strain, i.e., compressive or tensile.

In summary, this bilayer fin formation may be accomplished by forming fins from an existing bilayer material. Alternatively, the bilayer fins may be initially defined by a single material that is then epitaxially capped with a second material. In both embodiments, the first semiconductor layer is preferably thicker than the second semiconductor layer.

Carrier transport in FinFET device constructions may occur along three different planes of the device: over a top surface of a fin and along first and second sides of the fin.

If a FinFET includes a single strained semiconductor layer disposed over an insulator layer, atoms biaxially strained along one plane will have an opposite type of strain in a perpendicular plane (e.g., Si that is tensilely strained in the horizontal direction will be compressively strained in the vertical direction due to Poisson deformation of the lattice). Hence, conduction along a sidewall of a fin covered by strained Si will be through a compressively strained layer, and conduction along a top of the fin will be through a tensilely strained layer.

In some embodiments, it may be preferable to have a construction exhibiting primarily the same strain on all three sides of the fin, i.e., both horizontally and vertically, in order to maximize the mobility of carriers conducting parallel to all three sides of the fin. Therefore, a tensilely strained film may be formed over the insulator layer and topped with a compressively strained film. Here, most of the sidewall conduction will be through the compressively strained sidewalls, and conduction along the topside of the fin will be through the other compressively strained material disposed over the tensilely strained film.

Figure 22:
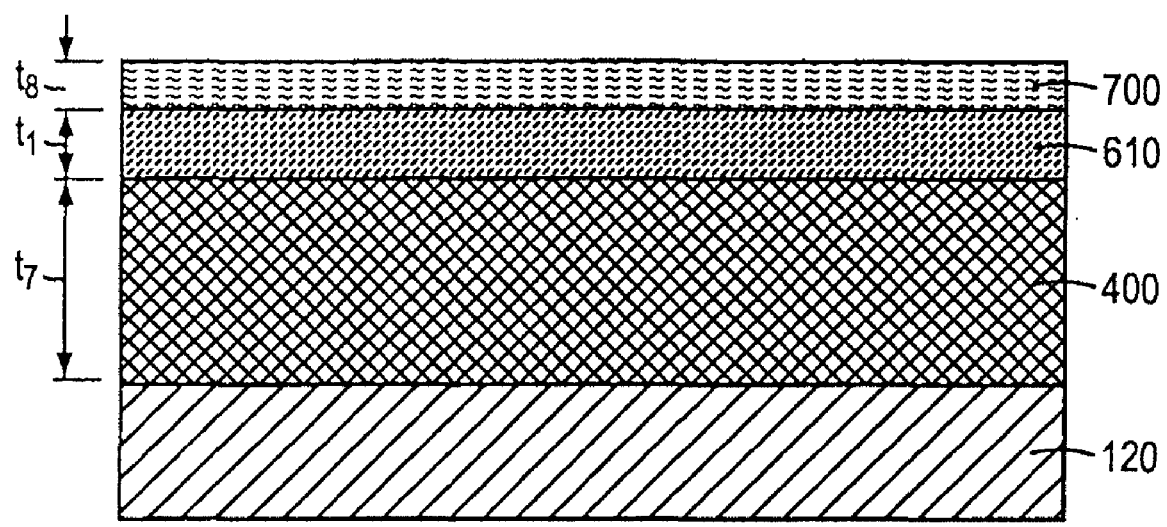

Referring to FIG. 22, in another embodiment, the fins are at least partially defined in crystalline oxide layer 400. The crystalline oxide layer may have a thickness $t_7$ of, e.g., 50-1000 Å. First semiconductor layer 610, having a thickness $t_1$ of, e.g., 10-200 Å, is disposed over the insulator layer including crystalline oxide. A photolithographic mask (not shown) may be defined over the first semiconductor layer 610. The photolithographic mask is, for example, photoresist. A hard mask 700, such as a silicon nitride hard mask, is defined over the first semiconductor layer 610. This hard mask 700 may enable subsequent formation of a semiconductor layer on fin sidewalls without also forming the semiconductor layer on the top surfaces of the fin. The hard mask may also act as a CMP stop (see below), and may have a thickness $t_8$ of, e.g., 100-1000 Å.

Figure 23:
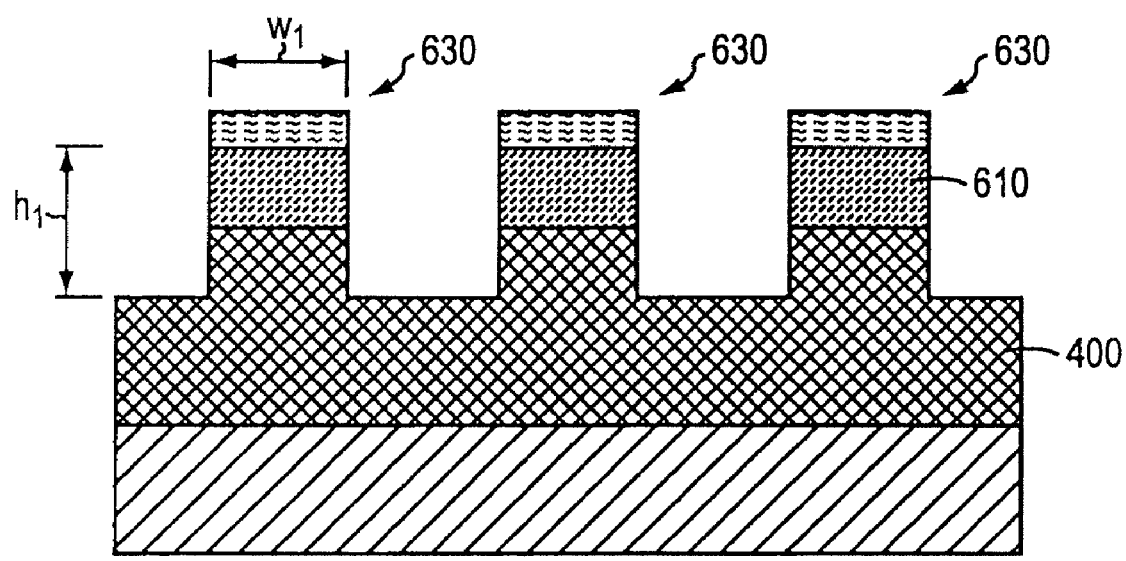

Referring to FIG. 23, fins 630 may be defined by anisotropic RIE of the first semiconductor layer 610 and the crystalline oxide layer 400. Fins 630 may have a width $w_1$ of, e.g., 50-300 Å, and a height $h_1$ approximately equal to a sum of the thickness $t_1$ of the first semiconductor layer and at least a portion of the thickness $t_7$ of the insulator layer 400, e.g., 50-500 Å.

Figure 24:
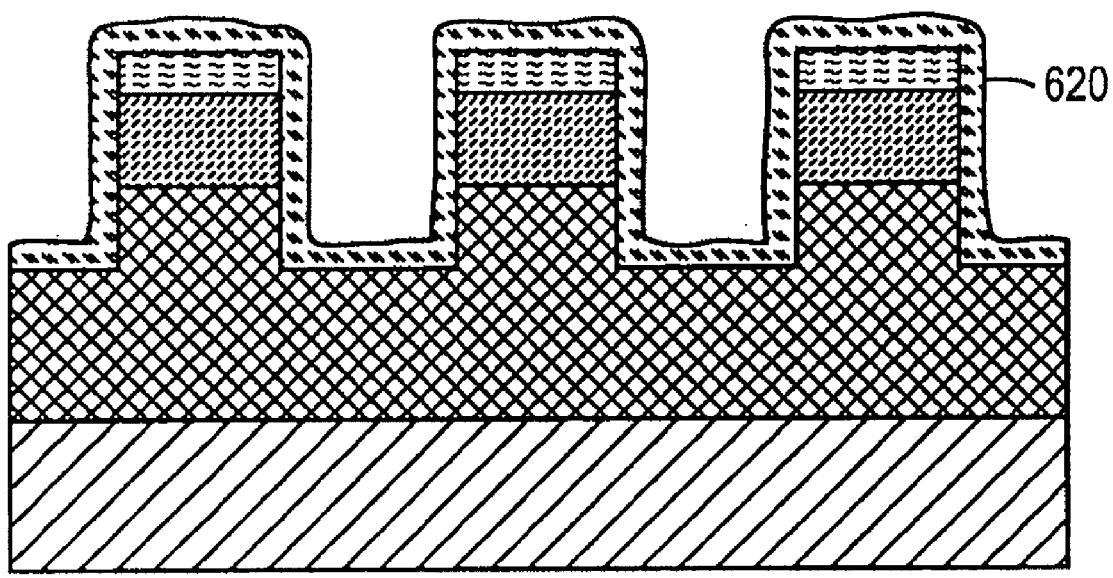

Referring to FIG. 24, second semiconductor layer 620 may be conformally deposited over and between the fins. The second semiconductor layer 620 may be chosen to be deliberately lattice-mismatched to the crystalline oxide 400 such that the layer 620 is under tensile or compressive strain, as appropriate. The layer 620 may contain a semiconductor material identical to or substantially the same as that included in the first semiconductor layer 610.

Figure 25:
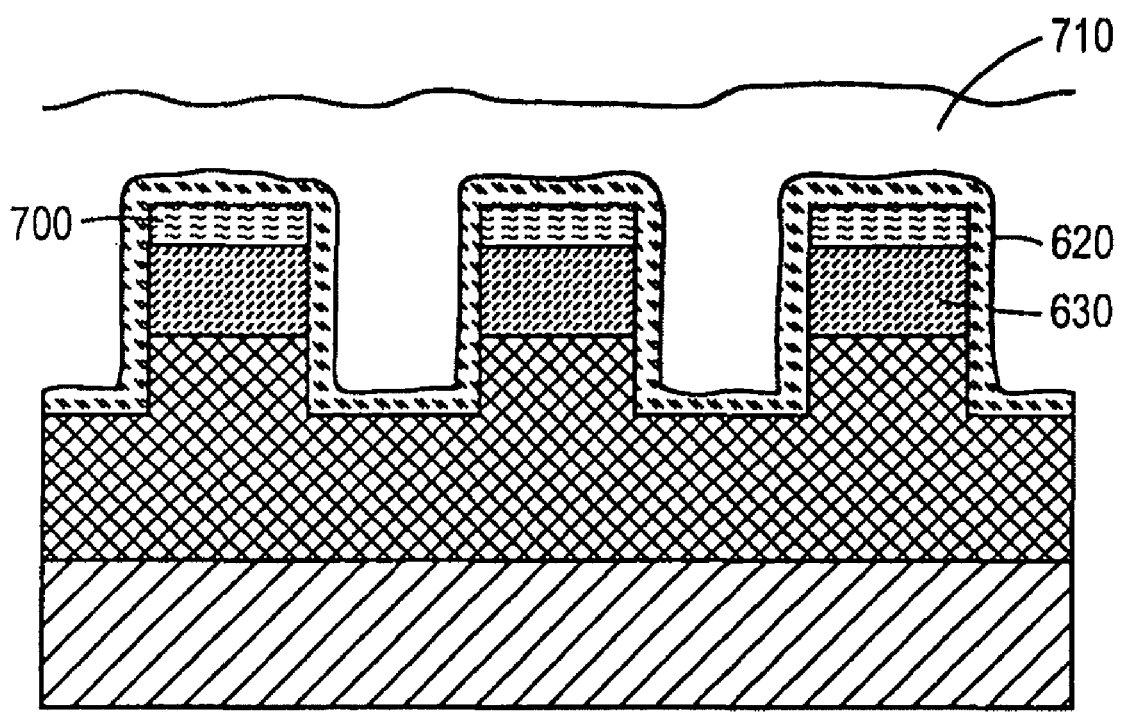

Referring to FIG. 25, a thick oxide fill material 710, e.g., $SiO_2$, may be deposited over and between the fins 630.

Figure 26:
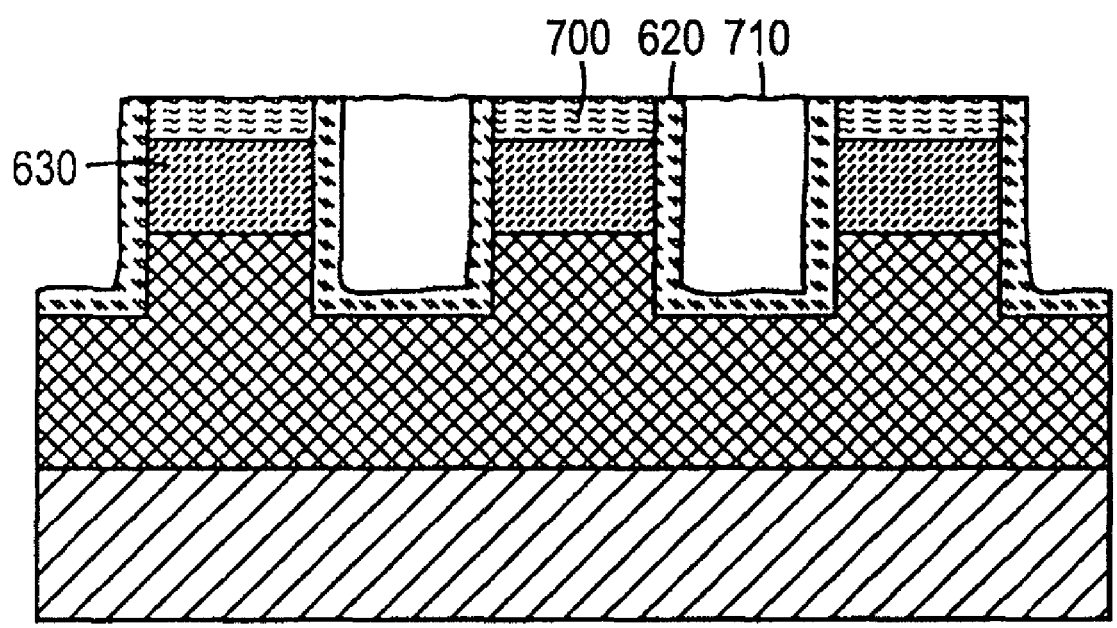

Referring to FIGS. 25 and 26, a planarization step, such as a CMP step, may be performed to planarize the oxide fill material 710 and to remove a top portion of the second semiconductor layer 620 disposed over the hard mask 700, thereby exposing the hard mask disposed on the tops of the fins 630.

Figure 27:
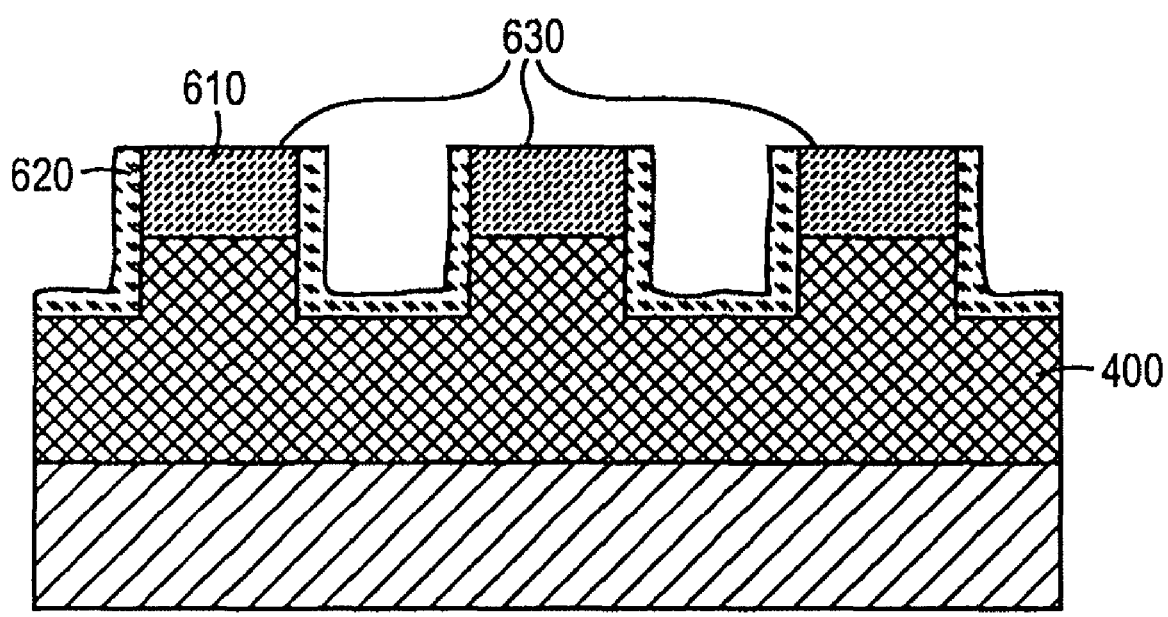

Referring to FIGS. 26 and 27, after planarization, the oxide fill material 710 may be removed by a wet or a dry oxide etch. Subsequently, an anisotropic dry etch may be used to remove portions of the second semiconductor layer 620 disposed over the hard mask 700 on the fins 630 and over the crystalline oxide layer 400 between the fins 630. The hard mask 700 can then be removed by a wet or dry etch, exposing the first semiconductor layer 610 disposed on the tops of the fins 630.

The resulting structure has a semiconductor material disposed on three sides of a crystalline oxide fin.

As discussed previously, crystalline oxide layer 400 may be deliberately lattice-mismatched to semiconductor substrate 110 for subsequent layer deposition. The crystalline oxide layer 400 material may be selected such that a major crystallographic planes of crystalline oxide layer 400 parallel and/or perpendicular to a surface of semiconductor substrate 110 is different from a crystallographic plane of the surface of semiconductor substrate 110. This configuration may facilitate the desired lattice match or mismatch between crystalline oxide layer 400 and semiconductor substrate 110.

For example, semiconductor substrate 110 may include or consist of silicon, SiGe, or germanium with a {100} surface, and crystalline oxide layer 400 may include an aforementioned material with a crystallographic plane other than {100}, e.g., {200}, {110}, or {111}, parallel to the surface of semiconductor substrate 110. Such a combination may provide an effective lattice constant of crystalline oxide layer 400 suitable for lattice match or mismatch with semiconductor substrate 110 or subsequently deposited layers. This combination may also facilitate the formation of subsequently deposited layers, e.g., first and second semiconductor layers 610, 620, having a crystallographic orientation (i.e., surface crystallographic plane) different from that of semiconductor substrate 110. Such changes in crystalline orientation may result in enhanced carrier mobilities in devices subsequently fabricated over fins 630.

This degree of freedom in selecting crystallographic orientation may enable the formation of FinFETs having channel layers of arbitrary crystalline orientation, e.g., having some FinFET channels of different crystalline orientation with respect to others, without necessitating complicated layout issues, device rotations, or wafer bonding schemes. For example, in an embodiment, a first FinFET including a crystalline oxide and a channel layer having a substantially {100} crystalline orientation may be fabricated adjacent to a second FinFET including a crystalline oxide and a channel layer having a substantially {110} crystalline orientation. Furthermore, the first and second FinFETs may be fabricated such the devices (e.g., the fins) are oriented in parallel to each other. Forming such a configuration may be facilitated by the use of different crystalline oxides for each of the first and second FinFETs. In this embodiment, the first FinFET may be an n-channel device and the second FinFET may be a p-channel device.

After the formation of the fins by any of the methods described above, the completion of the FinFET fabrication may continue as follows.

Figure 28:
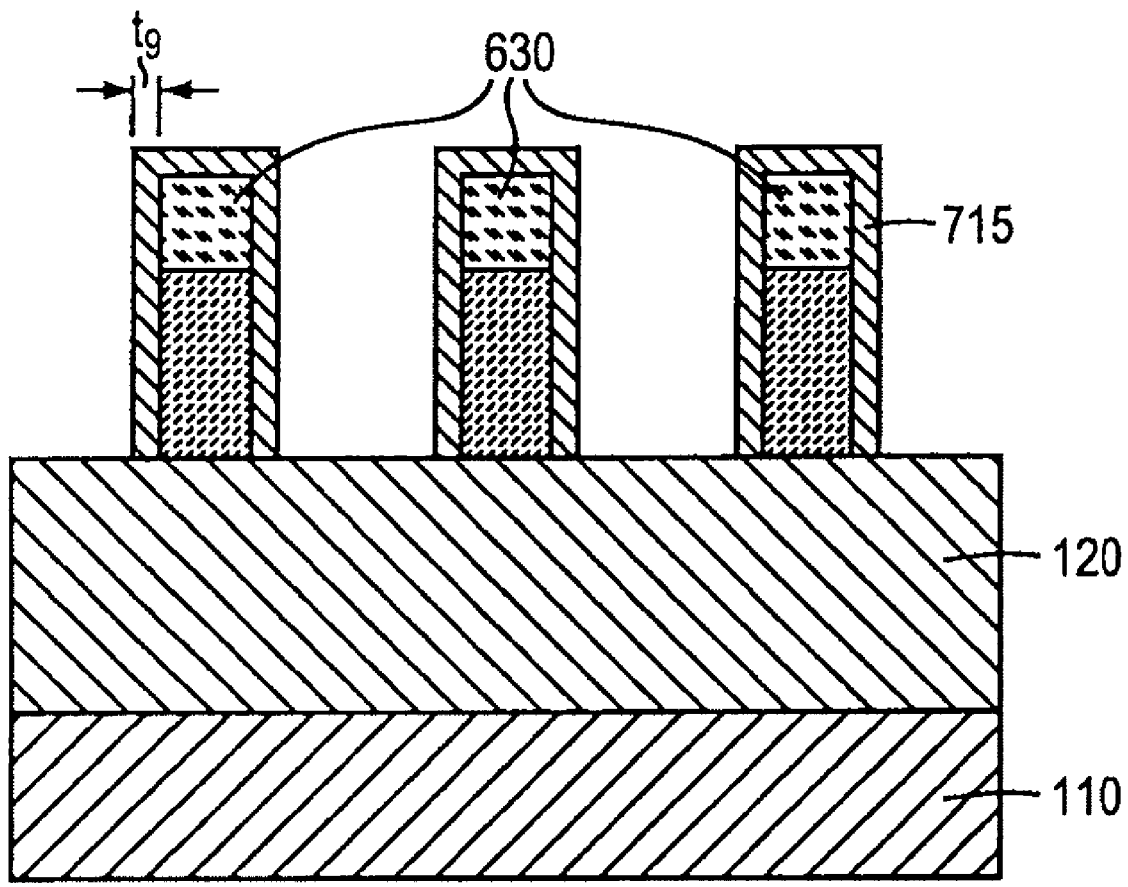

Referring to FIG. 28 as well as to FIGS. 17A and 17B, a gate insulator layer 715 is formed over the fins 630 and exposed underlying insulator layer 120 or crystalline oxide layer. Gate insulator layer 715 is conformally formed over fins 630, as well as over source and drain mesa regions 632, 634. Gate insulator layer 715 may include, e.g., $SiO_2$, $SiO_xN_y$, silicon nitride ($Si_3N_4$ or other compositions), barium oxide (BaO), strontium oxide (SrO), calcium oxide (CaO), tantalum oxide ($Ta_2O_5$), titanium oxide ($TiO_2$), zirconium oxide ($ZrO_2$), hafnium oxide ($HfO_2$), aluminum oxide ($Al_2O_3$), lanthanum oxide ($La_2O_3$), yttrium oxide ($Y_2O_3$), yttrium aluminate, lathanum aluminate, lanthanum silicate, yttrium silicate, hafnium silicate, zirconium silicate, and doped or undoped alloys, mixtures or multilayers, thereof and have a thickness $t_9$ of, e.g., 10-100 Å. In some embodiments, gate insulator layer 715 is grown, and is therefore formed only over exposed semiconductor surfaces, i.e., over top surfaces of fins 630 and source and drain mesa regions 632, 634. In other embodiments, gate insulator layer 715 is deposited, and is therefore formed over an entire top surface of the fins and exposed portions of the underlying insulator layer 120 or crystalline oxide.

Figure 29A:
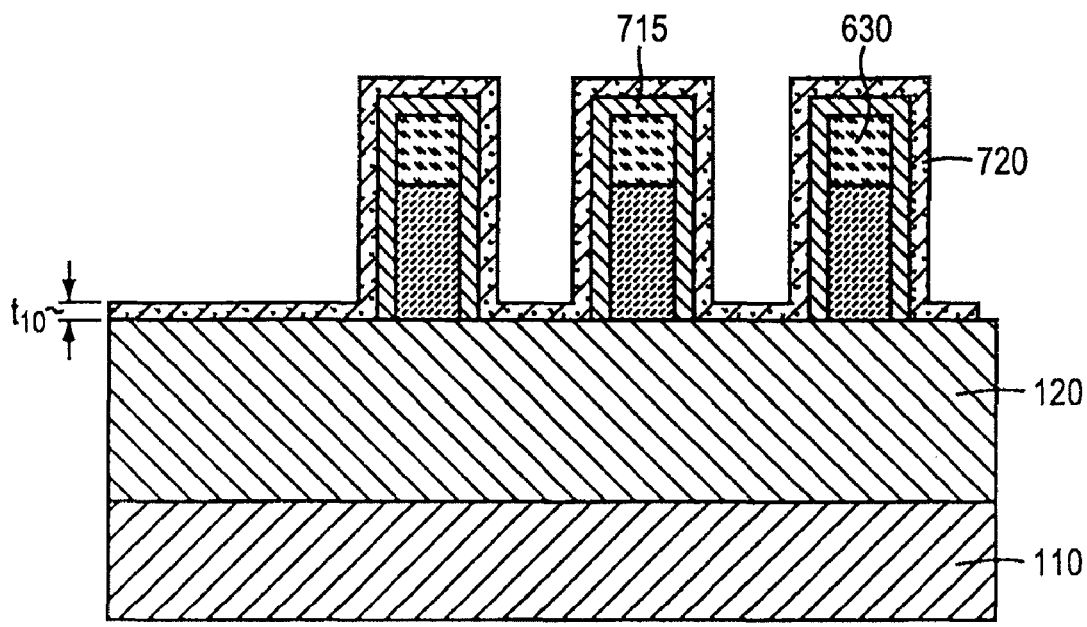
Figure 29B:
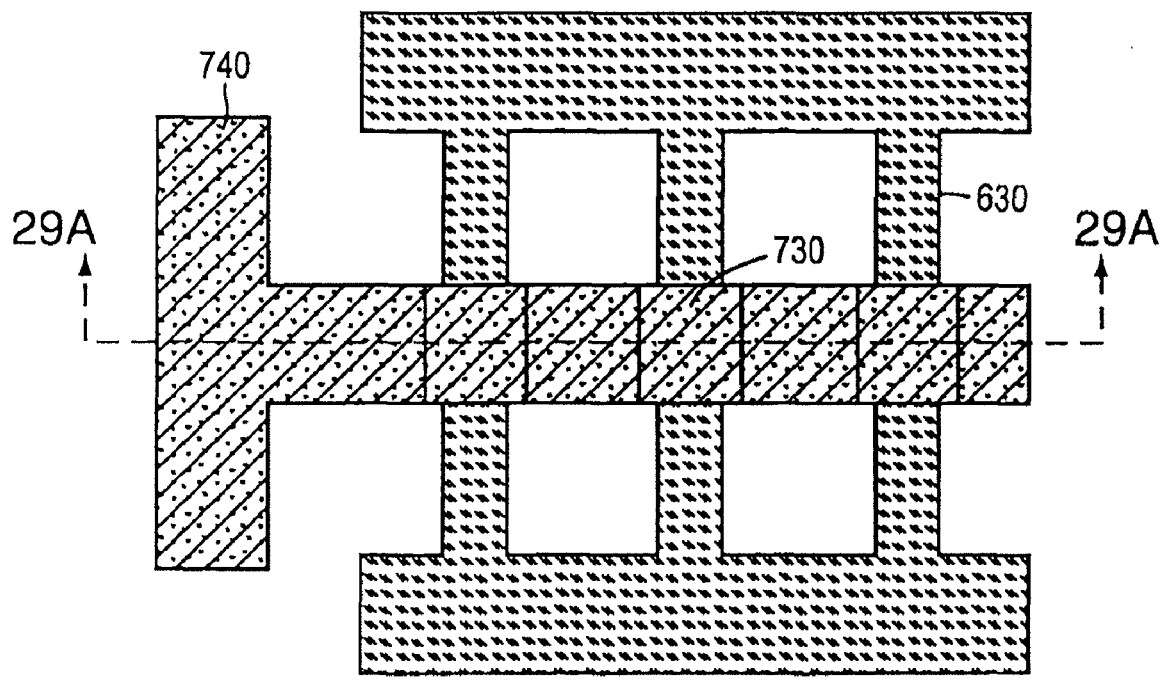

Referring to FIGS. 29A and 29B, a gate electrode material 720 is conformally formed over gate insulator layer 715, including over fins 630. Gate electrode material 720 may include a suitably conductive material such as, for example, doped polysilicon, doped polycrystalline SiGe, Al, Ag, Bi, Cd, Fe, Ga, Hf, In, Mn, Nb, Y, Zr, Ni, Pt, Be, Ir, Te, Re, Rh, W, Mo, Co, Fe, Pd, Au, Ti, Cr, Cu, and doped or undoped alloys, mixtures or multilayers thereof, deposited by ALD or CVD, such as by UHVCVD, APCVD, LPCVD, or PECVD, and have a thickness $t_{10}$ selected from the range of, e.g., 100-2000 Å. A photolithographic mask (not shown) is formed over gate electrode material 720. Portions of gate electrode material 720 are selectively removed by, e.g., RIE to define a gate 730 crossing over fins 630, and terminating in a gate contact area 740. Portions of gate insulator layer 715 are exposed (or even removed) by the RIE of gate electrode material 720.

Figure 30A:
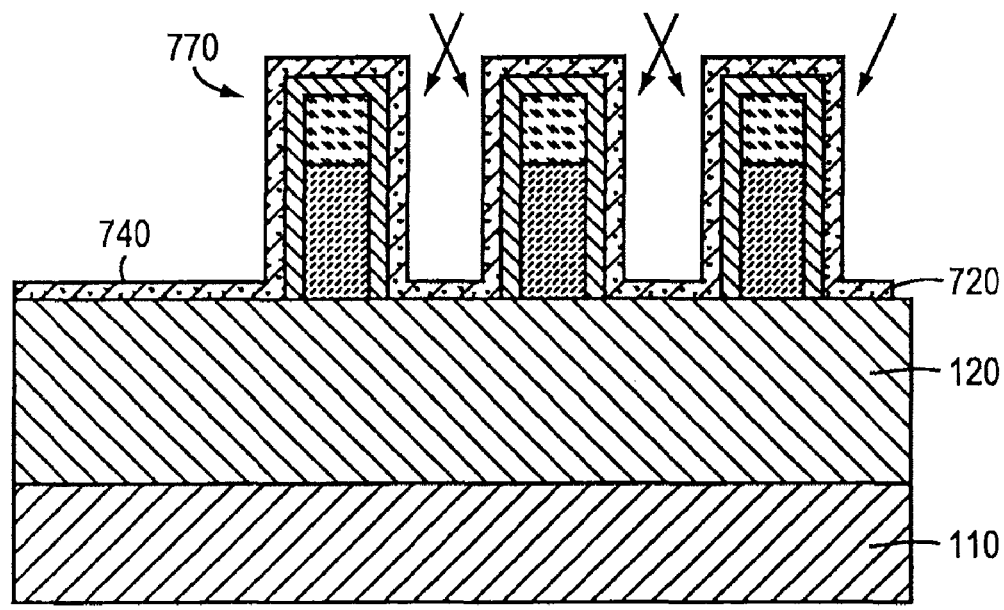
Figure 30B:
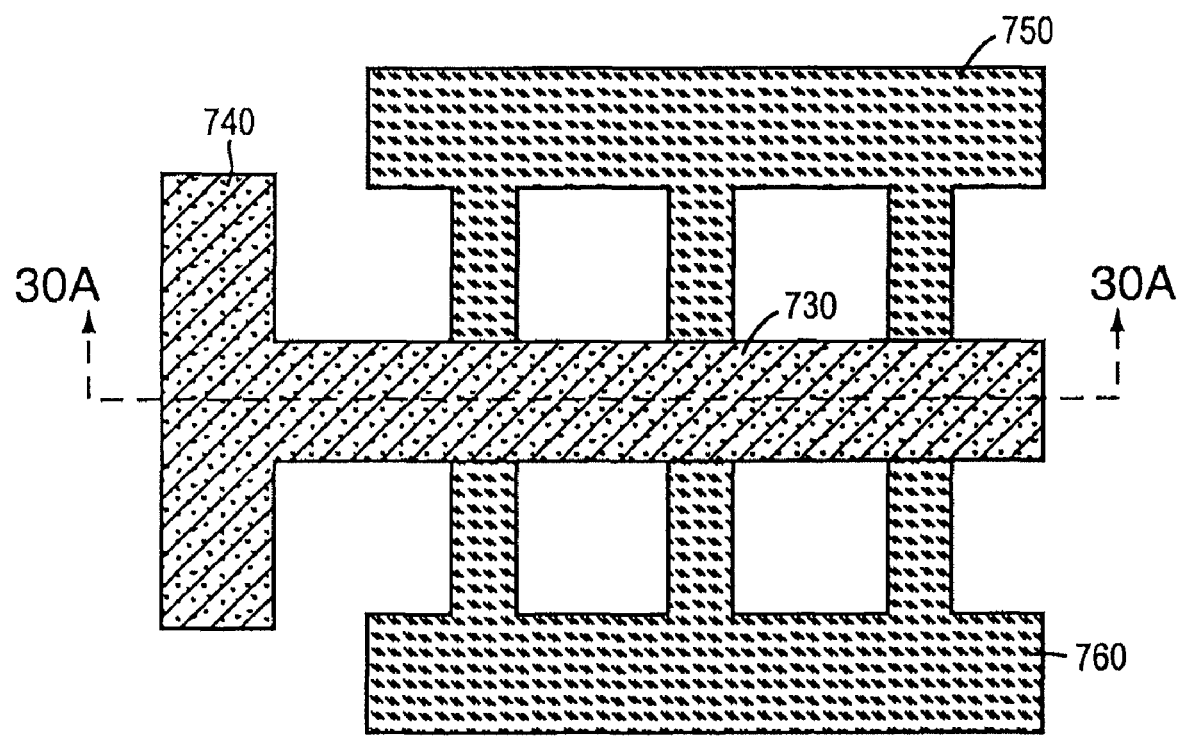

Referring to FIGS. 30A and 30B, a plurality of dopants are introduced into source and drain mesa regions 632, 634 to define a source 750 and a drain 760. To form an n-type FinFET, dopants such as arsenic, antimony, or phosphorus may be implanted into mesa regions 632,634. Suitable implantation parameters may be, for example, arsenic with a dose of $2\times10^{15}$ atoms/cm$^2$ implanted at an energy of 10-50 kilo-electron volts (keV). To form a p-type FinFET, dopants such as boron or indium may be implanted into mesa regions 632, 634. Suitable implantation parameters are, for example, boron, with a dose of $2\times10^{15}$ atoms/cm$^2$ at an energy of 3-15 keV. For the formation of a CMOS device, NMOS regions may be protected by a mask during the implantation of p-type dopants into PMOS regions. Similarly, PMOS regions may be protected by a mask during the implantation of n-type dopants into NMOS regions. A suitable mask for both types of implantation may be, e.g., photoresist.

During the introduction of dopants into source and drain mesa regions 632, 634, a plurality of gate dopants 775 may also be introduced into gate 730 and gate contact area 740. Gate dopants 770 serve to increase a conductivity of gate electrode material 720. Gate dopants 770 may be, for example, implanted arsenic, antimony, or phosphorous ions for an n-type FinFET.

Dopants for both n-type and p-type FinFETs may be implanted at an angle of 20-50°, with zero degrees being normal to the substrate 110. Implanting at an angle may be desired in order to implant ions into a side of exposed fins 630 and also into a side of the vertical surfaces of gate electrode material 720.

Figure 31A:
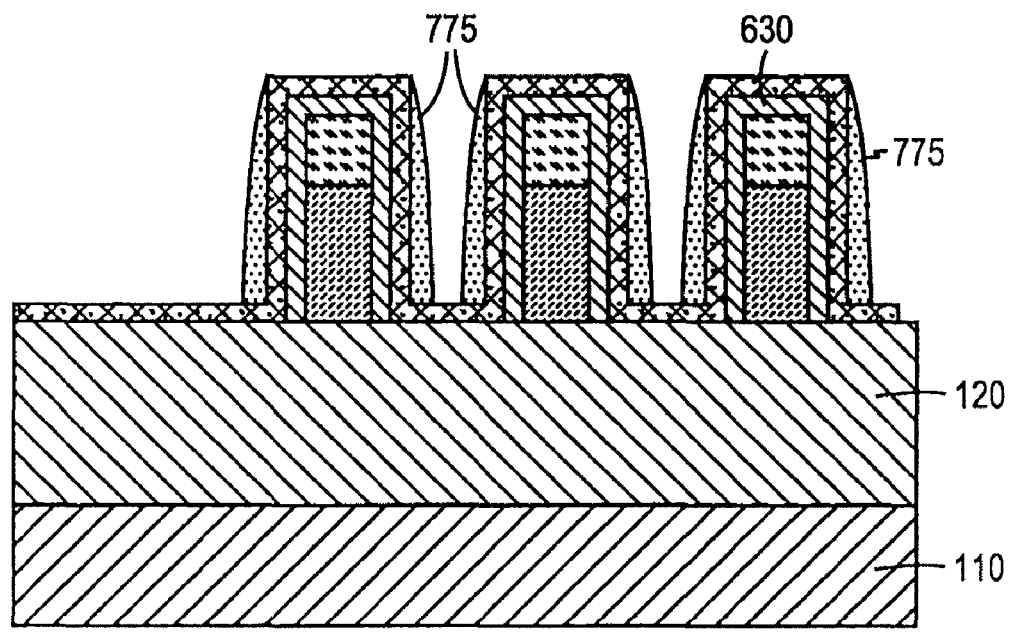
Figure 31B:
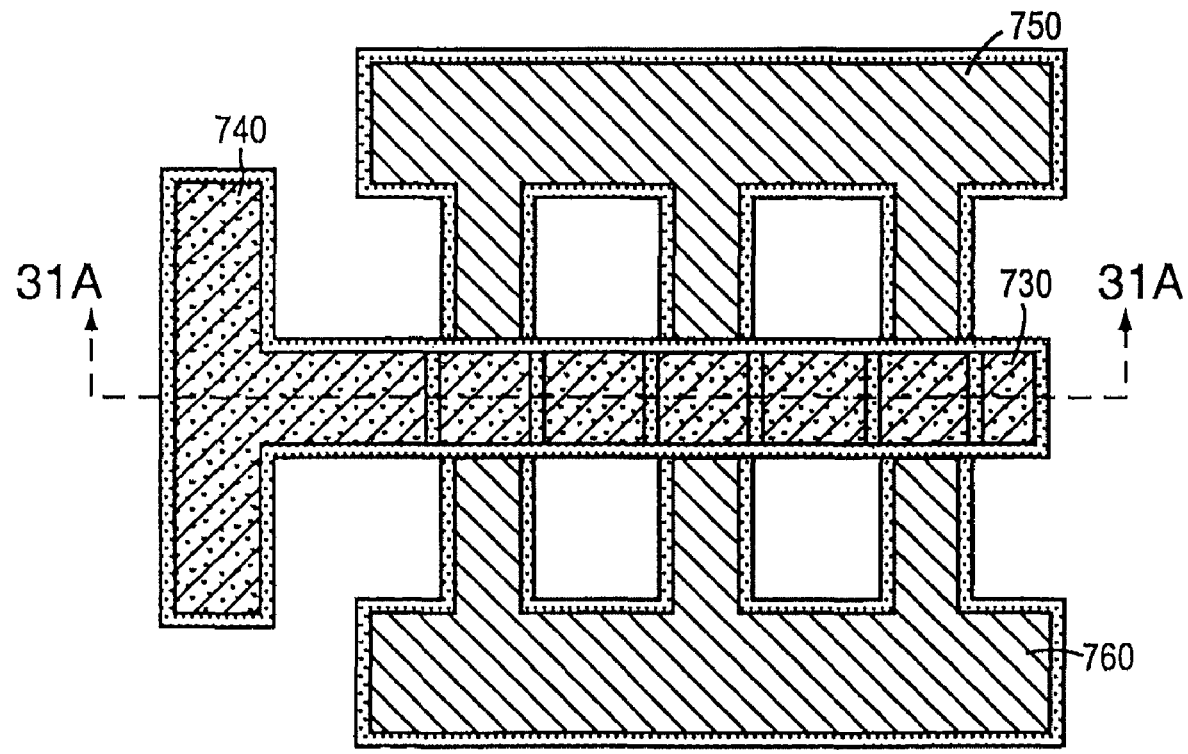

Referring to FIGS. 31A and 31B, a blanket layer of spacer insulator material is formed over the substrate 110, including over gate 730, gate contact area 740, source 750, and drain 760. Spacer insulator material may be, for example, $SiO_2$ or $Si_3N_4$ deposited by CVD and have a thickness of, for example, 100-1000 Å. Subsequently, portions of spacer insulator material are removed by an anisotropic RIE to define a plurality of sidewall spacers 775 proximate vertical surfaces, such as fins 630, gate 730, and gate contact area 740. Horizontal surfaces, such as top surfaces of fins 630, are substantially free of the spacer insulator material.

After the RIE definition of sidewall spacers 775, the portions of gate insulator layer 715 exposed by the RIE of gate electrode material 720 may be removed from top surfaces of source 750, and drain 760 by, e.g., a dip in hydrofluoric acid (HF), such as for 5-30 seconds in a solution containing, e.g., 0.5-5% HF. Alternately, this removal may be via RIE, with an etchant species such as, e.g., $CHF_3$.

Figure 32A:
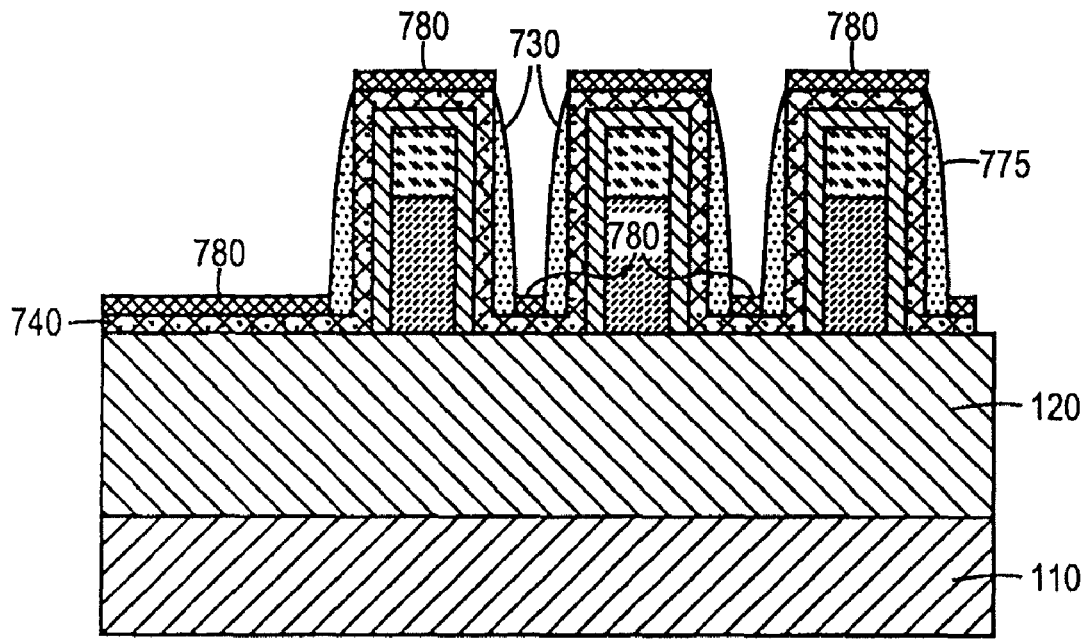
Figure 32B:
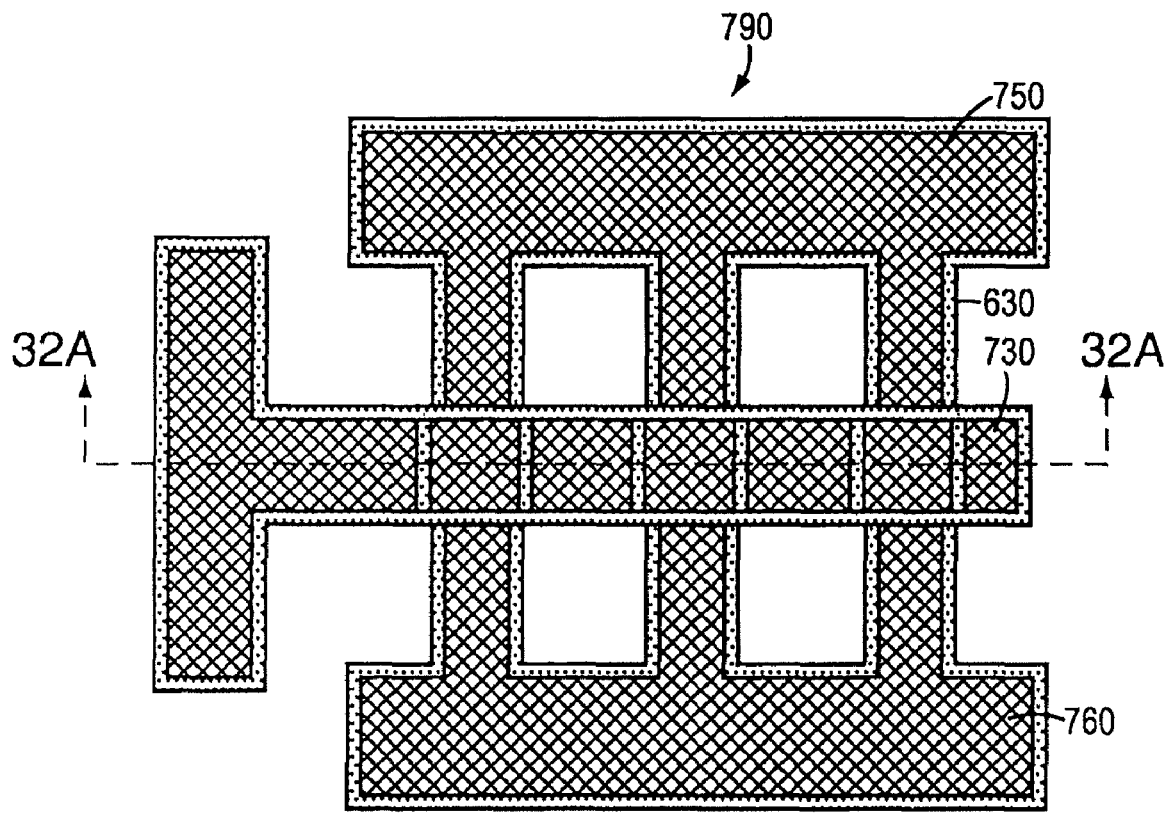

Referring to FIGS. 32A and 32B, a salicide is selectively formed over the substrate 110 to provide low-resistance contacts to the source and drain regions and the gate electrode as follows. A conductive layer is formed over the substrate 110. For example, a metal such as titanium, platinum, zirconium, cobalt, nickel, or alloys, mixtures, or multilayers thereof is deposited by, e.g., CVD or sputtering, with the conductive layer having a thickness of, e.g., 50-200 Å. An anneal is performed to react the conductive layer with the underlying semiconductor, e.g., exposed portions of gate 730 and gate contact area 740, to form salicide 780 including, e.g., cobalt silicide or nickel silicide. Anneal parameters may be, for example, 400-800° C. for 1-120 seconds. Unreacted portions of the conductive layer disposed directly over insulator material, such as exposed portions of insulator layer 120 and sidewall spacers 775, are removed by a chemical strip. A suitable chemical strip may be a solution including $H_2SO_4$:$H_2O_2$ at a ratio of 3:1. A second anneal may be performed to further lower resistivity of salicide 780. The second anneal parameters may be, for example, 600-900° C. for 1-120 seconds. A FinFET 790 includes fins 630, gate insulator 715, source 750, drain 760, and gate 730, and an exemplary FinFET 790 having three fins 630 is illustrated in FIG. 32B. The three fins 630 share a common source 750 and a common drain 760. A single transistor may have multiple fins to increase current drive in comparison to a transistor with a single fin. The semiconductor material disposed in each fin 630 defines a device channel.

In an alternative embodiment, gate dielectric material may be removed from the top surfaces of the source and drain mesa regions immediately after the RIE of the gate electrode. In some embodiments, raised source and drain regions may be formed, as described above with reference to FIGS. 4 and 5.

Figure 33A:
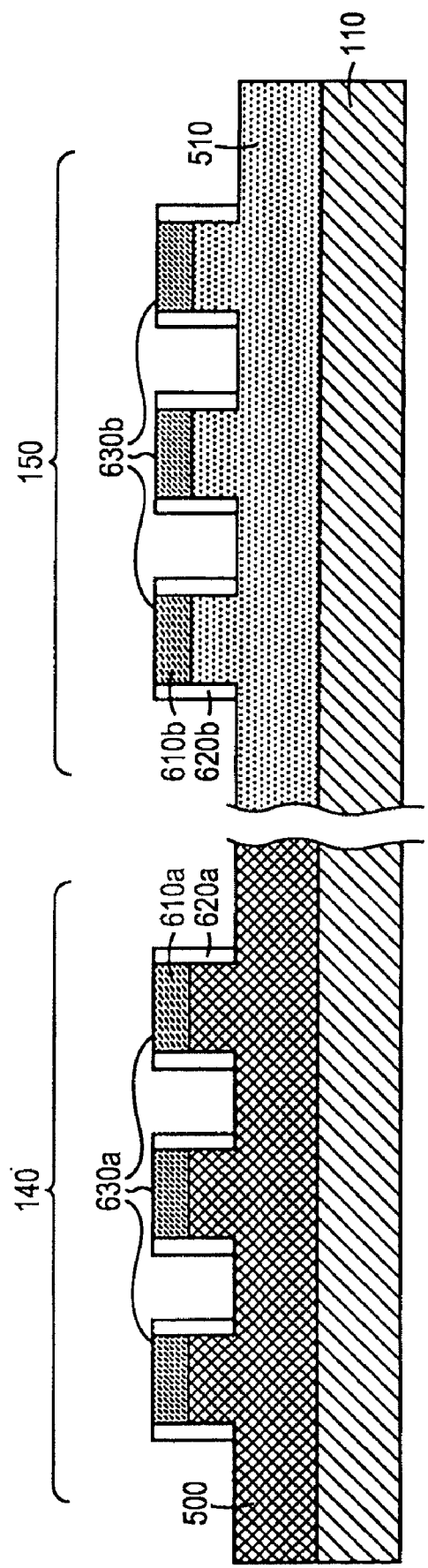

Referring to FIG. 14C as well as to FIGS. 33A-33C, a structure including first and second insulator layers 500, 510 disposed over first and second portions 140, 150 of semiconductor substrate 110, respectively, may be used to fabricate a first FinFET 790a and a second FinFET 790b that are physically parallel to each other and have channels with different crystalline orientation. Such first and second FinFETs may be fabricated as follows.

First insulator layer 500 disposed over the first portion 140 of semiconductor substrate 110 may include a first crystalline oxide, and second insulator layer 510 disposed over the second portion 150 of semiconductor substrate 110 may include a second crystalline oxide. The first and second crystallographic oxides may be identical, substantially the same, or substantially different. First semiconductor layer 610a comprising a first semiconductor material is disposed over the first insulator layers 500, and first semiconductor layer 610b comprising a second semiconductor material is disposed over the second insulator layer 510. In an embodiment, first and second semiconductor materials are identical or substantially the same. In an alternative embodiment, first and second semiconductor materials are different. In both embodiments, the first semiconductor material disposed in first semiconductor layer 610a has a first crystalline orientation, the second semiconductor material disposed in first semiconductor layer 610b has a second crystalline orientation, and the first and second crystalline orientations are different.

A first plurality of fins 630a disposed over the first insulator layer 500, and a second plurality of fins 630b disposed over the second insulator layer 510 are defined as discussed above with reference to FIG. 23-27, with a second semiconductor layer 620a comprising the first semiconductor material disposed on the vertically oriented sidewalls of the fins 630a, and a second semiconductor layer 620b comprising the second semiconductor material disposed on the vertically oriented sidewalls of fins 630b. At least one fin from the first plurality of fins 630a may be parallel to at least one fin from the second plurality of fins 630b. The term "vertically oriented" does not denote a particular absolute orientation; rather, it is used herein to mean an orientation that is substantially perpendicular to a top surface of the substrate over which the fin is formed.

In the embodiment in which the first and second semiconductor materials are different, second portion 150 of substrate 110 may be the portion of the substrate including second insulator layer 510, and may be protected by a masking material during fabrication of the first FinFET 790a. Likewise, after the first FinFET 790a is fabricated, it may be protected by a masking material during fabrication of the second FinFET 790b. Alternatively, the same channel material, i.e., semiconductor material, may be deposited over both first and second insulator layers 500, 510 as described above with respect to FIG. 15, and the first and second FinFETs 790a, 790b may be fabricated in turn as described above with reference to FIGS. 22-27.

The first FinFET 790a includes fins 630a, gate insulator 715, source 750, drain 760, and gate 730. The second FinFET 790b includes fins 630b, gate insulator 715, source 750, drain 760, and gate 730. Both FinFETs 790a, 790b may include gate contact areas 740, sidewall spacers 775, and salicide regions 780.

The invention may be embodied in other specific forms without departing from the spirit or essential characteristics thereof. The foregoing embodiments are therefore to be considered in all respects illustrative rather than limiting on the invention described herein.

What is claimed is:

1. A structure comprising:
   a substrate having an insulator layer disposed thereon; and
   a fin field-effect transistor disposed over the substrate, the fin field-effect transistor including:
   a source region and a drain region disposed in contact with the insulator layer;
   at least one fin extending between the source and the drain regions and comprising a bilayer;
   a gate disposed above the bilayer, extending over the at least one fin and between the source and the drain regions; and
   a gate dielectric layer disposed between the gate and the fin,
   wherein the bilayer comprises a second semiconductor material disposed over a first semiconductor material, and the first semiconductor material is different from the second semiconductor material, and a sidewall surface of the at least one fin includes the first semiconductor material.

2. The structure of claim 1, wherein the first semiconductor material includes at least one member of the group consisting of silicon, SiGe, germanium, an array of carbon nanotubes, and mixtures or alloys thereof.

3. The structure of claim 1, wherein the first semiconductor material includes at least one member of the group consisting of gallium arsenide, indium arsenide, indium gallium arsenide, indium phosphide, gallium nitride, indium antimonide, gallium antimonide, gallium phosphide, and mixtures or alloys thereof.

4. The structure of claim 1, wherein the second semiconductor material includes at least one member of the group consisting of silicon, SiGe, germanium, an array of carbon nanotubes, and mixtures or alloys thereof.

5. The structure of claim 1, wherein the second semiconductor material includes at least one member of the group consisting of gallium arsenide, indium arsenide, indium gallium arsenide, indium phosphide, gallium nitride, indium antimonide, gallium antimonide, gallium phosphide, and mixtures or alloys thereof.

6. The structure of claim 1, wherein the first semiconductor material is tensilely strained and the second semiconductor material is compressively strained.

7. The structure of claim 1, wherein the first semiconductor material is compressively strained and the second semiconductor material is tensilely strained.

8. The structure of claim 1, wherein the gate dielectric is disposed proximate the first semiconductor material and the second semiconductor material.

9. A structure comprising:
a substrate;
a first crystalline insulator layer disposed over at least a first portion of the substrate;
a second crystalline insulator layer disposed over at least a second portion of the substrate;
a first fin field-effect transistor disposed over the substrate, the first fin field-effect-transistor including:
a first source region and a first drain region disposed over and in contact with the first crystalline insulator layer;
a first fin extending between the first source and the first drain regions, the first fin comprising a first semiconductor material disposed on at least one vertically oriented sidewall of the first fin;
a first gate, disposed above the substrate, extending over the first fin and between the first source and the first drain regions;
a first gate dielectric layer disposed between the first gate and the first fin; and
a second fin field-effect transistor disposed over the substrate, the second fin field-effect-transistor including:
a second source region and a second drain region disposed over and in contact with the second crystalline insulator layer;
a second fin extending between the second source and the second drain regions and comprising a second semiconductor material disposed on at least one vertically oriented sidewall of the second fin;
a second gate, disposed above the substrate, extending over the second fin and between the second source and the second drain regions; and
a second gate dielectric layer disposed between the second gate and the second fin,
wherein the first semiconductor material has a first crystalline orientation, the second semiconductor material has a second crystalline orientation, and the first and second crystalline orientations are different.

10. The structure of claim 9, wherein the first fin and second fin are substantially parallel.

11. The structure of claim 9, wherein the first semiconductor material and the second semiconductor material are substantially the same.

12. The structure of claim 9, wherein the first crystalline orientation is selected from a {100} family of crystalline planes.

13. The structure of claim 9, wherein the first crystalline orientation is selected from a {110} family of crystalline planes.

14. The structure of claim 9, wherein the first fin field-effect transistor comprises an n-channel device and the second fin field-effect transistor comprises a p-channel device.

15. A structure comprising:
a substrate;
a crystalline insulator material disposed over the substrate;
a first fin field-effect transistor disposed over the substrate; and
a second fin field-effect transistor disposed over the substrate, at least one of the first fin field-effect transistor or the second field-effect transistor being disposed over the crystalline insulator material;
wherein the first fin field-effect transistor comprises a first semiconductor material has a first crystalline orientation, the second fin field-effect transistor comprises a second semiconductor material has a second crystalline orientation, and the first and second crystalline orientations are different.

* * * * *